(12) United States Patent
Kotanagi et al.

(10) Patent No.: US 6,316,714 B1
(45) Date of Patent: Nov. 13, 2001

(54) POWER GENERATING BLOCK PROVIDED WITH THERMOELECTRIC GENERATION UNIT

(75) Inventors: Susumu Kotanagi; Akihiro Matoge; Yoshifumi Yoshida; Fumiyasu Utsunomiya; Matsuo Kishi, all of Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/529,586

(22) PCT Filed: Oct. 13, 1998

(86) PCT No.: PCT/JP98/04590
§ 371 Date: Jul. 17, 2000
§ 102(e) Date: Jul. 17, 2000

(87) PCT Pub. No.: WO99/19979
PCT Pub. Date: Apr. 22, 1999

(30) Foreign Application Priority Data

Oct. 14, 1997 (JP) .................................. 9-280925
Dec. 25, 1997 (JP) .................................. 9-358074
Sep. 3, 1998 (JP) .................................. 10-249329

(51) Int. Cl.$^7$ .................................................. H01L 35/02
(52) U.S. Cl. .................................... 136/242; 136/205
(58) Field of Search .................................. 136/205, 242

(56) References Cited

U.S. PATENT DOCUMENTS 6,232,543 * 5/2001 Nagata .............................. 136/242

FOREIGN PATENT DOCUMENTS

| 61-254082-A | * 11/1986 | (JP) . |
| 2-119589-A | * 5/1990 | (JP) . |
| 6-22572-A | * 1/1994 | (JP) . |
| 6-153549-A | * 5/1994 | (JP) . |

* cited by examiner

Primary Examiner—Kathryn Gorgos
Assistant Examiner—Thomas H Parsons
(74) Attorney, Agent, or Firm—Adams & Wilks

(57) ABSTRACT

A power generating block is provided with a thermoelectric generator unit 180 containing one or more of electrothermic elements 140, further, including a 1st thermally conductive plate 120 constituting a heat absorbing plate and including a 2nd thermally conductive plate constituting a heat radiating plate. A thermal conductive body 244 made of a thermally conductive material is arranged to be brought into contact with the 2nd thermally conductive plate 170. The power generating block with a thermoelectric generator unit is provided with a step-up circuit block 240 including a step-up circuit 410 for boosting electromotive force generated by the thermoelectric generator unit 180 and a power supply operation control circuit 416 for controlling operation of storing the electromotive force generated by the thermoelectric generator unit 180 and controlling operation of the step-up circuit 410.

4 Claims, 52 Drawing Sheets

F I G. 6
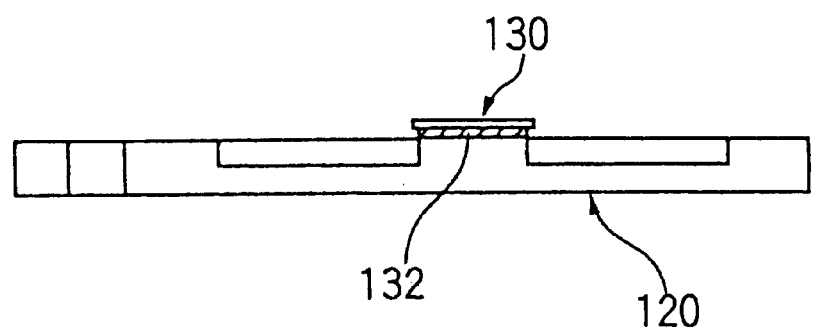

POWER GENERATING BLOCK PROVIDED WITH THERMOELECTRIC GENERATION UNIT

BACKGROUND OF THE INVENTION

TECHNICAL FIELD

The present invention relates to a generating block with a thermoelectric generator unit including a thermoelectric generator unit containing electrothermic elements for generating an electromotive force based on the Seebeck effect.

Particularly, the invention relates to a power generating block provided with a thermoelectric generator unit characterized in being provided with a booster circuit block including a booster circuit for boosting electromotive force generated by a thermoelectric generator unit and a power supply operation control unit for controlling the operation of storing the electromotive force generated by the thermoelectric generator unit and controlling the operation of the booster circuit.

DESCRIPTION OF THE RELATED ART

According to a conventional electrothermic wrist watch, as disclosed in, for example, JP-A-55-20483, a thermoelectric type generator comprising a number of individual element parts is arranged between a bottom portion of a casing made of metal and a support ring. According to the thermoelectric type generator (Peltier battery), a hot pole is placed oppositely to the bottom portion of the casing and a cold pole is placed opposed to a cover made of metal. Further, according to other structures, a thermoelectric type generator is held by an intermediary ring via a shock absorber.

According to other electronic timepieces, as disclosed in JP-A-8-43555, a 1st insulating member constitutes a heat absorbing side, a 2nd insulating member constitutes a heat radiating side, electromotive force is provided at an output end portion, the electromotive force is stored in a storage member and time display means is operated by the storage member.

Further, according to a timepiece having conventional power generating elements, as disclosed in JP-A-9-15353, four electrothermic elements are arranged dividedly at other than a portion occupied by a movement in a space inside of a wrist watch. According to the electrothermic element, p type electrothermic members and n type electrothermic members are connected at end portions and form thermocouples. The electrothermic element is constituted by connecting in series all of the thermocouples.

Further, according to a conventional thermoelectric power generating wrist watch, as disclosed in JP-A-7-32590U, a thermoelectric power generating element is arranged between a case back and a module cover. The thermoelectric power generating element includes a number of thermocouples.

None of the conventional literature discloses a thermoelectric generator unit containing one or more electrothermic elements.

In an electrothermic element, a force resistant against external force is weak. Particularly, in an electrothermic element, numbers of p type electrothermic members and n type electrothermic members each in a slender columnar shape are arranged and accordingly, when the p type electrothermic members and the n type electrothermic members are exerted with a force in a direction orthogonal to a longitudinal direction of these, there is a concern of destroying the electrothermic element. Further, also in the case in which the p type electrothermic members and the n type electrothermic members are exerted with a force along the longitudinal direction of these, when the force exceeds a constant magnitude, there is a concern of destroying the electrothermic element.

Conventionally, an electrothermic element is arranged directly in a space inside of a wrist watch without mounting the electrothermic element as a thermoelectric generator unit and therefore, the strength of the electrothermic element cannot be increased. Further, when a plurality of the electrothermic elements are used, there is needed means for connecting the electrothermic elements.

Further, conventionally, there has not been developed a circuit block with a thermoelectric generator unit having a thermoelectric generator unit including a plurality of thermoelectric elements and provided with a booster circuit and a power supply operation control circuit for controlling operation of the booster circuit.

BRIEF SUMMARY OF THE INVENTION

It is an object of the invention to provide a power generating block provided with a thermoelectric generator unit having excellent power generation efficiency.

It is another object of the invention to provide a small-sized thin type power generating block provided with a thermoelectric generator unit.

It is another object of the invention to provide a power generating block provided with a thermoelectric generation unit which is fabricated simply.

In order to resolve the above-described problem, according to an aspect of the invention, there is provided a power generating block with a thermoelectric generator unit comprising a thermoelectric generator unit containing one or more of electrothermic elements for generating an electromotive force based on the Seebeck effect, including a 1st thermally conductive plate constituting a heat absorbing plate and including a 2nd thermally conductive plate constituting a heat radiating plate, a thermal conductive body made of a thermally conductive material and arranged to be brought into contact with the 2nd thermally conductive plate, a step-up circuit block including a step-up circuit for boosting the electromotive force generated by the thermoelectric generator unit, and a power supply operation control circuit for controlling operation of storing the electromotive force generated by the thermoelectric generator unit and controlling operation of the step-up circuit.

By the constitution, there can be realized a small-sized power generating block provided with a thermoelectric generator unit having excellent power generation efficiency.

Further, according to the power generating block provided with a thermoelectric generator unit of the invention, it is preferable that the thermoelectric generator unit is attached to the thermal conductive body in a state in which an outer side face of the 2nd thermally conductive plate is brought into contact with the thermal conductive body.

By the constitution, there can be realized a power generating block provided with a thermoelectric generator unit which is fabricated simply.

Further, according to the power generating block provided with a thermoelectric generator unit of the invention, it is preferable that a generating block frame made of an electrically insulating material is provided, the step-up circuit block includes a step-up circuit substrate, the thermoelectric generator unit includes a lead substrate for transmitting the generated electromotive force and the lead substrate is fixed to the generating block frame in a state in which a pattern of the lead substrate is brought into contact with a pattern of the step-up circuit substrate.

By the constitution, there can be realized the power generating block provided with a thermoelectric generator unit which is fabricated simply.

Further, according to the power generating block provided with a thermoelectric generator unit of the invention, it is preferable that electric elements of the step-up circuit block are arranged at a surrounding of the thermoelectric generator unit.

By the constitution, there can be realized the small-sized thin type power generating block provided with a thermoelectric generator unit.

BRIEF DESCRIPTION OF THE DRAWINGS

FIG. 6 is a sectional view taken along a line 6A—6A of FIG. 5 showing a state in which the lead substrate is adhered to the 1st thermally conductive plate.

DETAILED DESCRIPTION OF THE INVENTION

An explanation will be given of embodiments according to the invention in reference to the drawings as follows.

(1) A structure of a thermoelectric generator unit used in embodiments of a generating block timepiece having a thermoelectric generator unit according to the invention and a method of fabricating thereof:

An explanation will be given of a method of fabricating a thermoelectric generator unit according to the invention.

Figure 1:
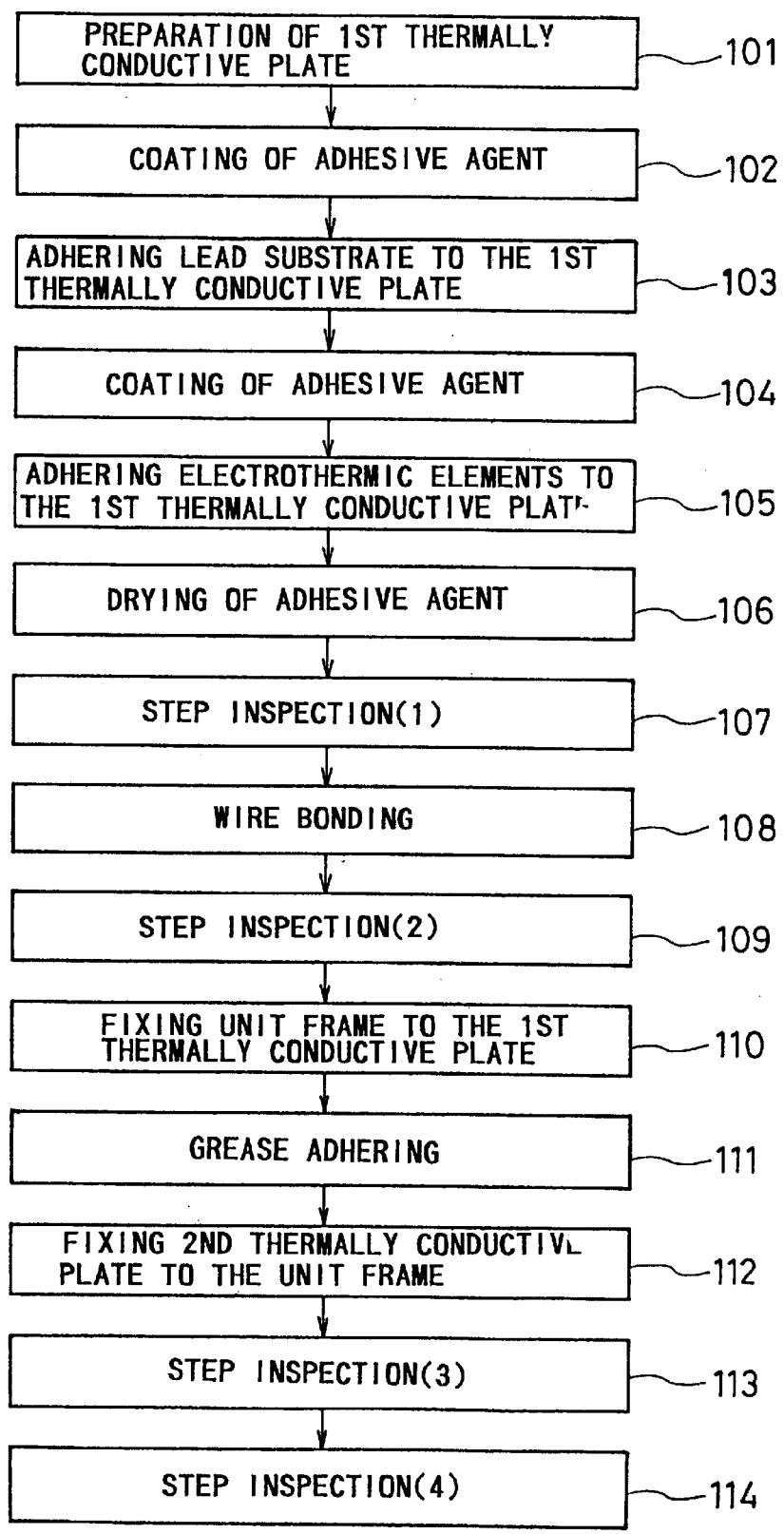
FIG. 1 is a step diagram showing steps of fabricating a thermoelectric generator unit according to the invention.

In reference to FIG. 1, firstly, a 1st thermally conductive plate 120 is prepared (step 101).

Figure 2:
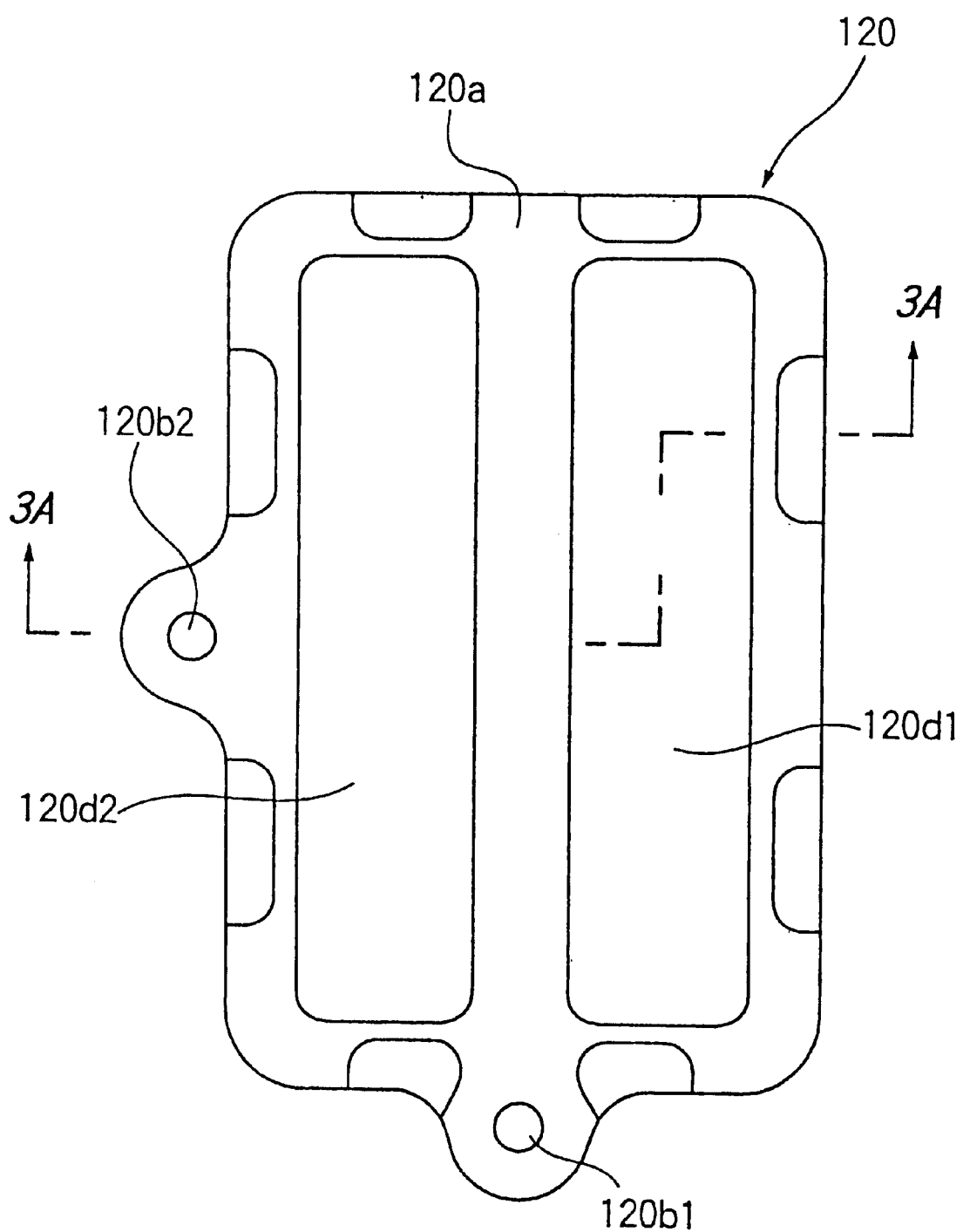
FIG. 2 is a plane view of a 1st thermally conductive plate of the thermoelectric generator unit according to the invention.
Figure 3:
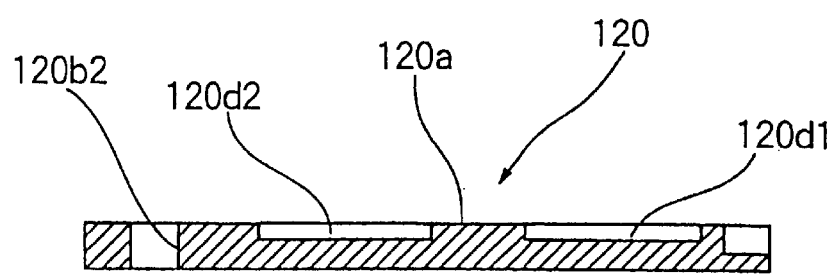
FIG. 3 is a sectional view of the 1st thermally conductive plate taken along a line 3A—3A of FIG. 2.

In reference to FIG. 2 and FIG. 3, the 1st thermally conductive plate 120 is made of a metal having excellent thermal conductivity, for example, aluminum, copper or the like. When the 1st thermally conductive plate 120 is fabricated by copper, it is preferable to plate the surface with nickel.

The 1st thermally conductive plate 120 is a thin plate member having substantially a rectangular plane shape. The 1st thermally conductive plate 120 is provided with a lead substrate base portion 120a for attaching a lead substrate, a lead substrate supporting guide hole 120b1 for guiding the lead substrate in attaching the lead substrate, a manufacturing guide hole 120b2 and electrothermic element base portions 120d1 and 120d2 for attaching electrothermic elements.

When 10 electrothermic elements are used, 5 electrothermic elements are attached to the electrothermic element base portion 120d1 and 5 electrothermic elements are attached to the electrothermic element base portion 120d2. Accordingly, the plane shape of the electrothermic element base portions 120d1 and 120d2 is determined in compliance with the plane shape of the electrothermic element. The thickness of the electrothermic element base portions 120d1 and 120d2 is thinner than the thickness of the electrothermic element base portion 120a.

Figure 4:
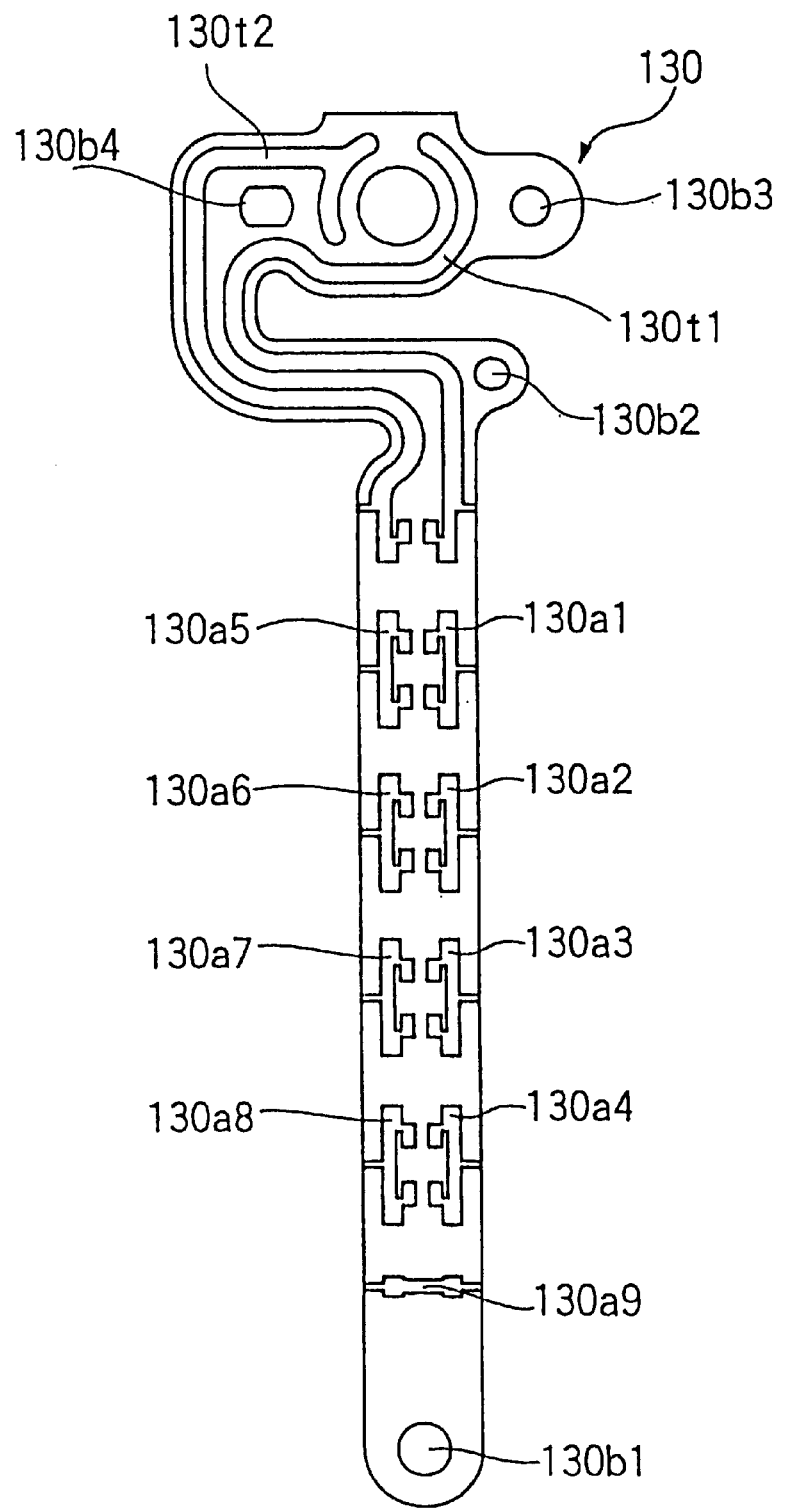
FIG. 4 is a plane view of a lead substrate of the thermoelectric generator unit according to the invention.

In reference to FIG. 4, a lead substrate 130 is formed in a shape including a slender portion. The lead substrate 130 may be a glass epoxy substrate or may be a polyimide film substrate.

The lead substrate 130 is installed with lead patterns 130a1 through 130a9 for wiring in series 10 electrothermic elements and 2 output terminal patterns 130t1 and 130t2 for constituting output terminals of the thermoelectric generator unit.

The lead substrate 130 is installed with supporting guide holes 130b1 and 130b2 for positioning the lead substrate 130 in attaching the lead substrate 130 to the 1st thermally conductive plate 120. Further, the lead substrate 130 is installed also with assembling guide holes 130b3 and 130b4. The position of the supporting guide hole 130b1 is determined in correspondence with the position of the lead substrate supporting guide hole 120b1 of the 1st thermally conductive plate 120.

In reference to FIG. 1, successively, an adhesive agent is coated on the lead substrate base portion 120a of the 1st thermally conductive plate 120 (step 102). The adhesive agent is preferably an epoxy-species adhesive agent. The adhesive agent may be an adhesive agent of other kind such as a thermosensible adhesive agent or the like or may be a sheet-like adhesive agent.

Figure 5:
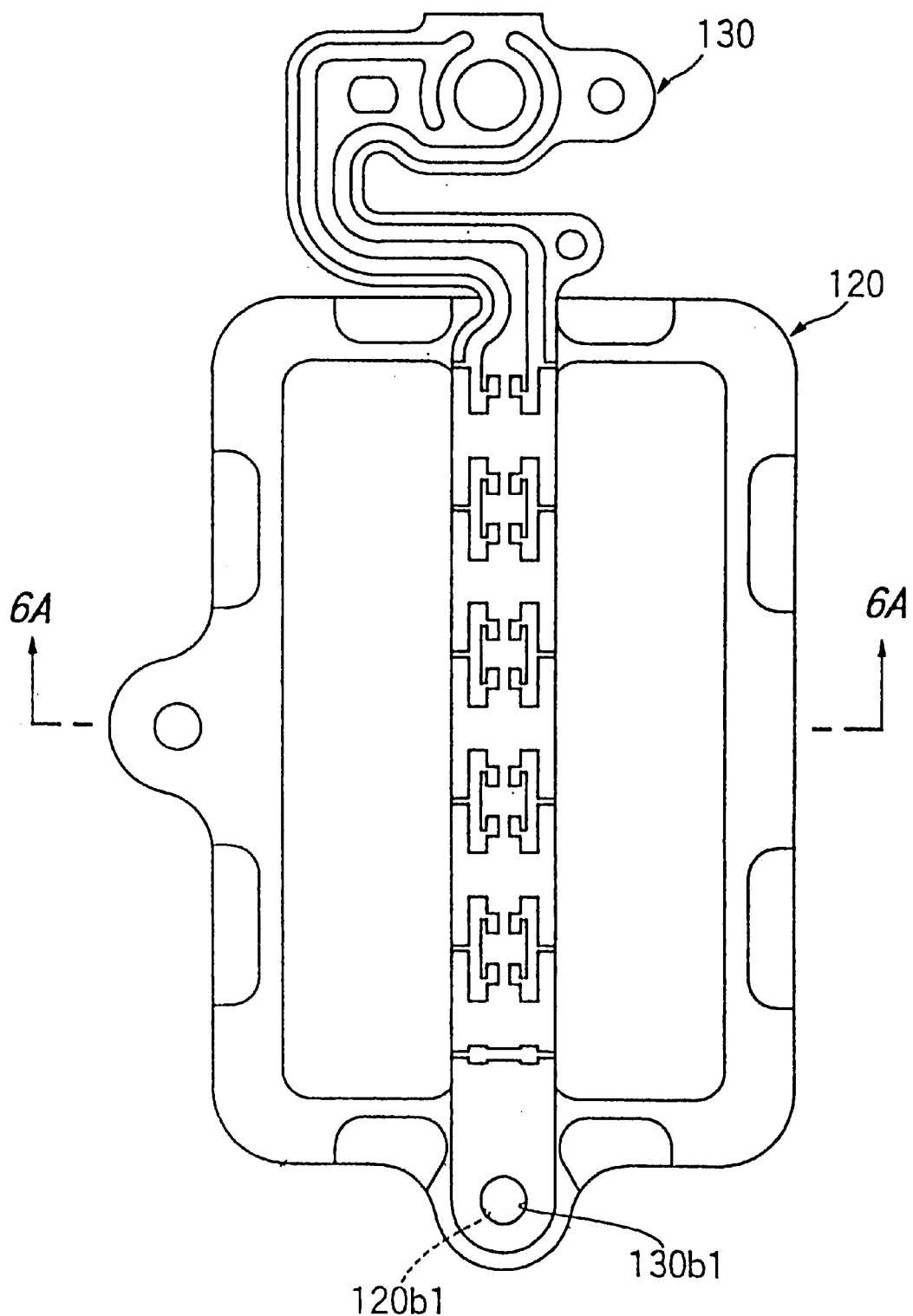
FIG. 5 is a plane view showing a state in which the lead substrate is adhered to the 1st thermally conductive plate in the thermoelectric generator unit according to the invention.

In reference to FIG. 5 and FIG. 6, successively, the lead substrate supporting guide hole 120b1 of the 1st thermally conductive plate 120 and the supporting guide hole 130b1 of the lead substrate 130 are aligned and the lead substrate 130 is adhered to the 1st thermally conductive plate 120 by an adhesive agent 132 (step 103).

Figure 7:
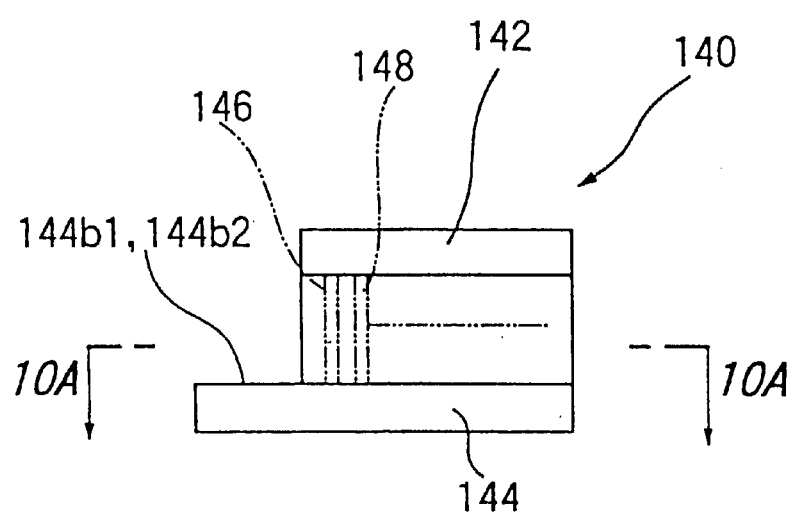
FIG. 7 is a side view of an outline of an electrothermic element of the thermoelectric generator unit according to the invention.
Figure 8:
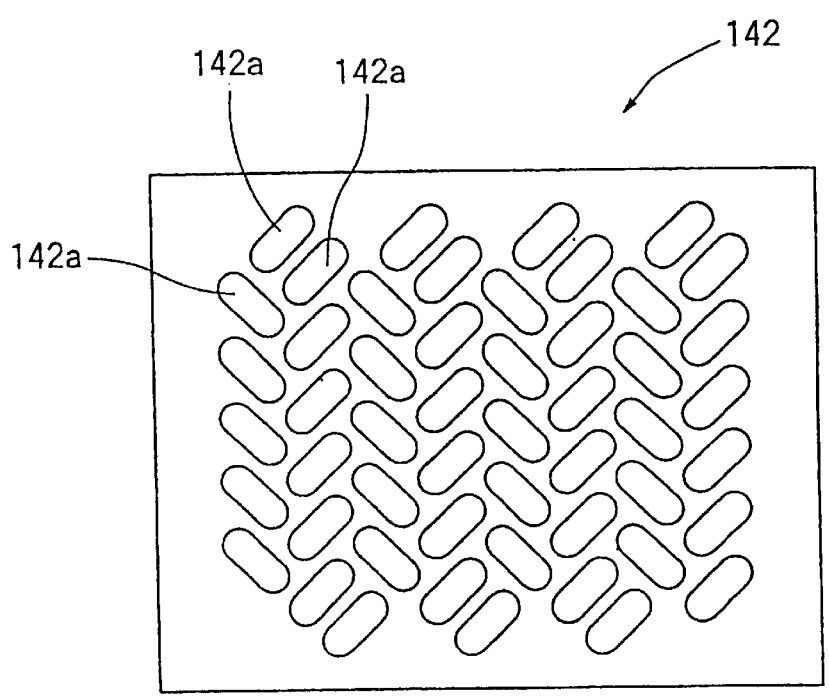
FIG. 8 is a plane view of an upper electrothermic element substrate of the thermoelectric generator unit according to the invention.
Figure 9:
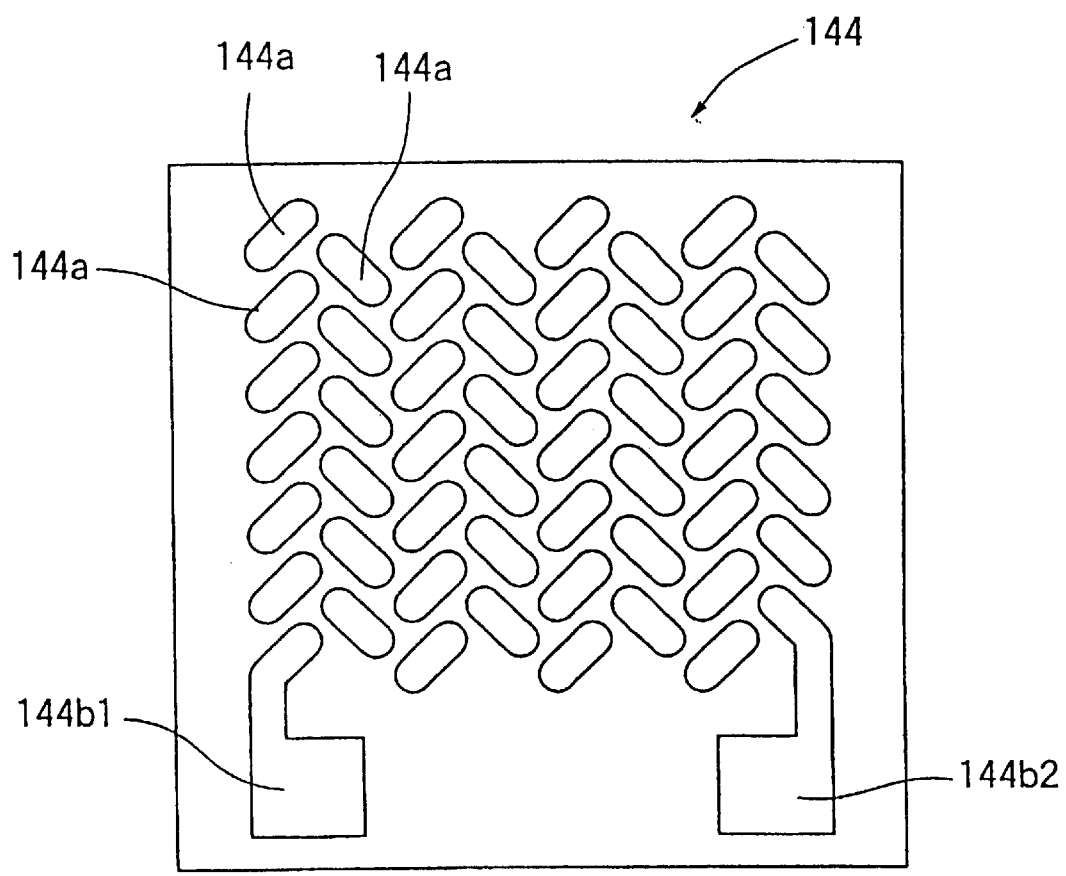
FIG. 9 is a plane view of a lower electrothermic element substrate of the thermoelectric generator unit according to the invention.
Figure 10:
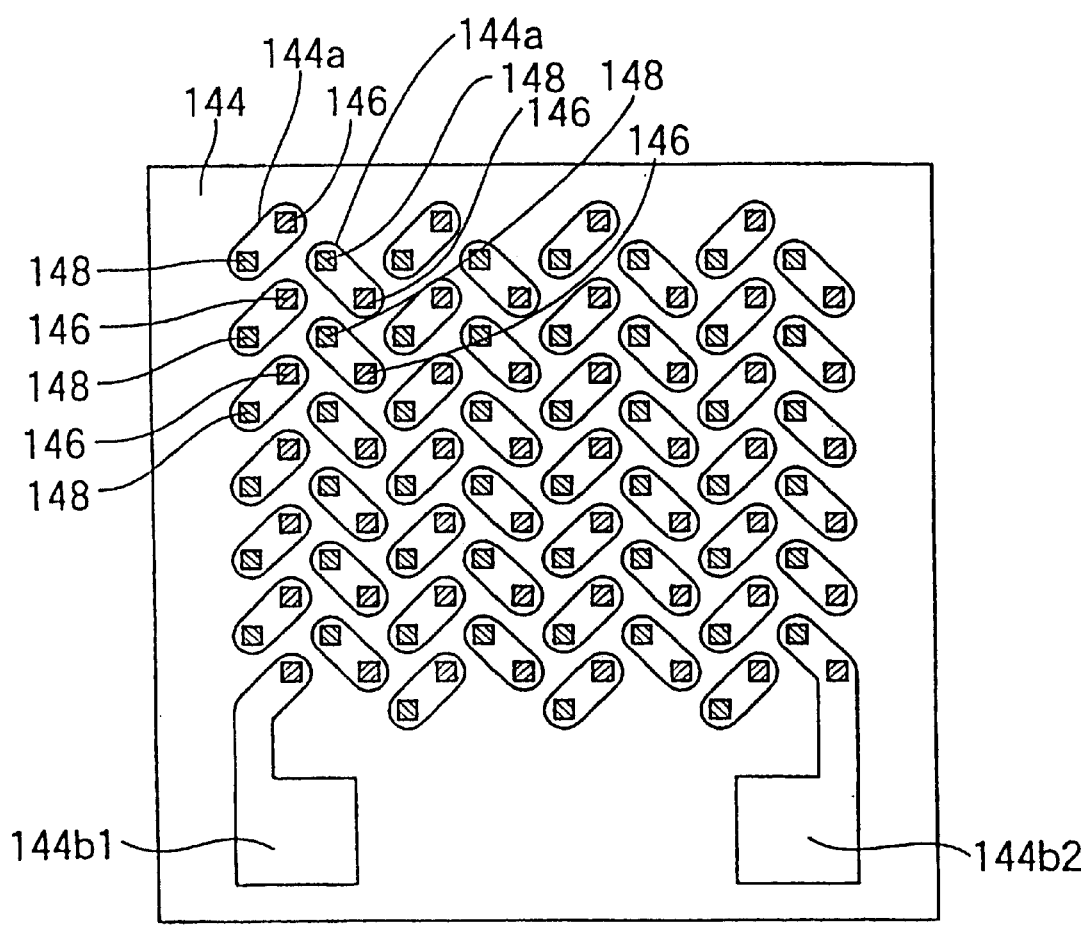
FIG. 10 is a cross-sectional view of the electrothermic elements taken along a line 10A—10A of FIG. 7.

In reference to FIG. 7 through FIG. 9, an electrothermic element 140 of the thermoelectric generator unit according to the invention, includes an upper electrothermic element substrate 142, a lower electrothermic element substrate 144, a plurality of p-type semiconductors 146 and a plurality of n-type semiconductors 148.

The upper electrothermic element substrate 142 is provided with a plurality of conducting patterns 142a for conducting the p-type semiconductors 146 and the n-type semiconductors 148. The lower electrothermic element substrate 144 is provided with a plurality of conducting patterns 144a for conducting the p-type semiconductors 146 and the n-type semiconductors 148 and terminal patterns 144b1 and 144b2 of the electrothermic elements 140.

In reference to FIG. 7 through FIG. 10, the plurality of p-type semiconductors 146 and the plurality of n-type semiconductors 148 are connected to the patterns of the upper electrothermic element substrate 142 and the patterns of the lower electrothermic element substrate 144 such that the respective p-type semiconductors 146 and the respective n-type semiconductors 148 are connected alternately in series.

According to the electrothermic element 140 constituted in this way, when, for example, a side having the upper electrothermic element substrate 142 constitutes a heat radiating side and a side having the lower electrothermic element substrate 144 constitutes a heat absorbing side, in the n-type semiconductor 148, electrons are moved toward the upper electrothermic element substrate 142 on the heat radiating side and in the p-type semiconductor 146, electrons are moved toward the lower electrothermic element substrate 144 on the heat absorbing side. The respective p-type semiconductors 146 and the respective n-type semiconductors 148 are electrically connected in series via the conducting patterns 142a of the upper electrothermic element substrate 142 and the conducting patterns 144a of the lower electrothermic element substrate 144 and accordingly, transfer of heat is converted into current in the p-type semiconductors 146 and the n-type semiconductors 148 and an electromotive force is generated between the terminal patterns 144b1 and 144b2 of the lower electrothermic element substrate 144.

In reference to FIG. 1 and FIG. 2, successively, an adhesive agent is coated on the electrothermic element base portions 120d1 and 120d2 of the 1st thermally conductive plate 120 (step 104). The adhesive agent used in step 104 is a thermally conductive adhesive agent of, for example, silver paste. The adhesive agent may be a thermally conductive epoxy-species adhesive agent or may be a thermally conductive adhesive agent of other kind.

Figure 11:
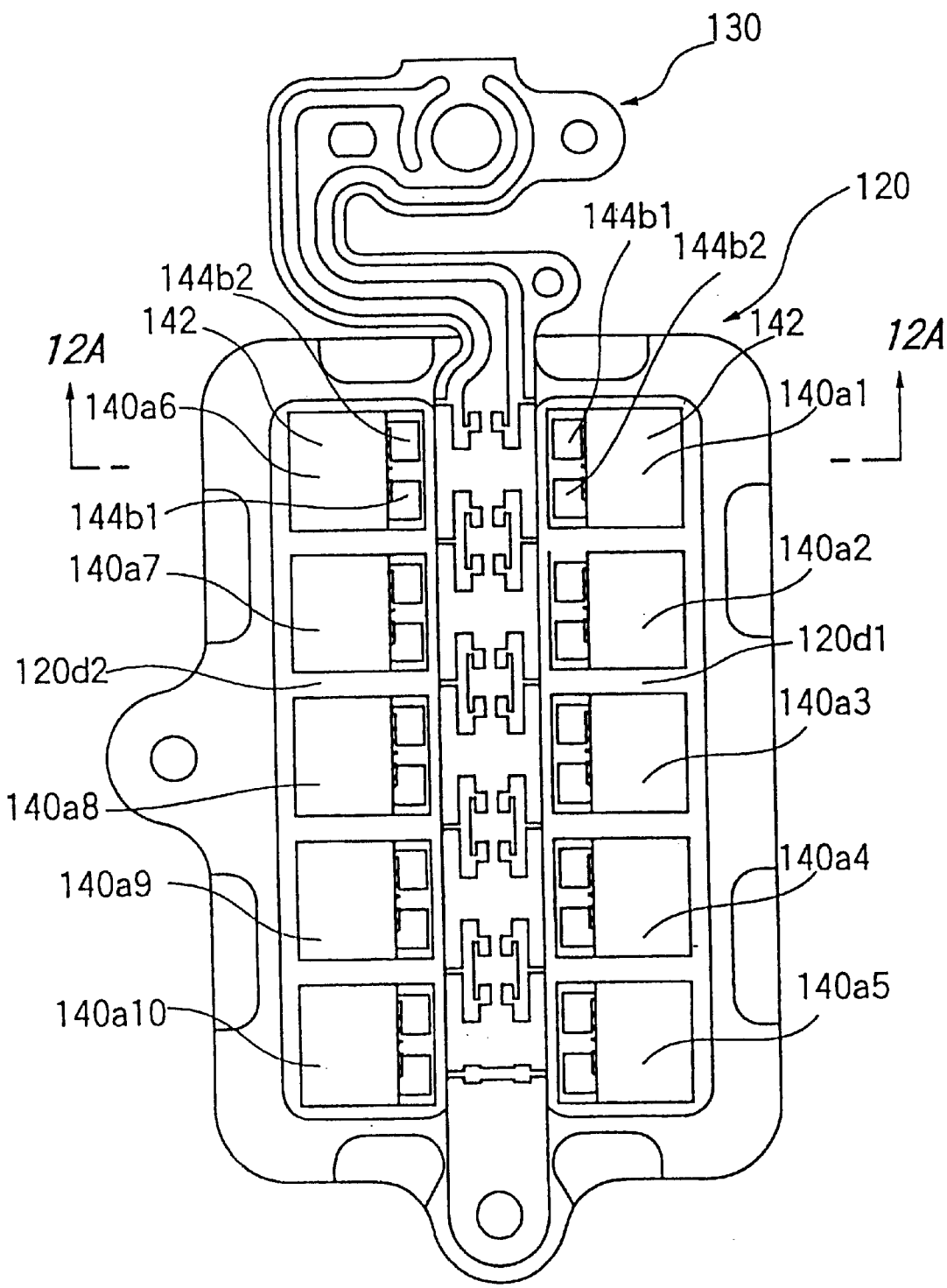
FIG. 11 is a plane view showing a state in which the electrothermic elements are adhered to the 1st thermally conductive plate in the thermoelectric generator unit according to the invention.
Figure 12:
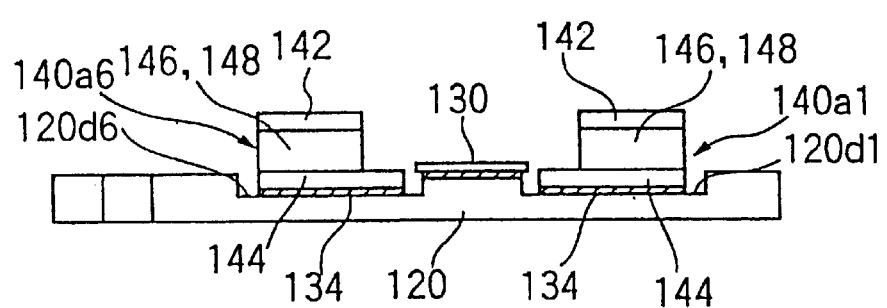
FIG. 12 is a sectional view taken along a line 12A—12A of FIG. 11 showing a state in which the electrothermic elements are adhered to the 1st thermally conductive plate.

In reference to FIG. 1, FIG. 11 and FIG. 12, successively, 5 of the electrothermic elements 140a1 through 140a5 are fixedly adhered to one of the electrothermic element base portions 120d1 of the 1st thermally conductive plate 120 and 5 of the electrothermic elements 140a6 through 140a10 are fixedly adhered to other of the electrothermic element base portions 120d2 (step 105). In step 105, in a state in which the respective terminal patterns 144b1 and 144b2 of the lower electrothermic element substrates 144 are arranged at a vicinity of the lead substrate 130, the lower side faces of the lower electrothermic element substrates 140 of the electrothermic elements 144 are adhered to the electrothermic element base portions 120d1 and 120d2 by a silver paste 134. Thereby, the lower electrothermic element substrates 144 of the electrothermic elements 140 and the 1st thermally conductive plate 120 are made thermally conductive to each other.

Therefore, as shown by FIG. 11, 5 of the electrothermic elements 140a1 through 140a5 are arranged on one side (right side of drawing) of the lead substrate 130 and 5 of the electrothermic elements 140a6 through 140a10 are arranged on other side (left side of drawing) of the lead substrate 130.

Although according to the above-described embodiment of the thermoelectric generator unit, 10 of the electrothermic elements 140a1 through 140a10 are used, a number of the electrothermic elements 140 may be 1 or 2 or more. Further, although a number of the electrothermic elements 140 is preferably an even number, it may be an odd number.

In reference to FIG. 1, successively, the silver paste used in step 105 is dried (step 106). It is preferable in step 106 that, for example, drying temperature is 120° C. through 150° C. and drying time is 2 hours through 5 hours.

Next, step inspection (1) is carried out (step 107). In step inspection (1), resistance of each of the electrothermic elements 140 is measured.

Figure 13:
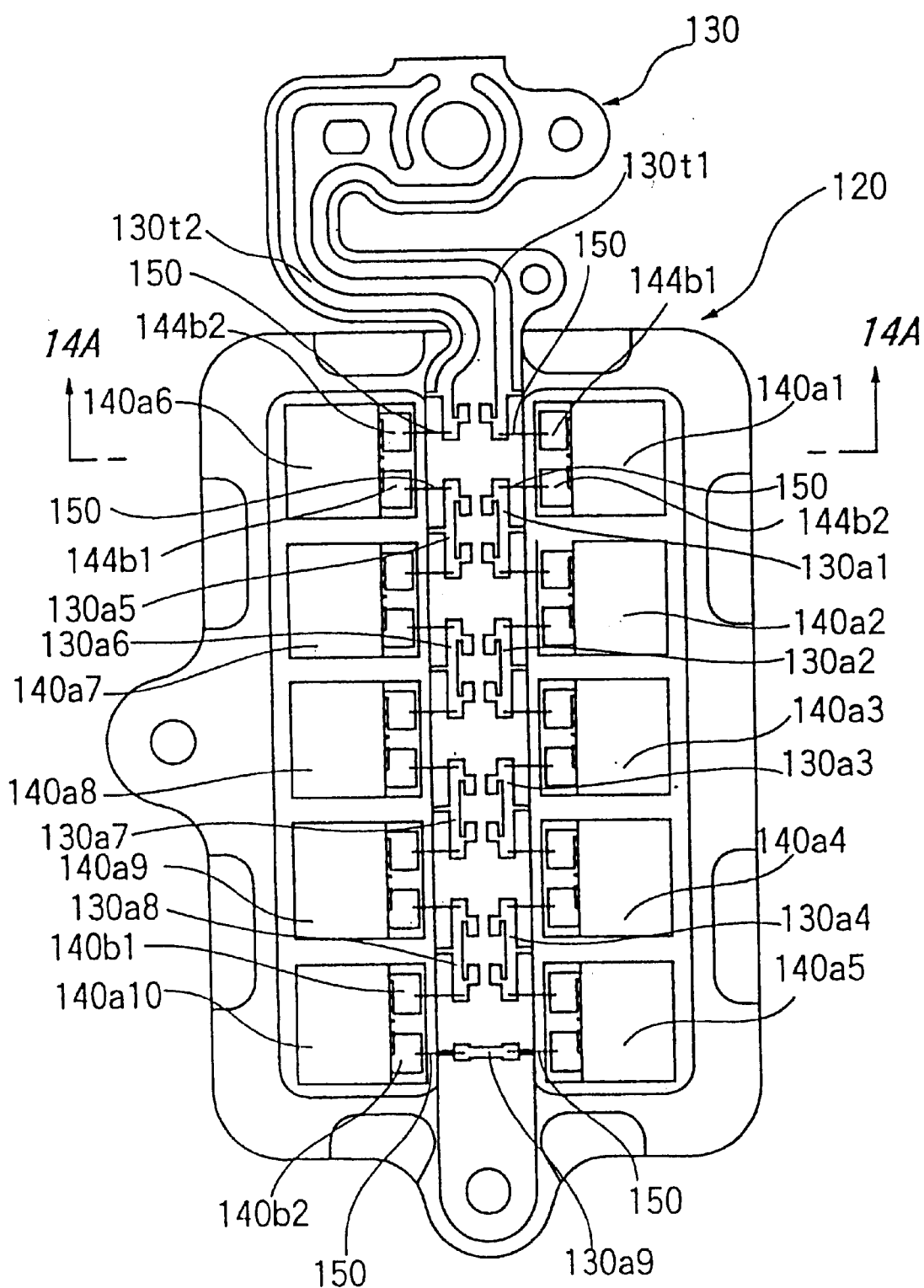
FIG. 13 is a plane view showing a state in which terminal patterns of the electrothermic elements and lead patterns of the lead substrate are conducted by wire bonding in the thermoelectric generator unit according to the invention.
Figure 14:
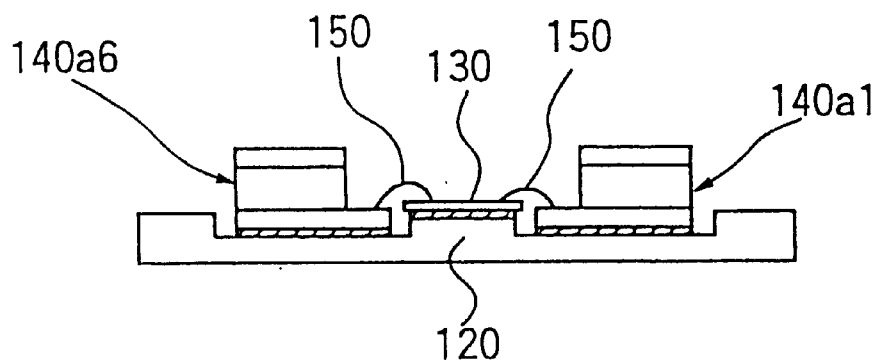
FIG. 14 is a sectional view taken along a line 14A—14A of FIG. 13 showing a state in which the terminal patterns of the electrothermic elements and the lead pattern of the lead substrate are conducted by wire bonding.

In reference to FIG. 1, FIG. 13 and FIG. 14, successively, the respective terminal patterns 144b1 and 144b2 of 10 of the electrothermic elements 140a1 through 140a10, lead patterns 130a1 through 130a9 and the output terminal patterns 130t1 and 130t2 of the lead substrate 130, are conducted by wire bonding 150 (step 108). The wire bonding 150 wires the electrothermic elements 140 such that the plurality of electrothermic elements 140 are connected in series.

In reference to FIG. 13, the terminal pattern 144b1 of the electrothermic element 140a1 and the output terminal pattern 130t1 of the lead substrate 130 are conducted by the wire bonding 150. The terminal pattern 144b2 of the electrothermic element 144a1 and the output terminal pattern 130t2 of the lead substrate 130 are conducted by the wire bonding 150. Similarly, the electrothermic element 140a1 through the electrothermic element 140a5 are wired in series and the electrothermic element 140a6 through the electrothermic element 140a10 are wired in series by the wire bonding 150. The electrothermic element 140a5 and the electrothermic element 140a10 are wired in series via the lead pattern 130a9 of the lead substrate 130 by the wire bonding 150.

The terminal pattern 144b1 of the electrothermic element 140a6 and the lead pattern 130a5 of the lead substrate 130 are conducted by the wire bonding 150. The terminal pattern 140b2 of the electrothermic element 140a6 and the output terminal pattern 130t2 of the lead substrate 130 are conducted by the wire bonding 150.

By step 108, 10 of the electrothermic elements 140a1 through 140a10 are connected in series and the patterns 130t1 and 130t2 of the lead substrate 130 constitute the output terminals of the thermoelectric generator unit.

In reference to FIG. 1, successively, step inspection (2) is carried out (step 109). In step inspection (2), resistance of the thermoelectric generator unit connected in series with 10 of the electrothermic elements 140a1 through 140a10 is measured.

Figure 15:
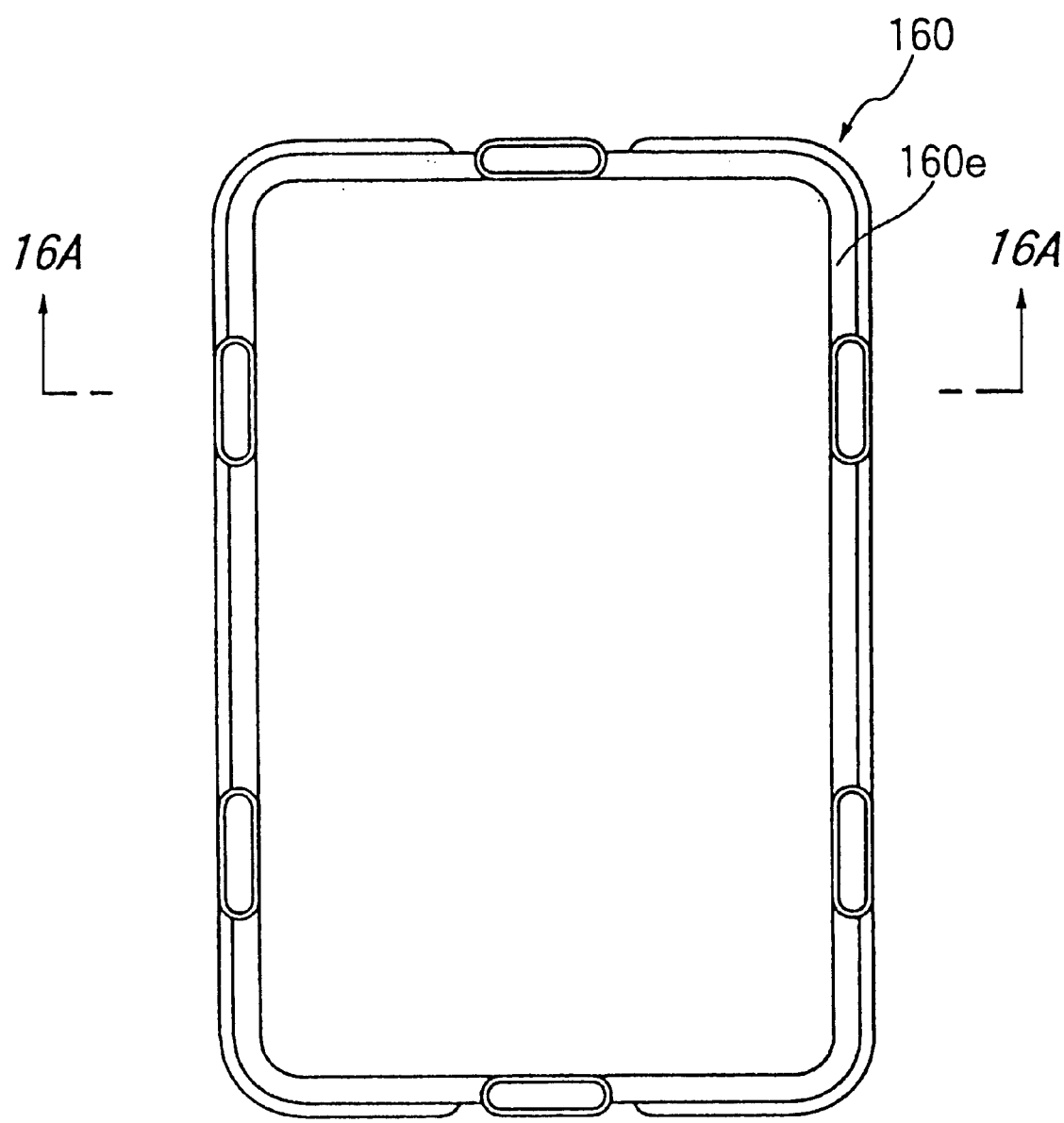
FIG. 15 is a plane view of a unit frame of the thermoelectric generator unit according to the invention.
Figure 16:
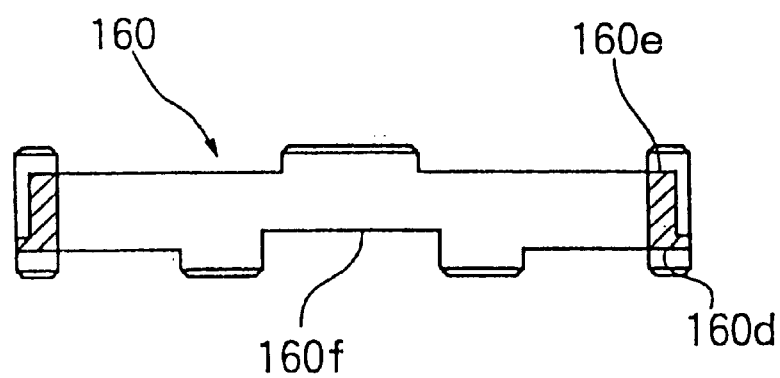
FIG. 16 is a sectional view of the unit frame of the thermoelectric generator unit according to the invention.

In reference to FIG. 15 and FIG. 16, a unit frame 160 of the thermoelectric generator unit according to the invention, is a member having a contour substantially in a rectangular shape and is constituted in a shape capable of surrounding 10 of the electrothermic elements 140a1 through 140a10. The unit frame 160 is provided with a lower supporting portion 160d for attaching the 1st thermally conductive plate 120, an upper supporting portion 160e for attaching a 2nd thermally conductive plate and a lead substrate escaping portion 160f for escaping the lead substrate 130.

A distance between the lower supporting portion 160d and the upper supporting portion 160e of the unit frame 160 is constituted to produce a gap between a lower face of the 2nd thermally conductive plate 170 and an upper face of the upper electrothermic element substrate 142 of the electrothermic element 140 when the 1st thermally conductive plate 120 and the 2nd thermally conductive plate 170 are attached to the unit frame 160.

The unit frame 160 is preferably fabricated by plastic such as ABS resin, polycarbonate or acrylic resin.

Figure 17:
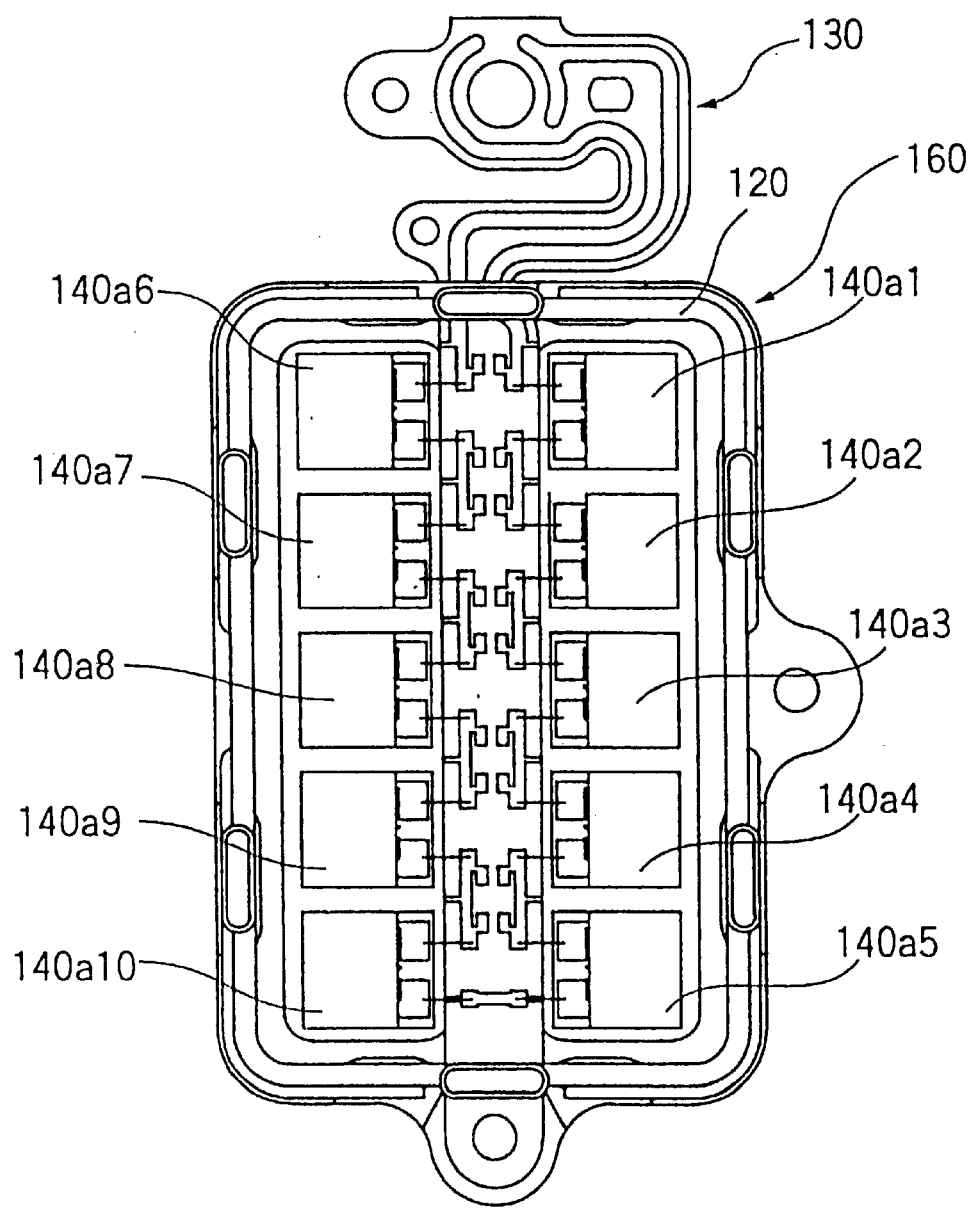
FIG. 17 is a plane view showing a state in which the unit frame is fixed to the 1st thermally conductive plate in the thermoelectric generator unit according to the invention.

In reference to FIG. 1 and FIG. 17, successively, the unit frame 160 is fixed to the 1st thermally conductive plate 120 such that the unit frame 160 surrounds 10 of the electrothermic elements 140a1 through 140a10 (step 110). At this occasion, the lead substrate escaping portion 160f of the unit frame 160 is arranged to escape the upper face of the lead substrate 130.

Fixing of the unit frame 160 to the 1st thermally conductive plate 120 may be carried out by fitting, adhering or melting a portion of the unit frame 160 to adhere to the 1st thermally conductive plate 120.

In reference to FIG. 1, successively, grease is adhered to the upper faces of the upper electrothermic element substrates 142 of 10 of the electrothermic elements 140a1 through 140a10 (step 111).

It is preferable that grease used in step 111 is silicone grease having excellent thermal conductivity and, for example, commercial name "Toshiba silicone pound" is used.

Figure 18:
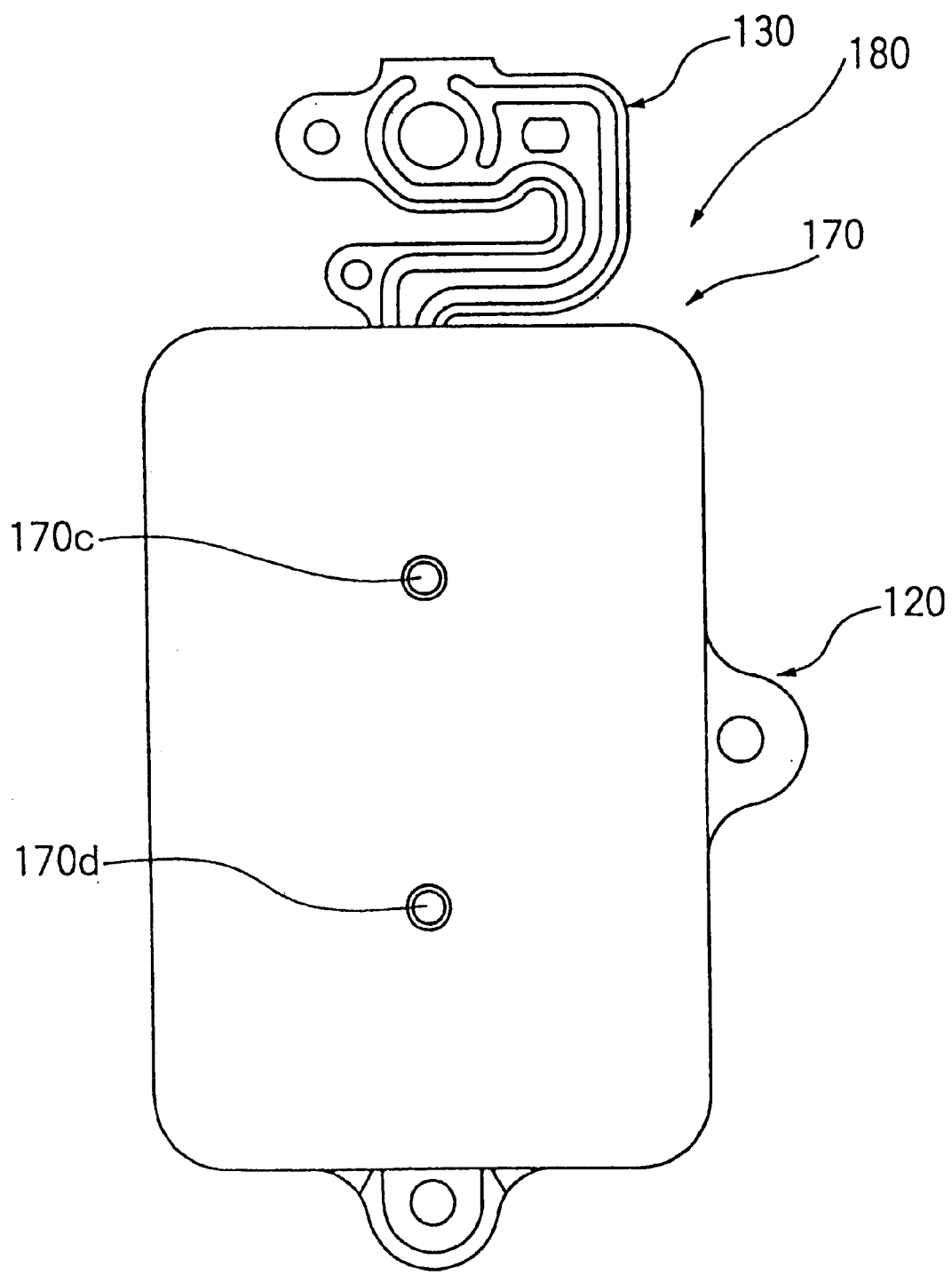
FIG. 18 is a plane view of the thermoelectric generator unit according to the invention.
Figure 19:
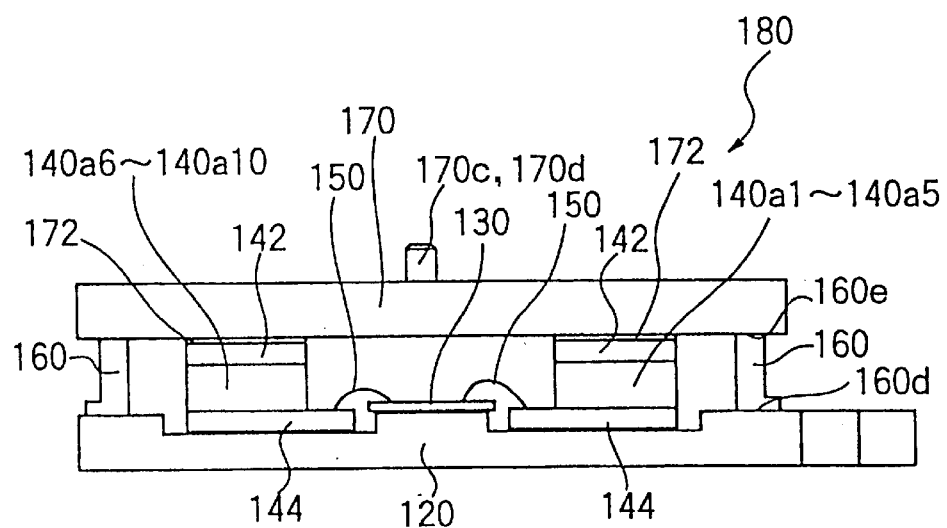
FIG. 19 is a sectional view of the thermoelectric generator unit according to the invention.

In reference to FIG. 18 and FIG. 19, successively, the 2nd thermally conductive plate 170 is fixed to the upper supporting portion 160e of the unit frame 160 (step 112). At this occasion, there is a gap between the lower face of the 2nd thermally conductive plate 170 and the upper face of the upper electrothermic element substrate 142 of the electrothermic element 140 and silicone grease 172 is arranged in the gap. Therefore, the 2nd thermally conductive plate 170 and the upper electrothermic element substrate 142 are made thermally conductible to each other by the silicone grease 172.

The 2nd thermally conductive plate 170 is made of a metal having excellent thermal conductivity, for example, aluminum, copper or the like. When the 2nd thermally conductive plate 170 is made of copper, it is preferable to plate the surface with nickel. The 2nd thermally conductive plate 170 is a thin plate member having a substantially rectangular plane shape. The outer shape of the 2nd thermally conductive plate 170 is formed in dimensions and a shape capable of attaching to the upper supporting portion 160e of the unit frame 160.

Fixing of the 2nd thermally conductive plate 170 to the unit frame 160 may be carried out by fitting, adhering or melting a portion of the unit frame 160 to adhere to the 2nd thermally conductive plate 170.

By attaching the 2nd thermally conductive plate 170 to the unit frame 160, 10 of the electrothermic elements 140a1 through 140a10 contained in the thermoelectric generator unit 180 can firmly be protected.

Guide pins 170c and 170d which are used for attaching the thermoelectric generator unit 180 to other members are installed on one face of the 2nd thermally conductive plate 170. The 2nd thermally conductive plate 170 is attached to the unit frame 160 in a state in which the guide pins 170c and 170d are directed to outside. Although a number of the guide pins is preferably 2, it may be 1 or 3 or more.

In reference to FIG. 1, successively, step inspection (3) is carried out (step 113). In step inspection (3), resistance of the thermoelectric generator unit 180 is measured.

Next, step inspection (4) is carried out (step 114). In step inspection (4), the power generating function of the thermoelectric generator unit is measured. Measurement of the power generating function is carried out by heating one thermally conductive plate of the thermoelectric generator unit by a heater and measuring voltage output from the thermoelectric generator unit 180 by a voltmeter. When the measurement is carried out, a difference between temperature in a chamber where the thermoelectric generator unit 180 is arranged and heating temperature of the heater is maintained constant.

Any of the step inspections may be omitted or additional step inspection may be carried out as necessary.

There is shown as follows an example of sizes of the thermoelectric generator unit 180 according to the invention and constituent parts used in the thermoelectric generator unit.

Length of thermoelectric generator unit in a longitudinal direction: 15.2 mm

Width of thermoelectric generator unit in a lateral direction: 10.0 mm

Thickness of thermoelectric generator unit: 2.7 mm

Length of electrothermic element in the longitudinal direction: 2.4 mm

Width of electrothermic element in the lateral direction: 2.2 mm

Thickness of electrothermic element: 1.3 mm

Maximum thickness of 1st thermally conductive plate: 0.5 mm

Thickness of 2nd thermally conductive plate: 0.5 mm

Distance between outer side face and inner face of unit frame: 0.8 mm.

When voltage is generated by using the thermoelectric generator unit 180, the 1st thermally conductive plate 120 may constitute a heat absorbing plate and the 2nd thermally conductive plate 170 may constitute a heat radiating plate, or the 1st thermally conductive plate 120 may constitute a heat radiating plate and the 2nd thermally conductive plate 170 may constitute a heat absorbing plate. By way of determining the heat absorbing plate and the heat radiating plate, the polarity of voltage generated between the patterns 130t1 and 130t2 of the lead substrate 130 is changed.

Further, the thermoelectric generator unit according to the invention may be fabricated by steps shown below.

The 1st thermally conductive plate is prepared, an epoxy-species adhesive agent is coated on the lead substrate base portion 120a of the 1st thermally conductive plate 120, the lead substrate 130 is adhered to the 1st thermally conductive plate 120 and the unit frame 160 is fixed to the 1st thermally conductive plate 120.

Next, a thermally conductive adhesive agent such as silver paste is coated on the electrothermic element base portions 120d1 through 120d10 of the 1st thermally conductive plate 120 and 10 of the electrothermic elements 140a1 through 140a10 are respectively adhered fixedly to the electrothermic element base portions 120d1 and 120d2 of the 1st thermally conductive plate 120. Next, silver paste used in step 105 mentioned above is dried and resistance of each of the electrothermic elements 140 is measured.

Next, the respective terminal patterns 144b1 and 144b2 of 10 of the electrothermic elements 140a1 through 140a10 and the lead patterns 130a1 through 130a9 and the output terminal patterns 130t1 and 130t2 of the lead substrate 130 are conducted by the wire bonding 150. The wire bonding 150 wires the electrothermic elements 140 such that the plurality of electrothermic elements 140 are connected in series.

Next, resistance of the thermoelectric generator unit connected in series with 10 of the electrothermic elements 140a1 through 140a10 is measured.

Next, silicone grease is attached to the upper face of the upper electrothermic element substrates of 10 of the electrothermic elements 140a1 through 140a10.

Next, the 2nd thermally conductive plate 170 is fixed to the upper supporting portion 160e of the unit frame 160. The 2nd thermally conductive plate 170 and the upper electrothermic element substrate 142 are made thermally conductible by the silicone grease 172.

Next, resistance of the thermoelectric generator unit 180 is measured and the power generating function of the thermoelectric generator unit is measured.

(2) A structure of an embodiment of a case of a timepiece having a generating block with a thermoelectric generator unit according to the invention:

Next, an explanation will be given of a structure of a timepiece having a generating block with a thermoelectric generator unit according to the invention.

Figure 20:
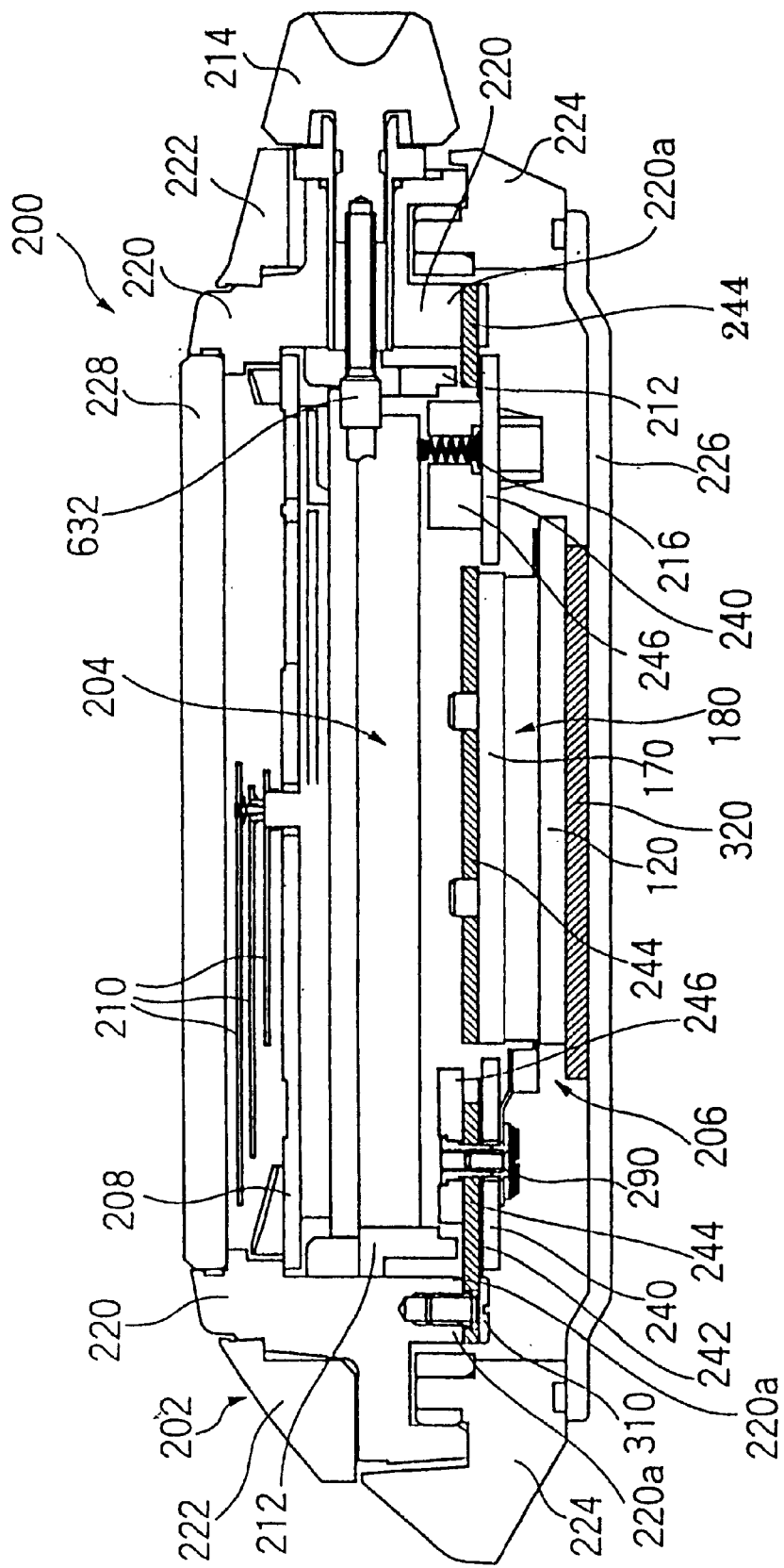
FIG. 20 is a sectional view of an embodiment of a timepiece entity of the timepiece according to the invention.
Figure 21:
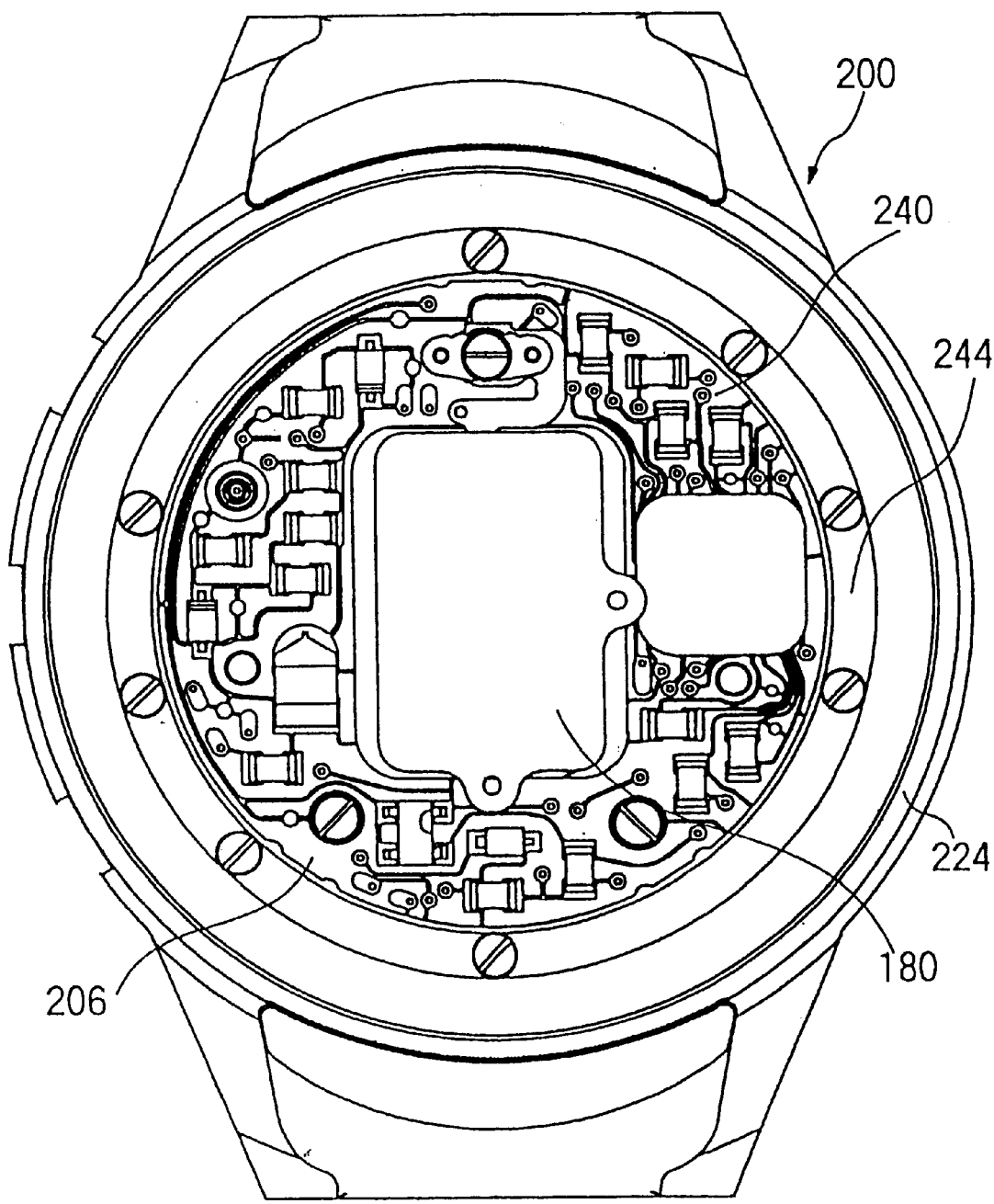
FIG. 21 is a rear plane view of the timepiece entity of the timepiece having the generating block with the thermoelectric generator unit according to the invention viewed from the case back side by removing the case back and a crown.
Figure 22:
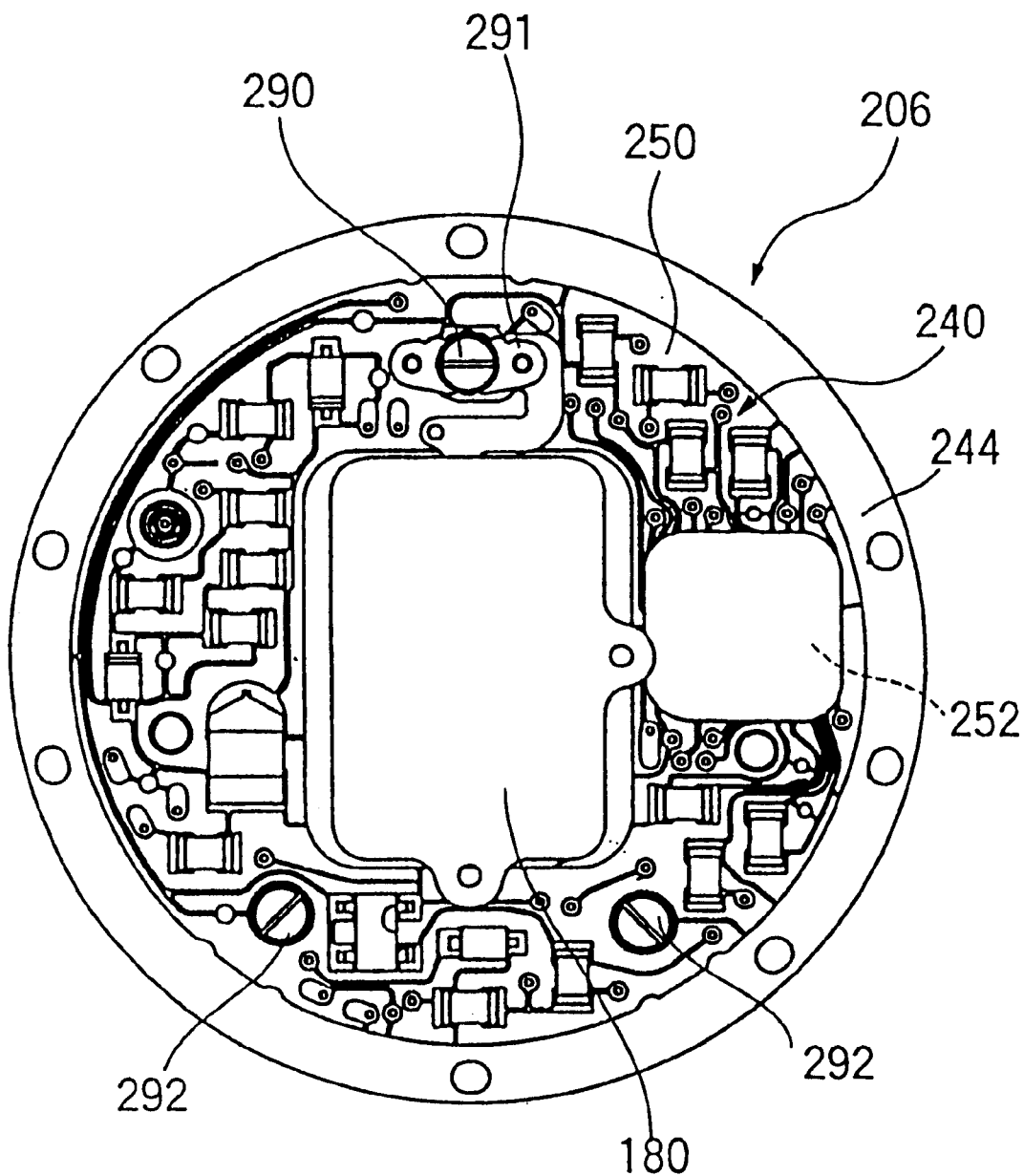
FIG. 22 is a rear plane view of a generating block of the timepiece having the generating block with the thermoelectric generator unit according to the invention viewed from the case back side.
Figure 23:
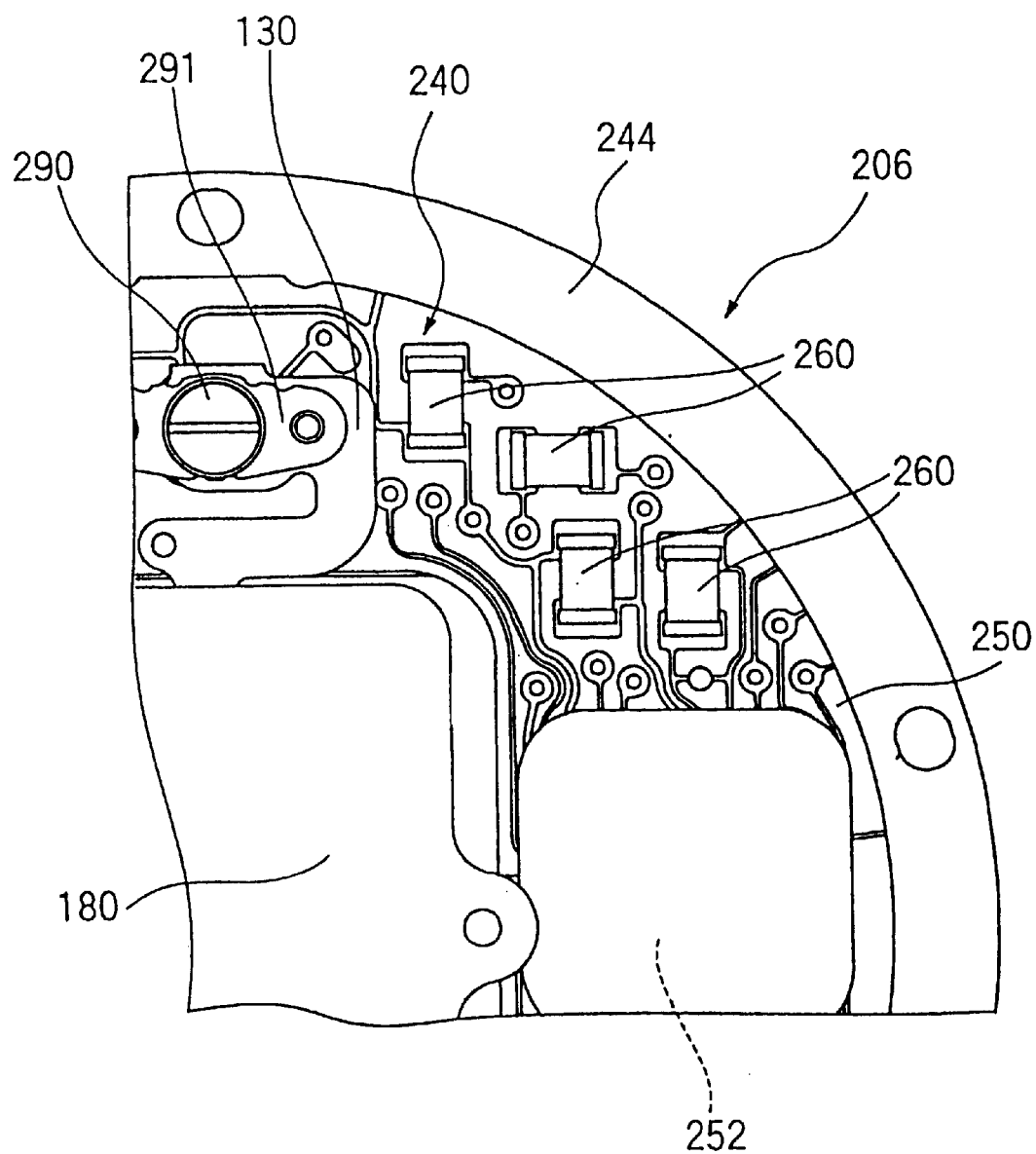
FIG. 23 is a rear plane view (part 1) of enlarged portions of the generating block having the thermoelectric generator unit according to the invention viewed from the case back side.
Figure 24:
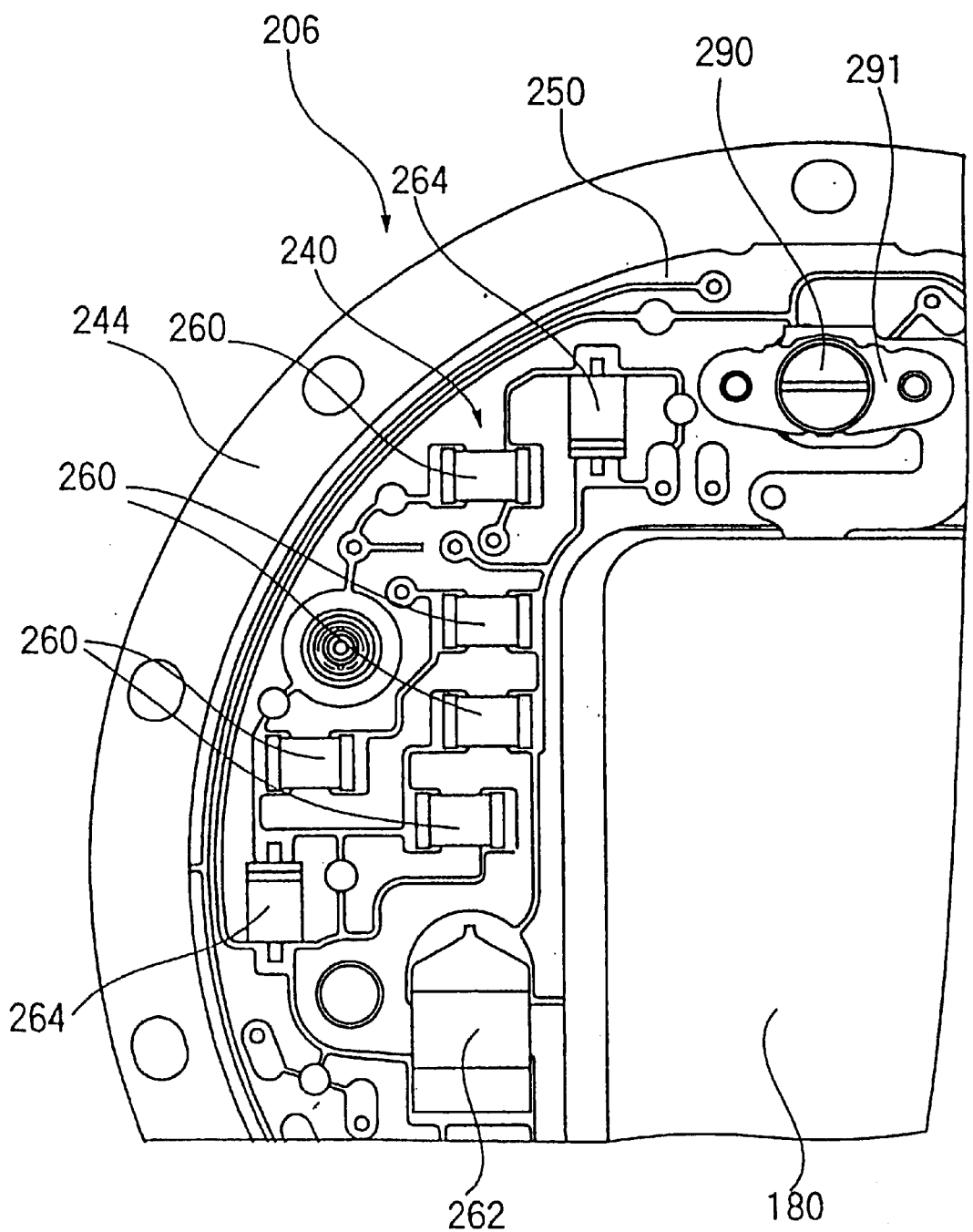
FIG. 24 is a rear plane view (part 2) of enlarged portions of the generating block having the thermoelectric generator unit according to the invention viewed from the case back side.
Figure 25:
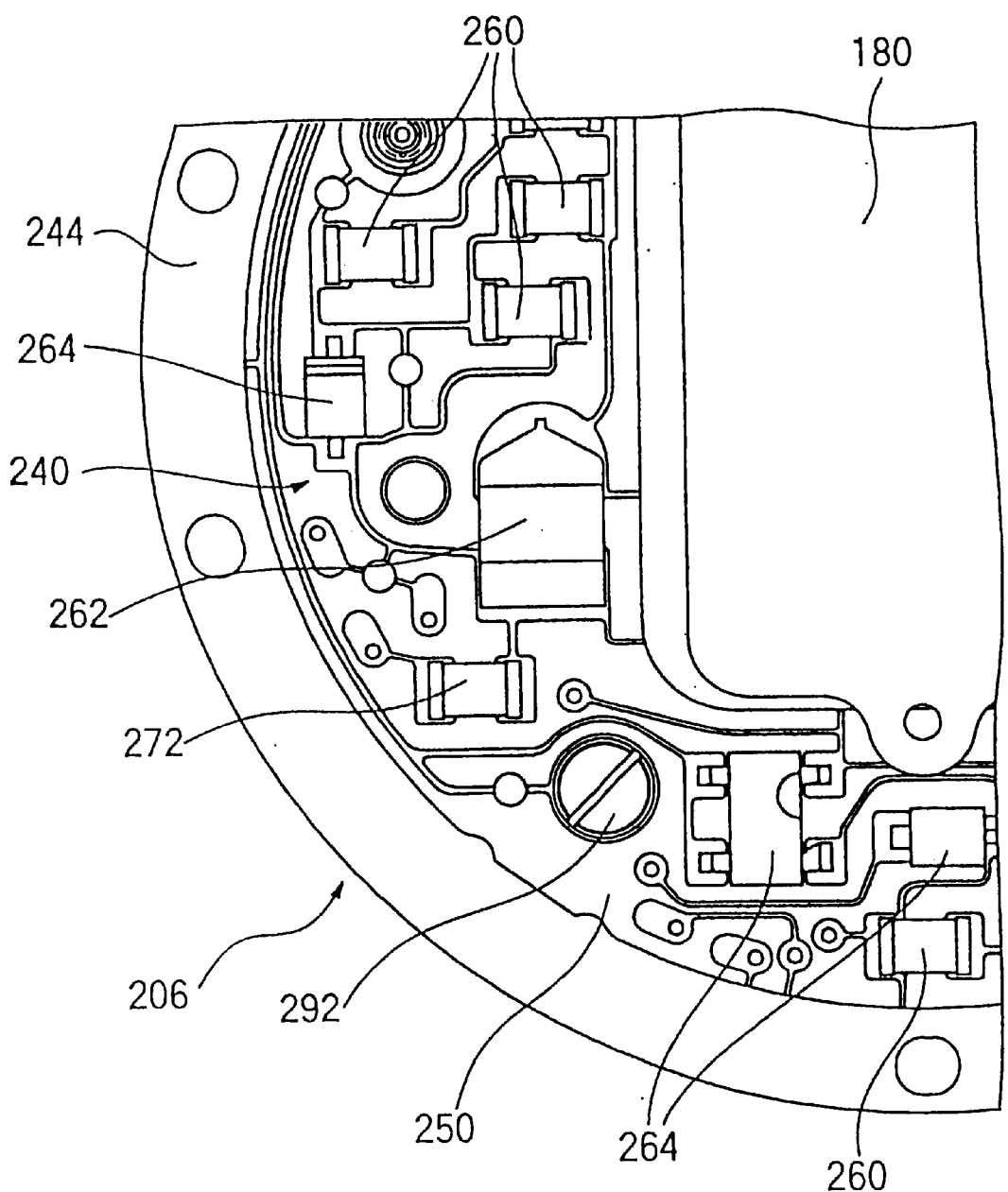
FIG. 25 is a rear plane view (part 3) of enlarged portions of the generating block having the thermoelectric generator unit according to the invention viewed from the case back side.
Figure 26:
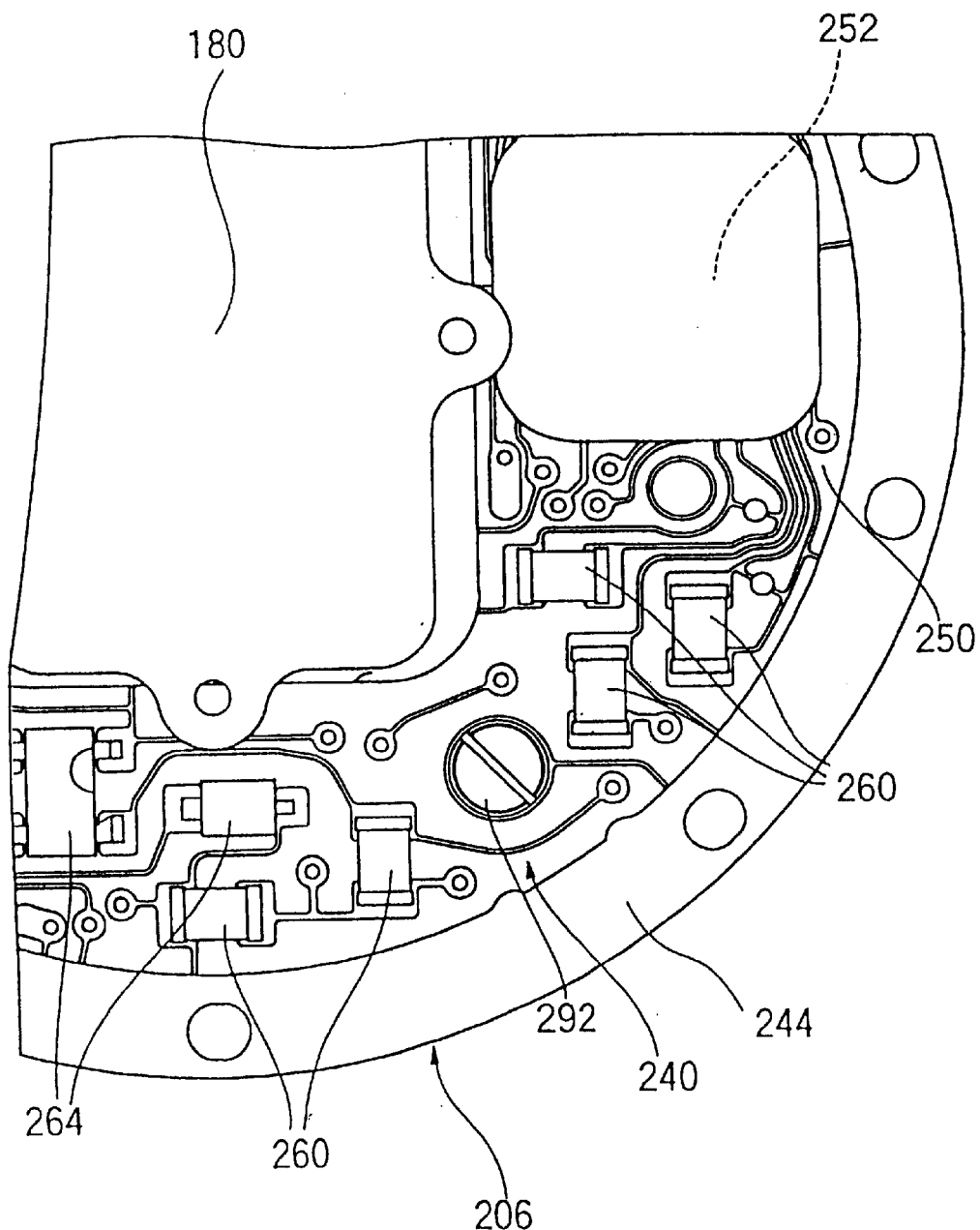
FIG. 26 is a rear plane view (part 4) of enlarged portions of the generating block having the thermoelectric generator unit according to the invention viewed from the case back side.
Figure 27:
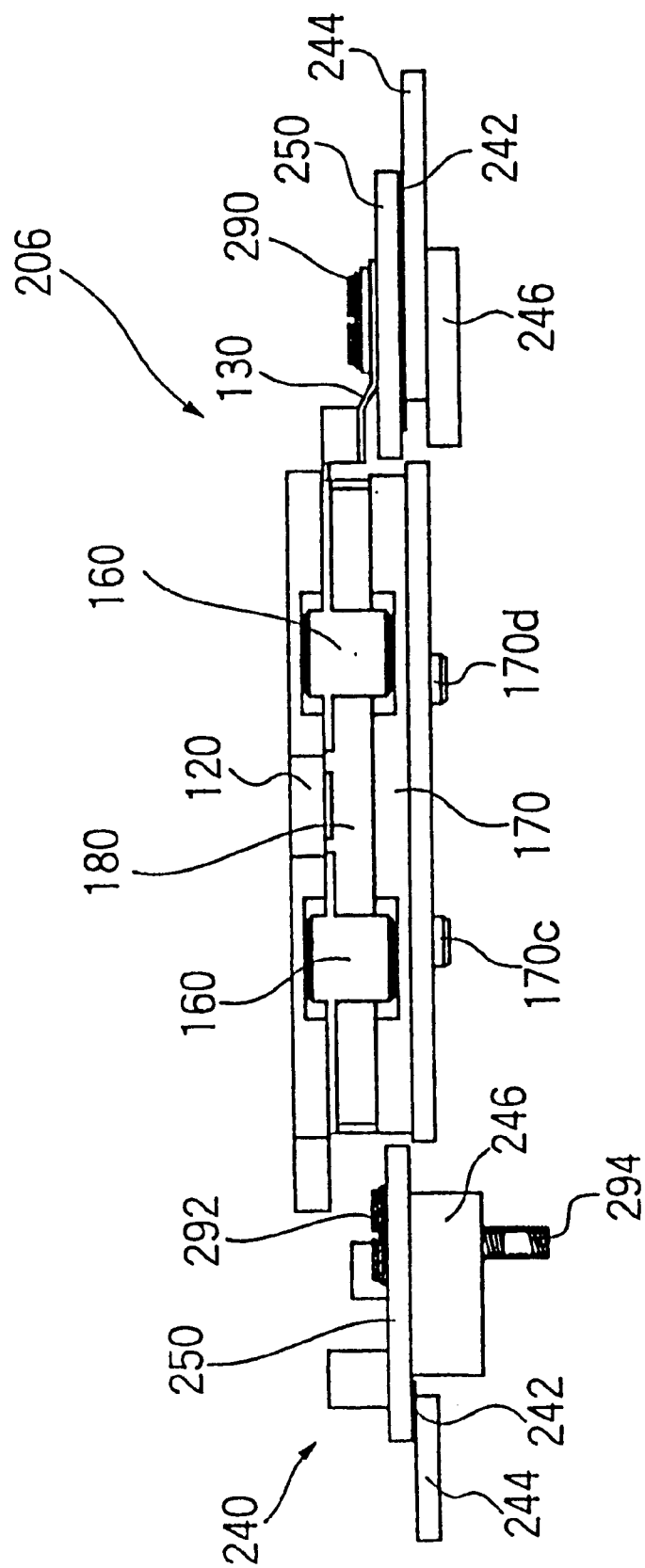
FIG. 27 is a partial sectional view (part 1) of a generating block having the thermoelectric generator unit according to the invention.
Figure 28:
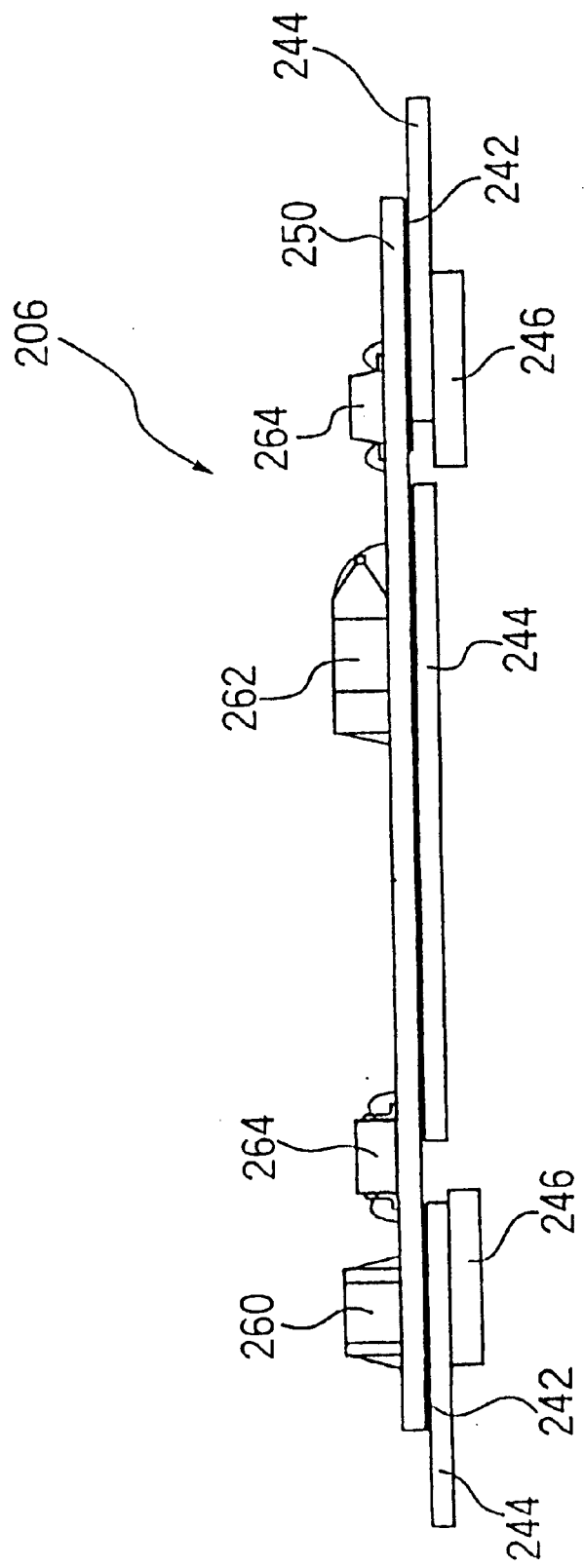
FIG. 28 is a partial sectional view (part 2) of a generating block having the thermoelectric generator unit according to the invention.

In reference to FIG. 20 and FIG. 21, a complete entity of a timepiece having the generating block with the thermoelectric generator unit according to the invention, that is, a timepiece 200 is provided with a case 202, a movement 204, a generating block 206, a dial 208, hands 210, a casing frame 212 and a crown 214.

The case 202 includes an upper case body 220, a decorative bezel 222, a lower case body 224, a case back 226 and glass 228. The upper case body 220 is fabricated by a thermally conductive material. It is preferable to fabricate the upper case body 220 by brass, stainless steel or the like. It is preferable to fabricate the decorative bezel 222 by brass or stainless steel. Although the decorative bezel 222 is attached to the upper case body 220, the decorative bezel 222 may not be provided. The lower case body is constituted by a material having excellent heat insulating performance. That is, the lower case body 224 is constituted by a thermally insulating member for thermally insulating the upper case body 220 from the case back 226. It is preferable to fabricate the lower case body 224 by plastic of U polymer, ABS resin or the like.

The case back 226 is fabricated by a thermally conductive material. It is preferable to fabricate the case back 226 by a metal of stainless steel or the like. The casing frame 212 is fabricated by, for example, plastic. The glass 228 is attached to the upper case body 220.

"Movement" signifies a mechanical entity including portions for driving a timepiece. The movement 204 is installed with a power supply, a timepiece driving circuit operated by the power source for driving a timepiece, a converter of a step motor or the like operated by a signal output from the timepiece driving circuit, a wheel train rotated based on the operation of the converter and a switch mechanism for modifying positions of the hands 210. The hands 210 are attached to the wheel train and display information in respect of time or a period of time by rotation of the wheel train. The hands 210 include, for example, a hour hand, a minute hand and a second hand.

In respect of the "movement", a side thereof having a case back 226 is referred to as "case back side" of the "movement" and a side thereof having the glass 228 is referred to as "glass side" of the "movement".

The dial 208 is disposed on the "glass side" of the movement 204. The casing frame 212 is attached from the "case back side" of the movement 204.

(3) Structure of a generating block having the thermoelectric generator unit having the thermoelectric generator unit according to the invention:

In reference to FIG. 22 through FIG. 28, the generating block 206 having the thermoelectric generator unit according to the invention, is installed with the thermoelectric generator unit 180, a step-up circuit block 240, a circuit insulated plate 242, a thermal conductive body 244 and a generator block frame 246.

Figure 29:
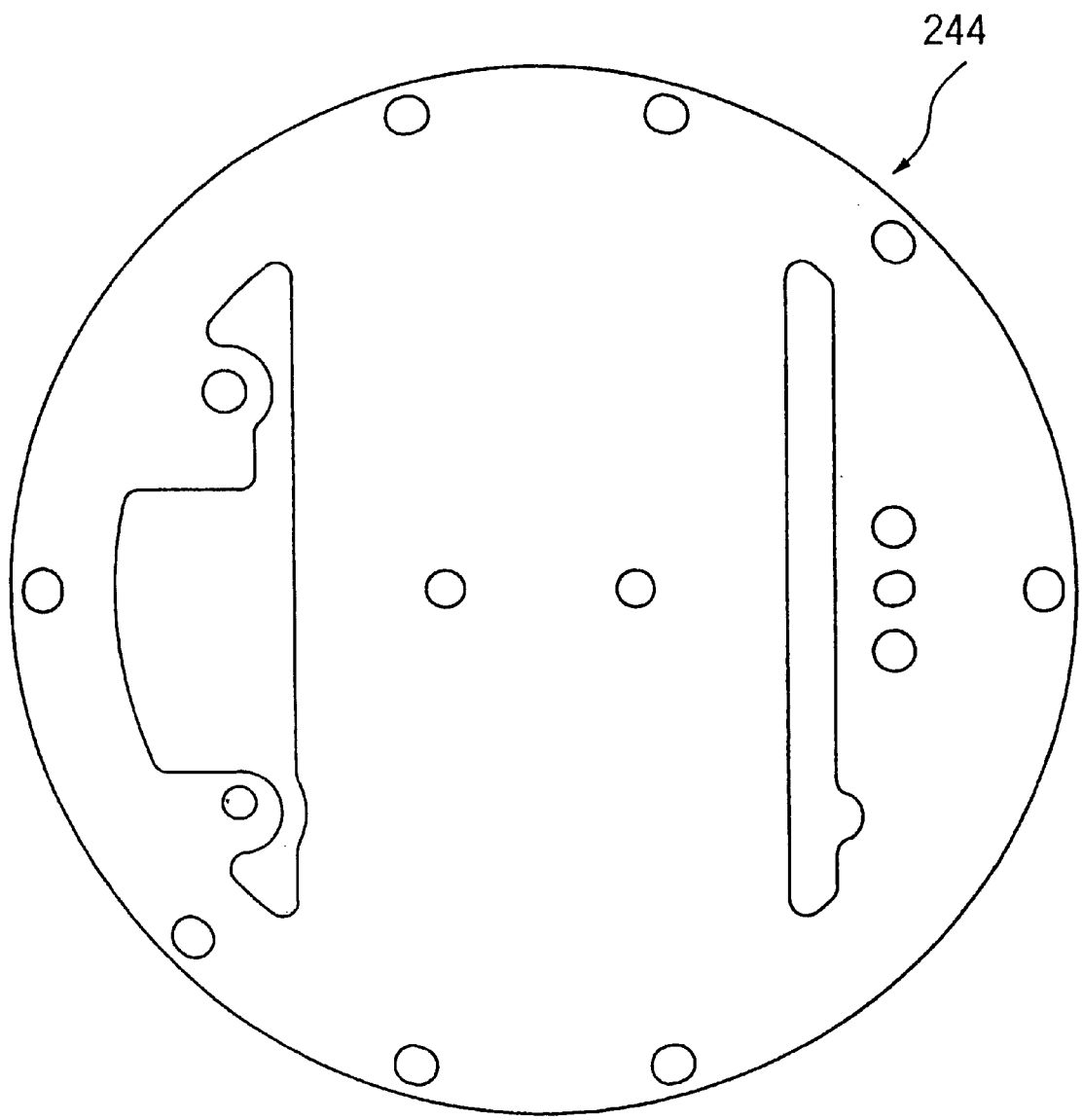
FIG. 29 is a plane view of a thermal conductive body included in the generating block having the thermoelectric generator unit according to the invention.

In reference to FIG. 29, the thermal conductive body 244 is a plate-like member having a substantially circular outer peripheral shape and is fabricated by a thermally conductive material. It is preferable to fabricate the thermal conductive body 244 by a metal of copper, brass or the like. It is preferable to fabricate the thermal conductive body 244 in a flat shape which is not subjected to a bending process. By the constitution, the thermal conductive body 244 can be fabricated by simple fabrication steps.

Figure 30:
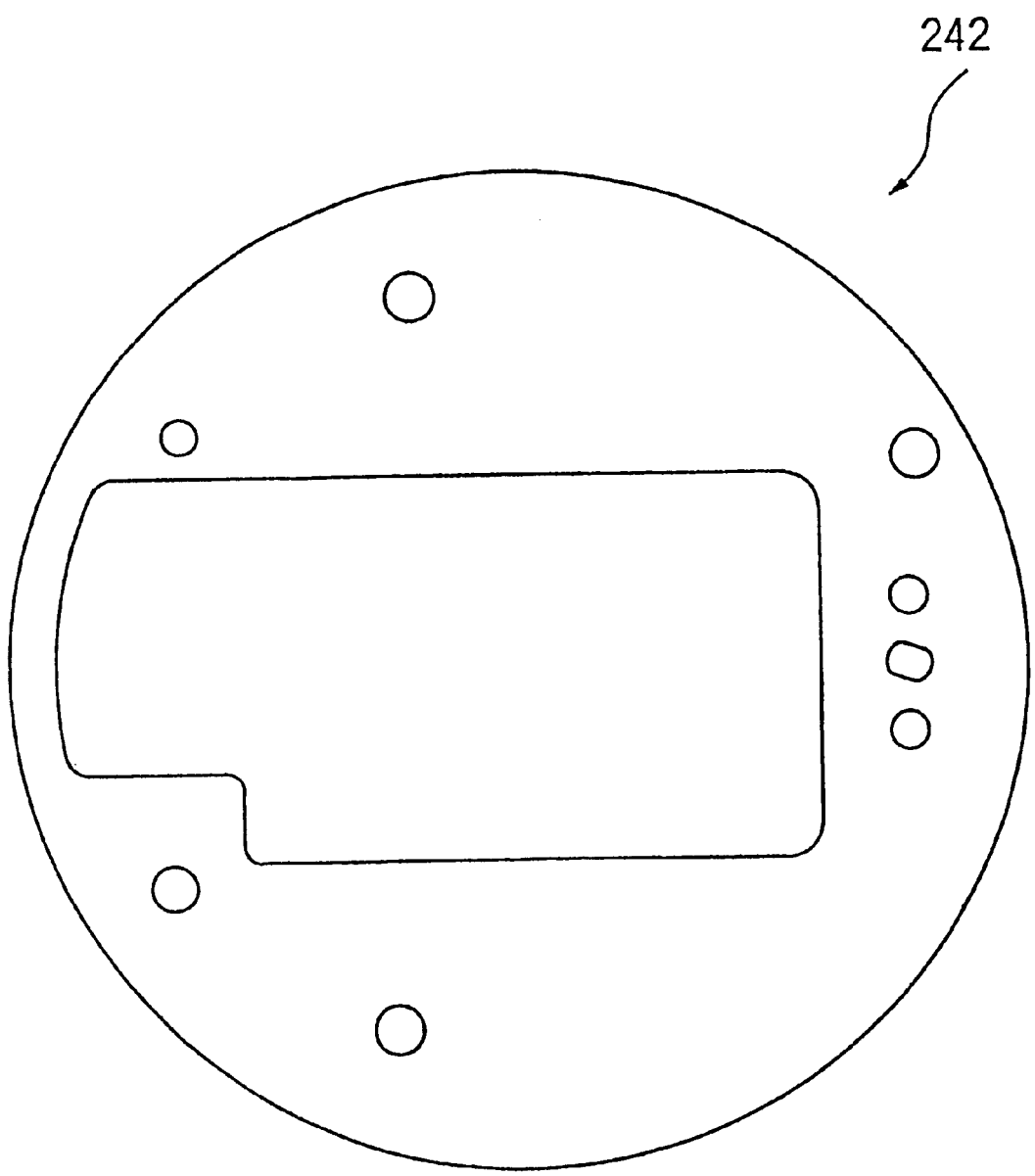
FIG. 30 is a plane view of a circuit insulated plate included in the generating block having the thermoelectric generator unit according to the invention.

In reference to FIG. 30, the circuit insulated plate 242 is a thin plate member having a substantially circular outer peripheral shape and is fabricated by an electrically insulating material. It is preferable to fabricate the circuit insulated plate 242 by plastic of polyimide, polyester or the like.

Figure 31:
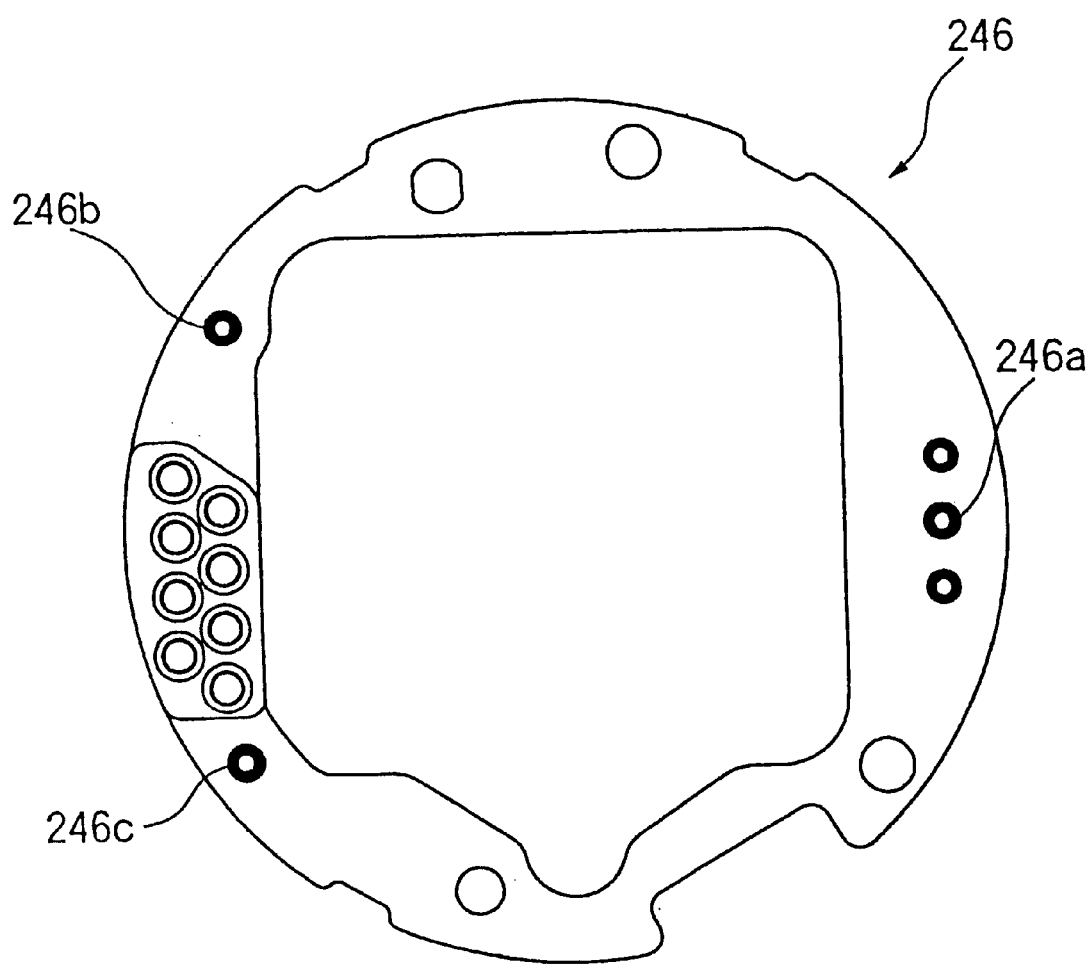
FIG. 31 is a plane view of a generating block frame included in the generating block having the thermoelectric generator unit according to the invention.

In reference to FIG. 31, the generating block frame 246 is a member having a substantially circular outer peripheral shape and is fabricated by an electrically insulating material. It is preferable to fabricate the generating block frame 246 by plastic of polycarbonate, polyacetal or the like. Three of screw pins 246a through 246c are fixed to the generating block frame 246.

Figure 32:
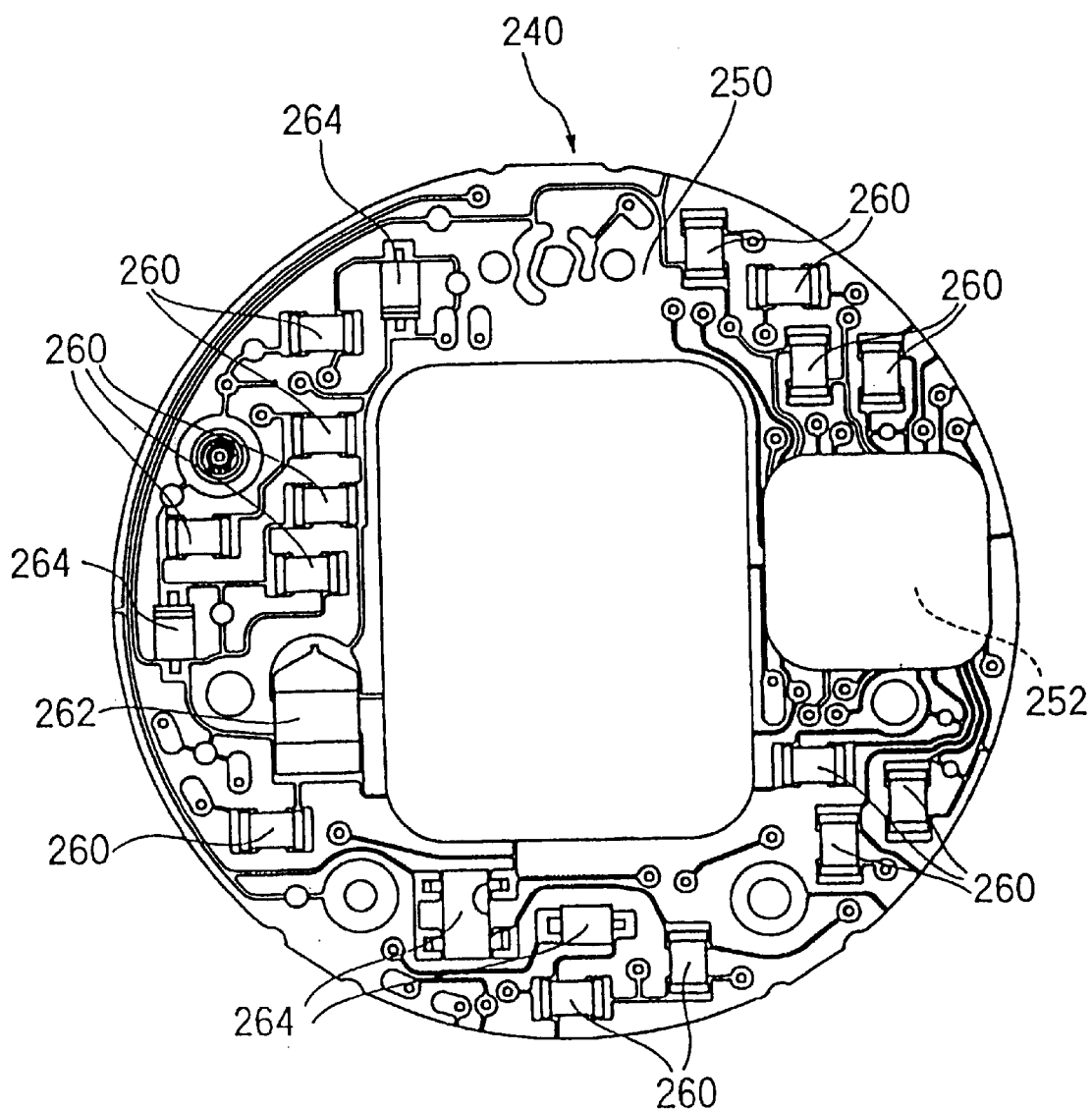
FIG. 32 is a plane view of a step-up circuit block included in the generating block having the thermoelectric generator unit according to the invention.

In reference to FIG. 32, the step-up circuit block 240 is installed with a step-up circuit substrate 250 having a substantially circular outer peripheral shape. The step-up circuit substrate 250 is constituted by a glass epoxy substrate or a polyimide substrate. The step-up circuit substrate 250 is attached with a step-up integrated circuit 252 for constituting the step-up circuit, a plurality of capacitors 260, a tantalum capacitor 262 and a plurality of diodes 264.

Further, according to the power generating block provided with a thermoelectric generator unit 206, electric elements of the step-up circuit block, that is, the step-up integrated circuit, the plurality of capacitors 260, the tantalum capacitor 262, the plurality of diodes 264, are arranged at a surrounding of the thermoelectric generator unit 180.

Further, a detailed explanation will be given later of the constitution of the step-up circuit.

In reference to FIG. 22 through FIG. 28 again, in fabricating the generating block 206, in a state in which the guide pins 170c and 170d are inserted into the thermal conductive body 244 and an outer side face of the 2nd thermally conductive plate 170 is brought into contact with the thermal conductive body 244, the thermoelectric generator unit 180 is attached to the thermal conductive body 244. By a thermoelectric generator unit lead terminal support screw 290, the output terminal patterns 130t1 and 130t2 of the lead substrate 130 of the thermoelectric generator unit are brought into contact with a pattern of the step-up circuit substrate 250 to thereby fix the lead substrate 130 to the generating block frame 246. Under the state, the step-up circuit substrate 250, the circuit insulated plate 242 and the thermal conductive body 244 are interposed between the lead substrate 130 and the generating block frame 246. As a result, the output terminal patterns 130t1 and 130t2 of the lead substrate 130 are conducted to the pattern of the step-up circuit substrate 250. Further, by 2 thermal conductive body support screws 292, the thermal conductive body 244 is fixed to the generating block frame 246.

(4) A structure of an embodiment of a timepiece having the generating block with the thermoelectric generator unit according to the invention:

In reference to FIG. 20, the movement 204 attached with the dial 208 and the hands 210 is integrated to the upper case body 220 and the casing frame 212 is integrated to the case back side of the movement 204. The generating block 206 is arranged on the case back side of the movement 204 and is fixed to the upper case body 220 by a generating block support screw 310.

A thermal conductive spacer 320 is arranged on the case back side of the thermoelectric generator unit 180. The case back 226 is fixed to the lower case body 224. Under the state, the thermal conductive spacer 320 is arranged such that one face thereof is brought into contact with the 1st thermally conductive plate 120 of the thermoelectric generator unit 180 and other face thereof is brought into contact with an inner side face of the case back 226.

Figure 33:
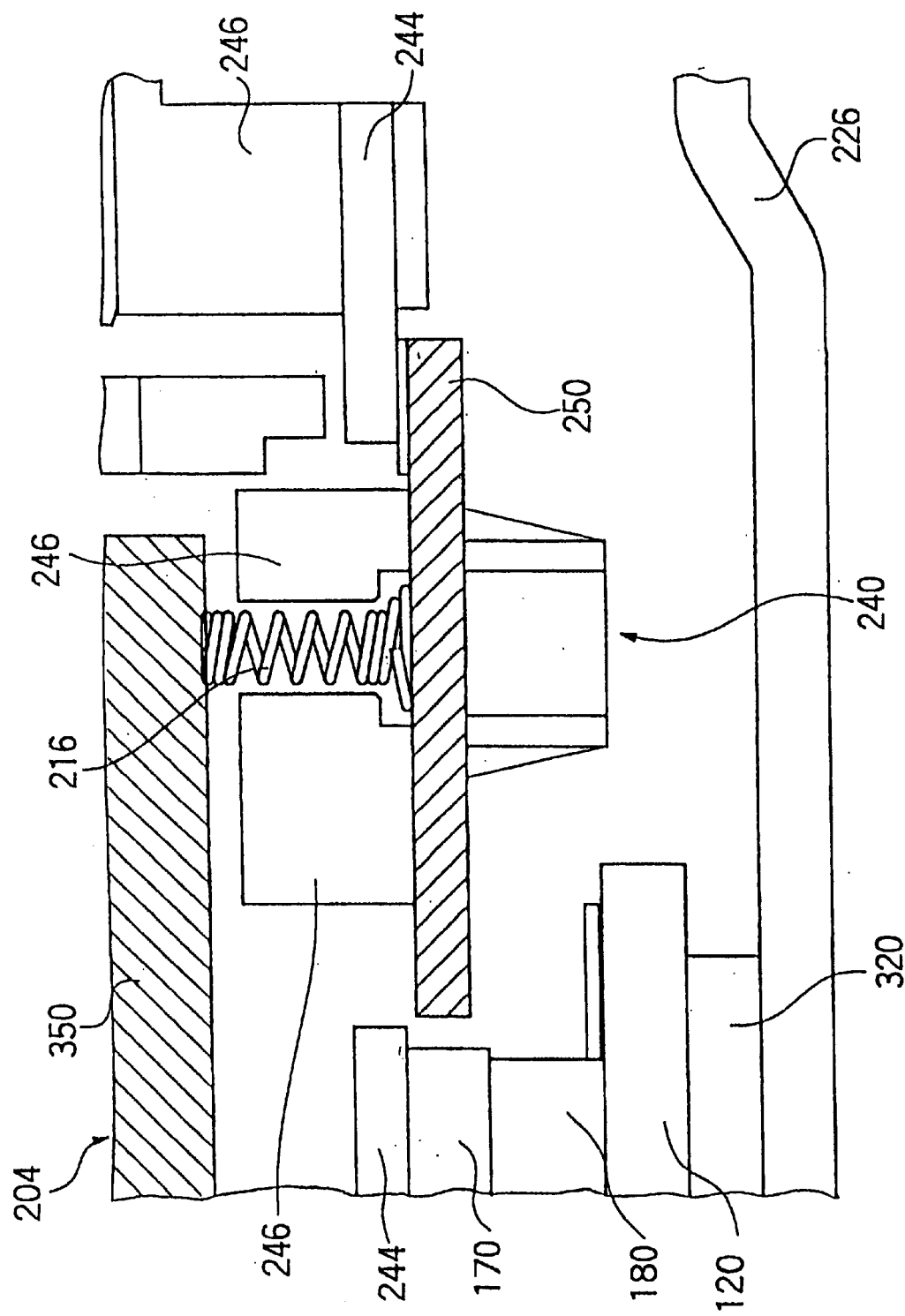
FIG. 33 is a sectional view of enlarged portions showing an electric connection portion between a circuit block of a movement and the step-up circuit block according to the timepiece having the generating block with the thermoelectric generator unit according to the invention.

In reference to FIG. 33, according to an embodiment of a timepiece having the generating block with the thermoelectric generator unit of the invention, the movement 204 includes a circuit block 350 attached with an integrated circuit for driving the timepiece for controlling operation of the timepiece. A portion of a face of the circuit block 350 on the case back side is arranged to be opposed to a portion of a face of the generating block frame 246 on the glass side.

Figure 34:
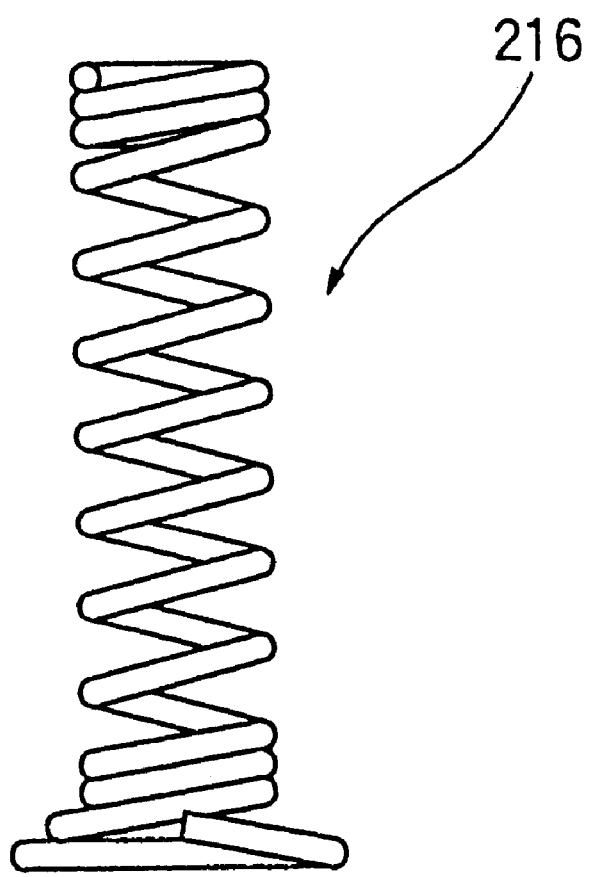
FIG. 34 is a front view of a circuit lead terminal used for electric connection between the circuit block of the movement and the step-up circuit block according to the timepiece having the generating block with the thermoelectric generator unit according to the invention.

In reference to FIG. 34, a step-up circuit lead terminal 216 is fabricated by an elastic material of spring steel or the like and is provided with a shape of a helical spring.

In reference to FIG. 33 again, one end of the step-up circuit lead terminal 216 is brought into contact with the pattern of the step-up circuit substrate 250 and the other end thereof is brought into contact with the pattern of the circuit block 350. The step-up circuit lead terminal 216 conducts the pattern of the step-up circuit substrate 250 with the pattern of the circuit block 350 in a compressed state.

Figure 35:
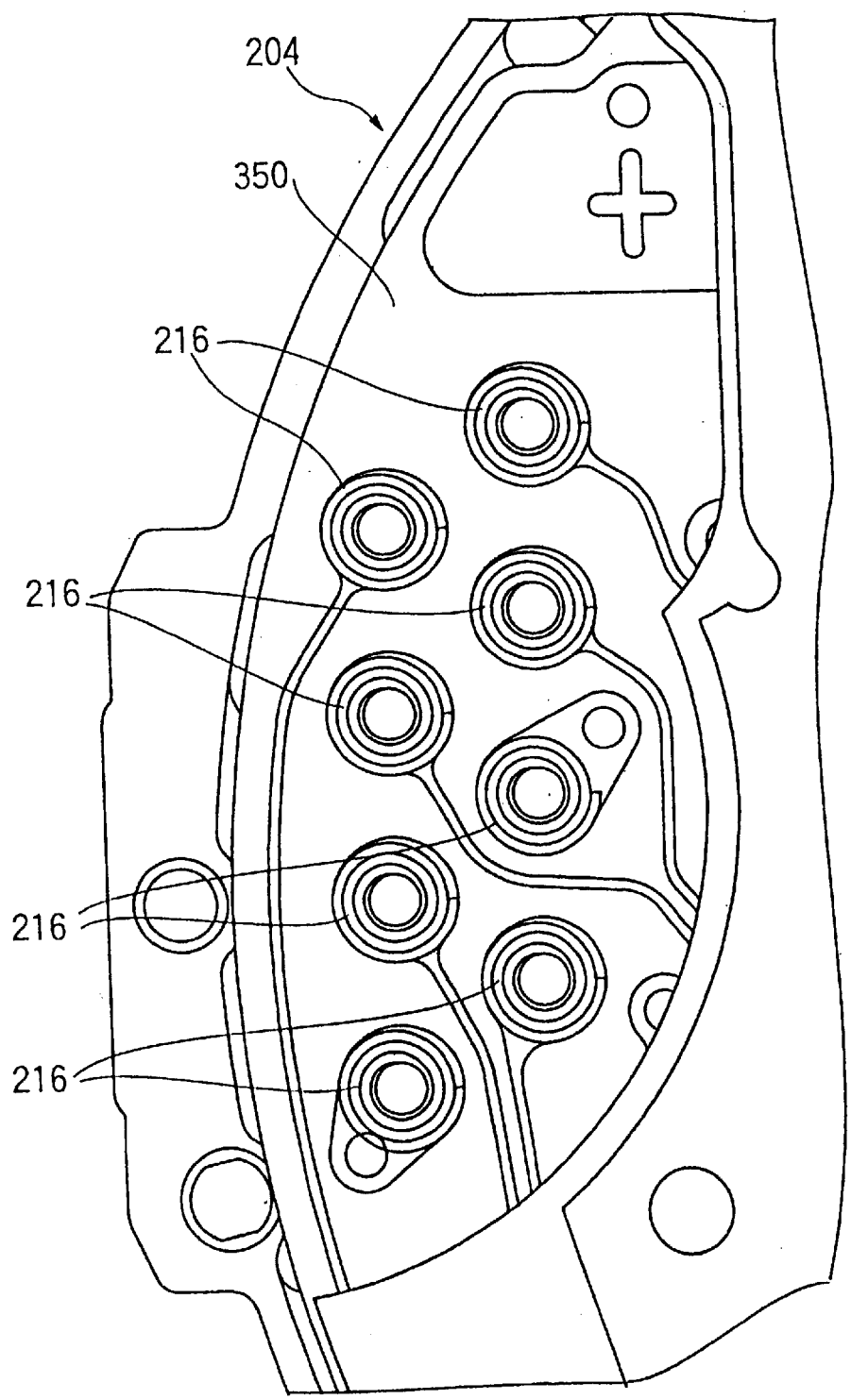
FIG. 35 is a plane view of enlarged portions of a pattern of the circuit block of the movement installed for electric connection with the step-up circuit block and the circuit lead terminals arranged to be brought into contact with the pattern according to the timepiece having the generating block with the thermoelectric generator unit according to the invention.

In reference to FIG. 35, according to an embodiment of a timepiece having the generating block with the thermoelectric generator unit of the invention, 8 of the step-up circuit lead terminals 216 are installed and the respective lead terminals conduct patterns of 8 of the step-up circuit substrates with patterns of 8 of the circuit blocks 350. According to the step-up circuit lead terminals 216, two of them are installed for transmitting clock signals for step-up circuits, one of them is installed for transmitting a charge switch signal, one of them is installed for transmitting a generation detecting signal, two of them are installed for transmitting a secondary battery voltage detecting signal, one of them is installed for a plus electrode and one of them is installed for GND (ground).

Figure 36:
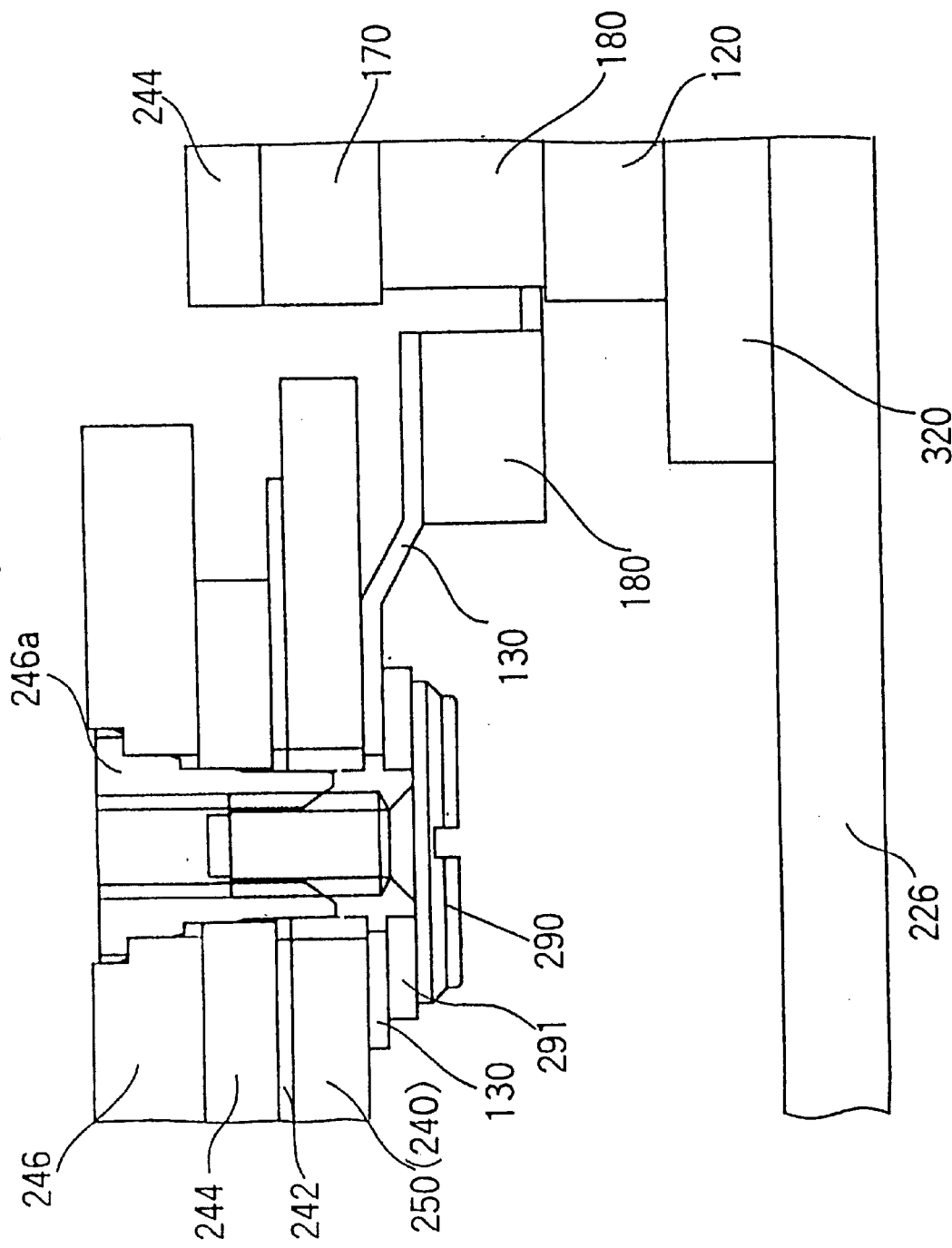
FIG. 36 is a sectional view of enlarged portions of the electric connection portion between the thermoelectric unit and the step-up circuit block according to the generating block having the thermoelectric generator unit according to the invention.

In reference to FIG. 36, under a state in which the step-up circuit substrate 250 of the step-up circuit block 240, the circuit insulated plate 242 and the thermal conductive body 244 are interposed between the lead substrate 130 and the generating block frame 246, the lead substrate 130 is fixed to the generating block frame 246. The lead substrate 130 is fixed to the generating block frame 246 by arranging a lead substrate holding plate 291 on the lead substrate 130 and fastening the thermoelectric generator unit lead terminal support screw 290 to a screw pin 246a installed in the generating block frame 246.

Figure 37:
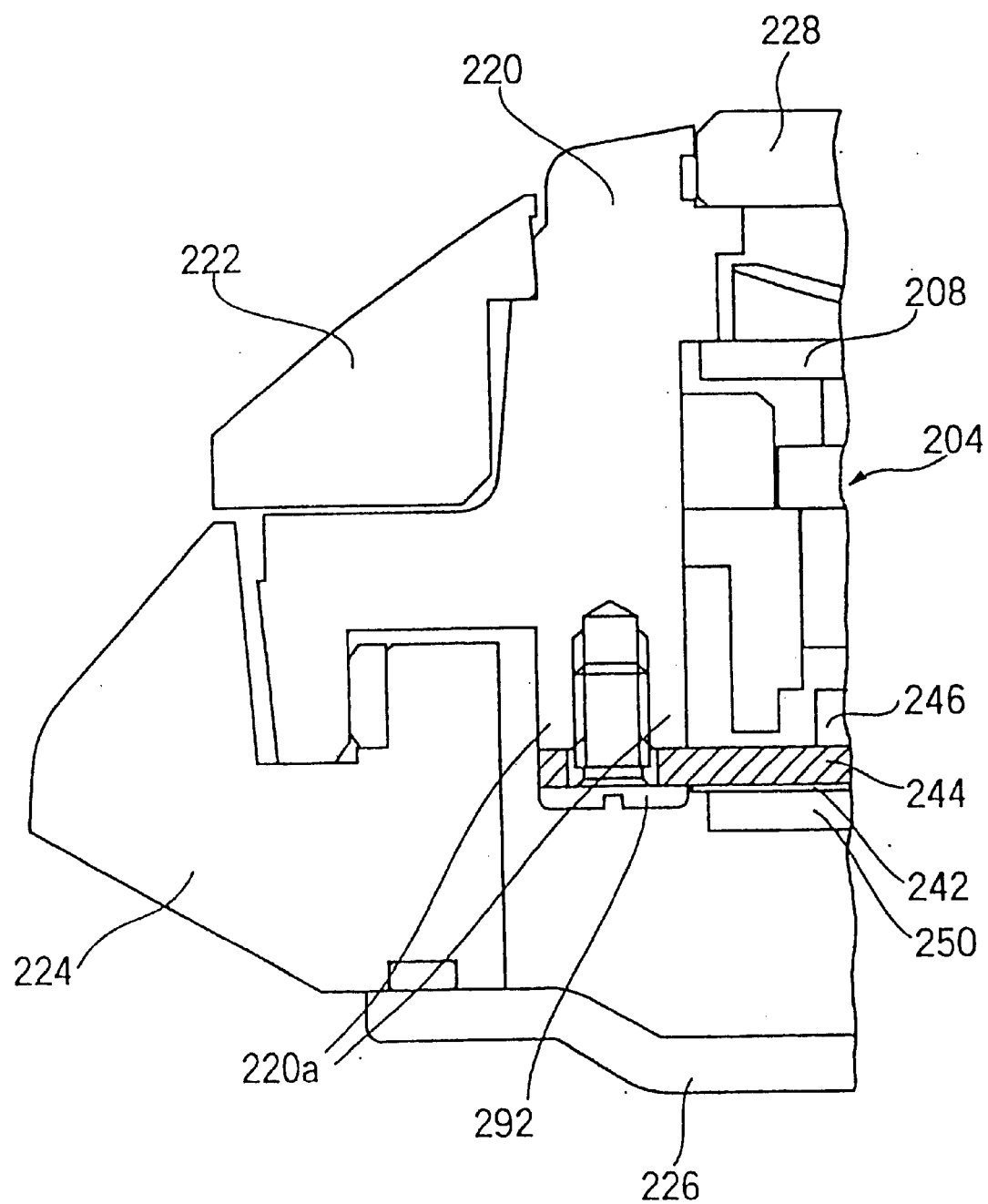
FIG. 37 is a sectional view of enlarged portions showing a portion in which the thermal conductive body is fixed to an upper case body according to the embodiment of the timepiece having the generating block with the thermoelectric generator unit according to the invention.

In reference to FIG. 37, the upper case body 220 is provided with projected portions 220a projected in a direction of the case back. The projected portions 220a are formed in a ring-like shape substantially along a circumference. That is, the projected portions 220a are arranged on the outer side of the movement substantially along the outer periphery of the movement of the timepiece.

A face of the thermal conductive body 244 on the glass side is brought into contact with the projected portions 220a of the upper case body 220. The thermal conductive body 244 is a flat member and needs not to bend in fabricating the thermal conductive body 244. The thermal conductive body 244 is fixed to the upper case body 220 by screwing to fasten the thermal conductive body support screws 292 to female screws installed in the upper case body 220. The thermal conductive body 244 is brought into contact with the upper case body 220 and accordingly, heat transferred from the thermoelectric generator unit 180 is transferred to the projected portions 220a of the upper case body 220 via the thermal conductive body 244.

According to the thermal conductive body 244 used in the timepiece having the generating block with thermoelectric generator unit of the invention, the surface area is smaller than that of a conventional thermal conductive body in which bending is carried out. As a result, by using the thermal conductive body 244, heat can be transferred extremely efficiently from the 2nd thermally conductive plate 170 to the projected portions 220a of the upper case body 220.

Figure 38:
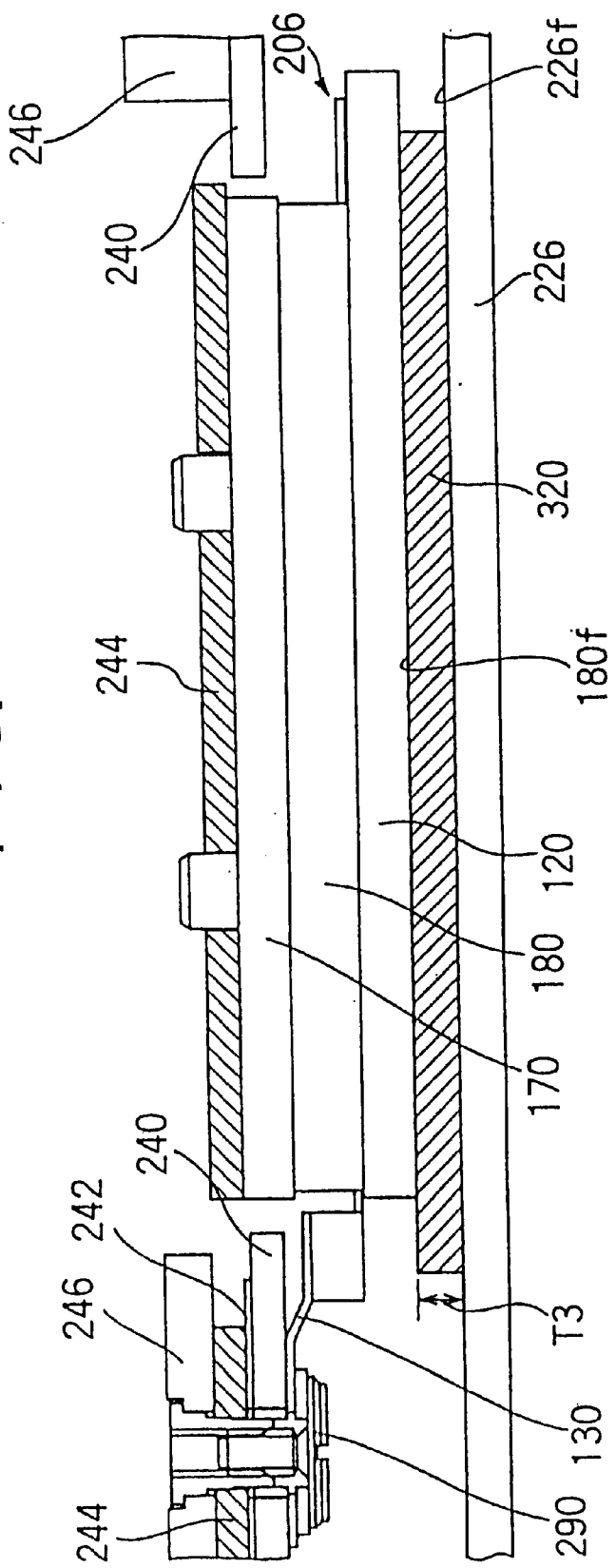
FIG. 38 is a sectional view of enlarged portions showing a case back, a thermal conductive spacer and the thermoelectric generator unit according to the embodiment of the timepiece having the generating block with the thermoelectric generator unit according to the invention.

In reference to FIG. 38, according to the thermal conductive spacer 320, one face thereof is brought into contact with the 1st thermally conductive plate 120 of the thermoelectric generator unit 180 and other face thereof is brought into contact with the inner side face of the case back 226.

Figure 39:
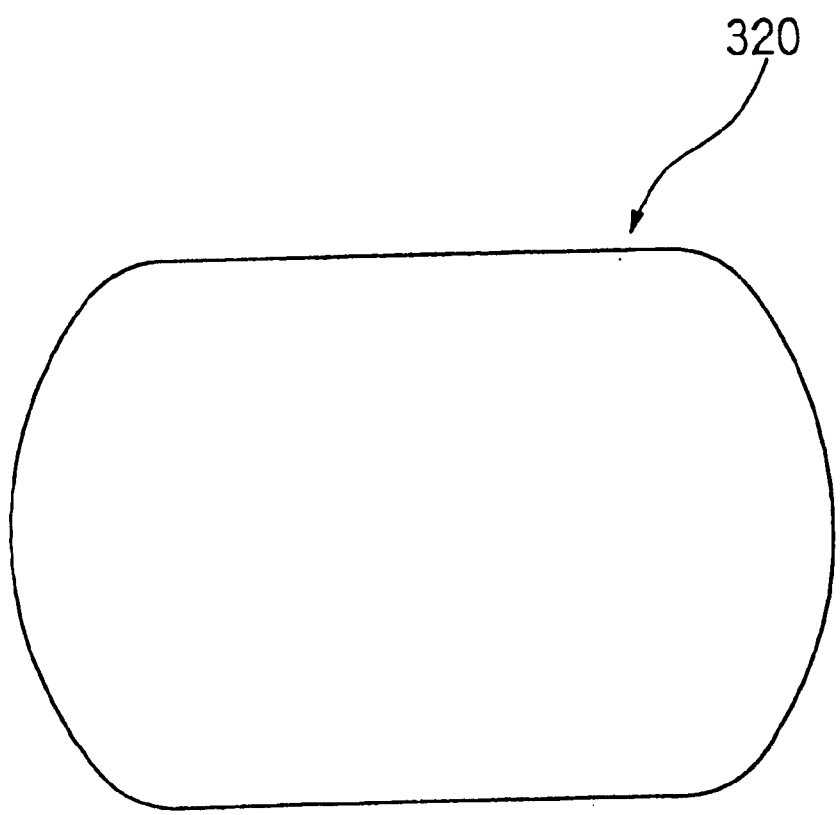
FIG. 39 is a plane view of a thermal conductive spacer used in the timepiece having the generating block with the thermoelectric generator unit according to the invention.

In reference to FIG. 39, the thermal conductive spacer 320 is constituted in a shape in which portions of a circular shape are cut to remove. The shape of the thermal conductive spacer 320 is determined to correspond to the shape of the 1st thermally conductive plate 120. The thermal conductive spacer 320 is fabricated by a thermally conductive material. It is preferable to fabricate the thermal conductive spacer 320 by a silicone rubber sheet.

Such a silicone rubber sheet can be obtained as, for example, "Heat radiating silicone rubber sheet TC-TH type" by Shinetsu Chemicals Co., Ltd., or "Gap pad" and "Soft pad" of Kitagawa Kogyo Co., Ltd. Such a silicone rubber sheet is soft, compressible and thermally conductive.

In reference to FIG. 38, when the thermoelectric generator unit 180 is attached to the timepiece, a gap T3 between a face 180f of the thermoelectric generator unit 180 on the case back side and an inner side face 226f of the case back 226 does not become a constant value owing to dispersions in dimensions of related parts. That is, the thickness of the upper case body 220, the thickness of the thermal conductive body 244, the thickness of the thermoelectric generator unit 180, the position of the inner side face 226f of the case back 226 and the thickness of the lower case body 224 are respectively provided with tolerances (dispersions in product dimensions) and accordingly, the gap T3 between the face 180f of the thermoelectric generator unit 180 on the case back side and the inner side face 226f of the case back 226 is also dispersed. Accordingly, the case back 226 cannot be fixed to the lower case body 224 such that the face 180f of the thermoelectric generator unit 180 on the case back side and the inner side face 226f of the case back 226 are brought into direct contact with each other. However, the thermal conductive spacer 320 is compressible and accordingly, when the thermal conductive spacer 320 is arranged between the face 180f of the thermoelectric generator unit 180 on the case back side and the inner side face 226f of the case back 226, by compressing the thermal conductive spacer 320, the 1st thermally conductive plate 120 of the thermoelectric generator unit 180 and the case back 226 can be brought into a thermally conductive state.

In such a structure, the thickness of the thermal conductive spacer 320 is constituted to be larger than a maximum value of the gap between the face 180f of the thermoelectric generator unit 180 on the case back side and the inner side face 226f of the case back 226 in consideration of tolerances of related parts. For example, when the thickness of the thermal conductive spacer 320 is set to 0.5 mm, the thermal conductive spacer 320 is integrated to the timepiece and the case back 226 is fixed to the lower case body 224, tolerances of relates parts can be determined such that the thickness of the thermal conductive spacer 320 becomes 0.1 mm through 0.4 mm. By such a constitution, heat can efficiently be transferred always from the case back 226 to the 1st thermally conductive plate 120 of the thermoelectric generator unit 180 via the thermal conductive spacer 320.

Figure 40:
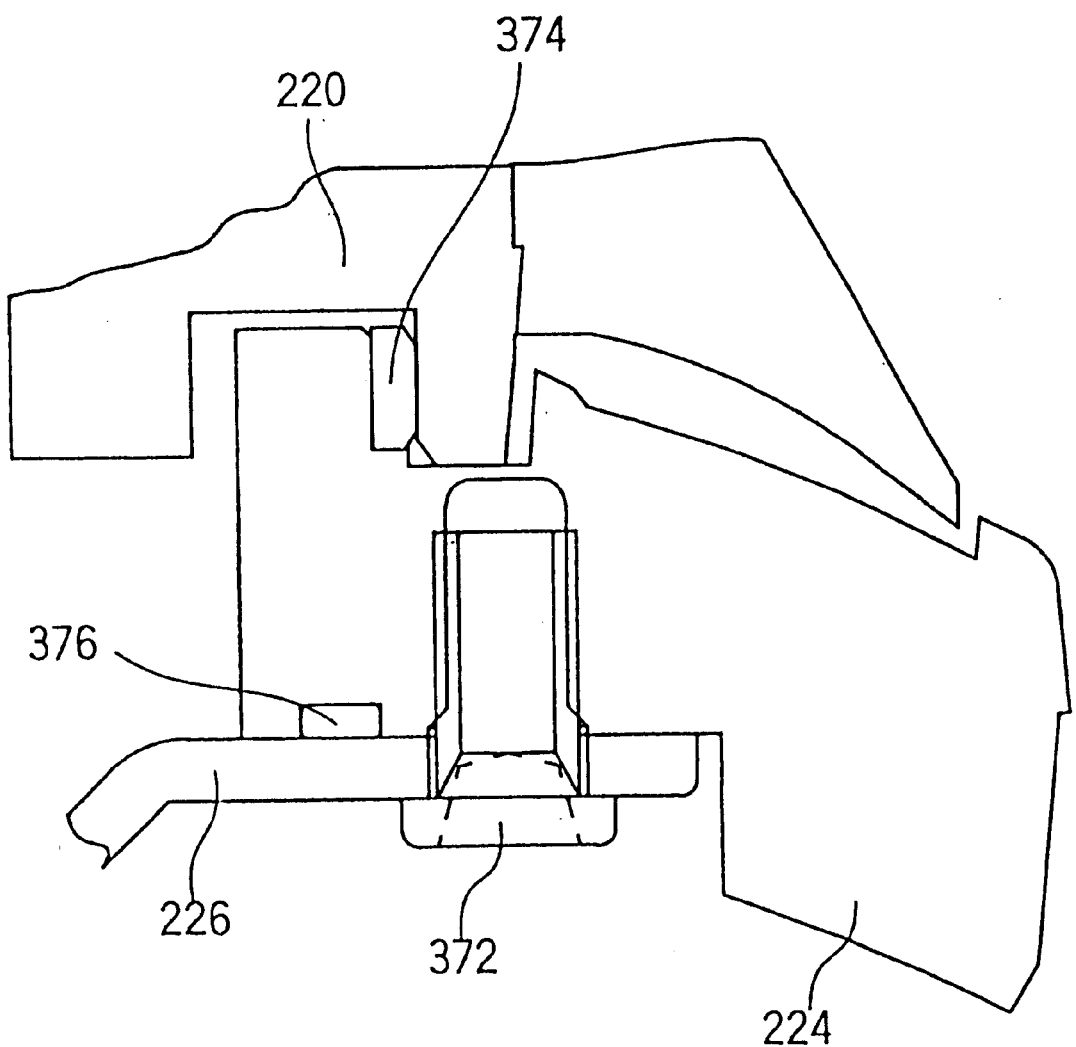
FIG. 40 is a sectional view of enlarged portions showing a portion in which the case back is fixed to the lower case body according to the embodiment of the timepiece having the thermoelectric generator unit according to the invention.

In reference to FIG. 40, by fastening to screw a case back support screw 372 to a female screw installed in the lower case body 224, the case back 226 is fixed to the lower case body 224. It is preferable to provide the case back support screws 372 by a plural number, for example, four. A packing 374 is arranged between the upper case body 220 and the lower case body 224 and a packing 376 is arranged between the case back 226 and the lower case body 224.

Figure 41:
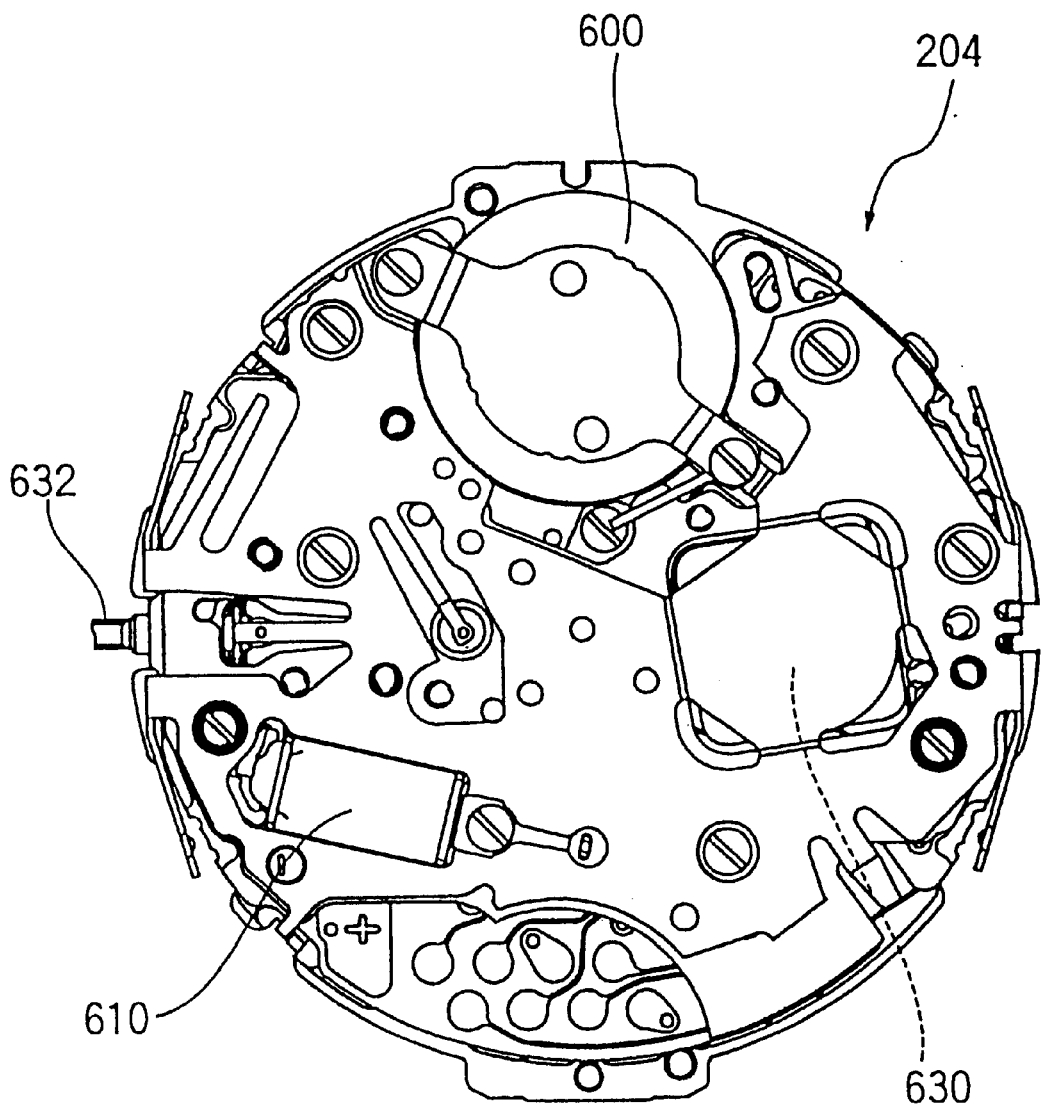
FIG. 41 is a plane view of the embodiment of the movement of the timepiece having the thermoelectric generator unit according to the invention viewed from the case back side.
Figure 42:
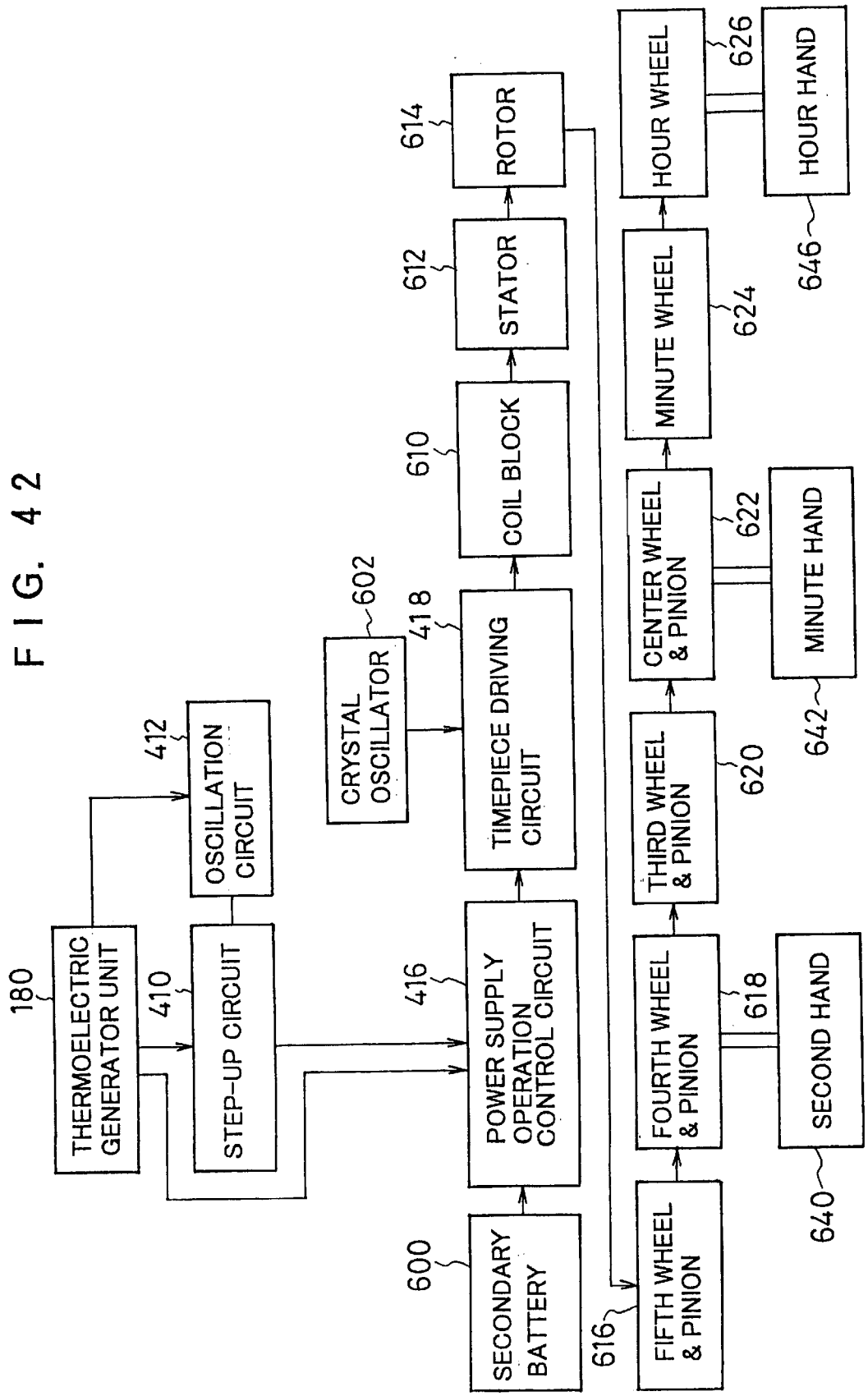
FIG. 42 is an outline block diagram showing a drive portion and a wheel train according to the embodiment of the timepiece having the thermoelectric generator unit according to the invention.

In reference to FIG. 41 and FIG. 42, power supply of the timepiece, that is, a secondary battery 600 is arranged in the movement 204. The secondary battery 600 constitutes a storage member 420 for storing electromotive force generated by the thermoelectric generator unit 180. It is preferable to constitute the secondary battery 600 by a chargeable battery such as an ion lithium secondary battery. Such a chargeable battery can be obtained as "Titanium lithium ion secondary battery MT920" (diameter 9.5 mm×thickness 2.0 mm, nominal capacity; 3.0 mAh, nominal voltage; 1.5 vol.) made by Matsushita Denchi Co., Ltd. As a modified example, in place of the secondary battery 600, a chargeable capacitor can also be utilized.

The movement 204 is installed with the circuit block 350. A timepiece driving integrated circuit 630 for controlling operation of the timepiece is attached to the circuit block 350. The timepiece driving integrated circuit 630 includes a timepiece driving circuit 418. A crystal oscillator 602 constituting an oscillation source is attached to the circuit block 350. The timepiece driving integrated circuit 630 includes a timepiece driving oscillation circuit, a timepiece driving dividing circuit and a motor driving circuit.

The movement 204 is installed with a switch mechanism including a winding stem 632, a setting lever (not illustrated), a yoke (not illustrated) and a worm wheel pair (not illustrated), a switcher including a coil block 610, a stator 612 and a rotor 614 and a wheel train including a fifth wheel & pinion 616, a fourth wheel & pinion 618, a third wheel & pinion 620, a center wheel & pinion 622, a minute wheel 624 and an hour wheel 626. A second hand 640 is attached to the fourth wheel and pinion 618. A minute hand 642 is attached to the center wheel & pinion 622. An hour hand 646 is attached to the hour wheel 626. The second hand 640, the minute hand 642 and the hour hand 646 constitute the hands 210.

In reference to FIG. 20, the crown 214 is attached to the winding stem 632.

Figure 43:
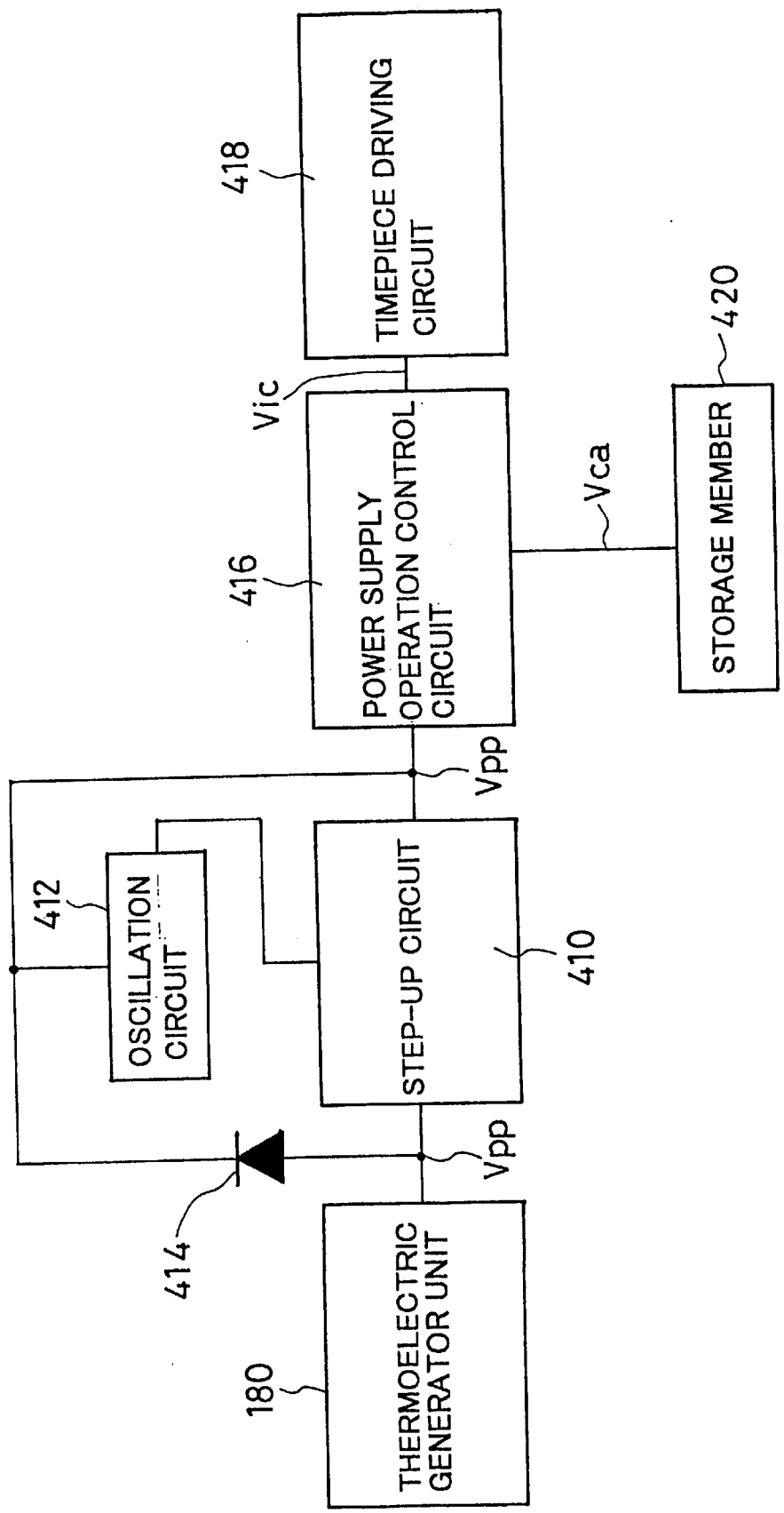
FIG. 43 is an outline block diagram showing a constitution of circuits according to the embodiment of the timepiece having the thermoelectric generator unit according to the invention.

(5) A constitution of a step-up circuit used in an embodiment of a generating block with the thermoelectric generator unit according to the invention:

In reference to FIG. 43, a step-up circuit 410 is installed for stepping up voltage generated by the thermoelectric generator unit 180. An oscillation circuit 412 is installed for driving the step-up circuit 410. A Schottky diode 414 is installed for rectifying voltage generated by the thermoelectric generator unit 180 and voltage stepped up by the step-up circuit 410. A power supply operation control circuit 416 is installed for controlling flow of power from the step-up circuit 410 to a timepiece driving circuit 418, flow of power from the step-up circuit 410 to the storage member 420 and flow of power from the storage member 420 to the timepiece driving circuit 418, corresponding to the value of voltage stepped up by the step-up circuit 410. The storage member 420 is installed for storing power stepped up by the step-up circuit 410 and supplying power to the timepiece driving circuit 418. The timepiece driving circuit 418 is constituted to operate by power stepped up by the step-up circuit 410 or power stored in the storage member 420.

An output terminal of the thermoelectric generator unit 180 is connected to a terminal for inputting start voltage of the step-up circuit 410. A p-type electrode of the Schottky diode 414 is connected to the output terminal of the thermoelectric generator unit 180. An n-type electrode of the Schottky diode 414 is connected to a terminal for oscillation circuit power supply of the oscillation circuit 412. A terminal for step-up voltage output of the step-up circuit 410 is connected to an input terminal of the power supply operation control circuit 416. A storage terminal of the power supply operation control circuit 416 is connected to an input terminal of the storage member 420. An output terminal of the power supply operation control circuit 416 is connected to a power supply terminal of the timepiece driving circuit 418.

Voltage at the output terminal of the thermoelectric generator unit 180 is designated by notation Vp. Voltage of the step-up voltage output terminal of the step-up circuit 410 is designated by notation Vpp. Voltage of the power supply terminal of the timepiece driving circuit 418 is designated by notation Vic. Voltage of the input terminal of the storage member 420 is designated by notation Vca.

Figure 44:
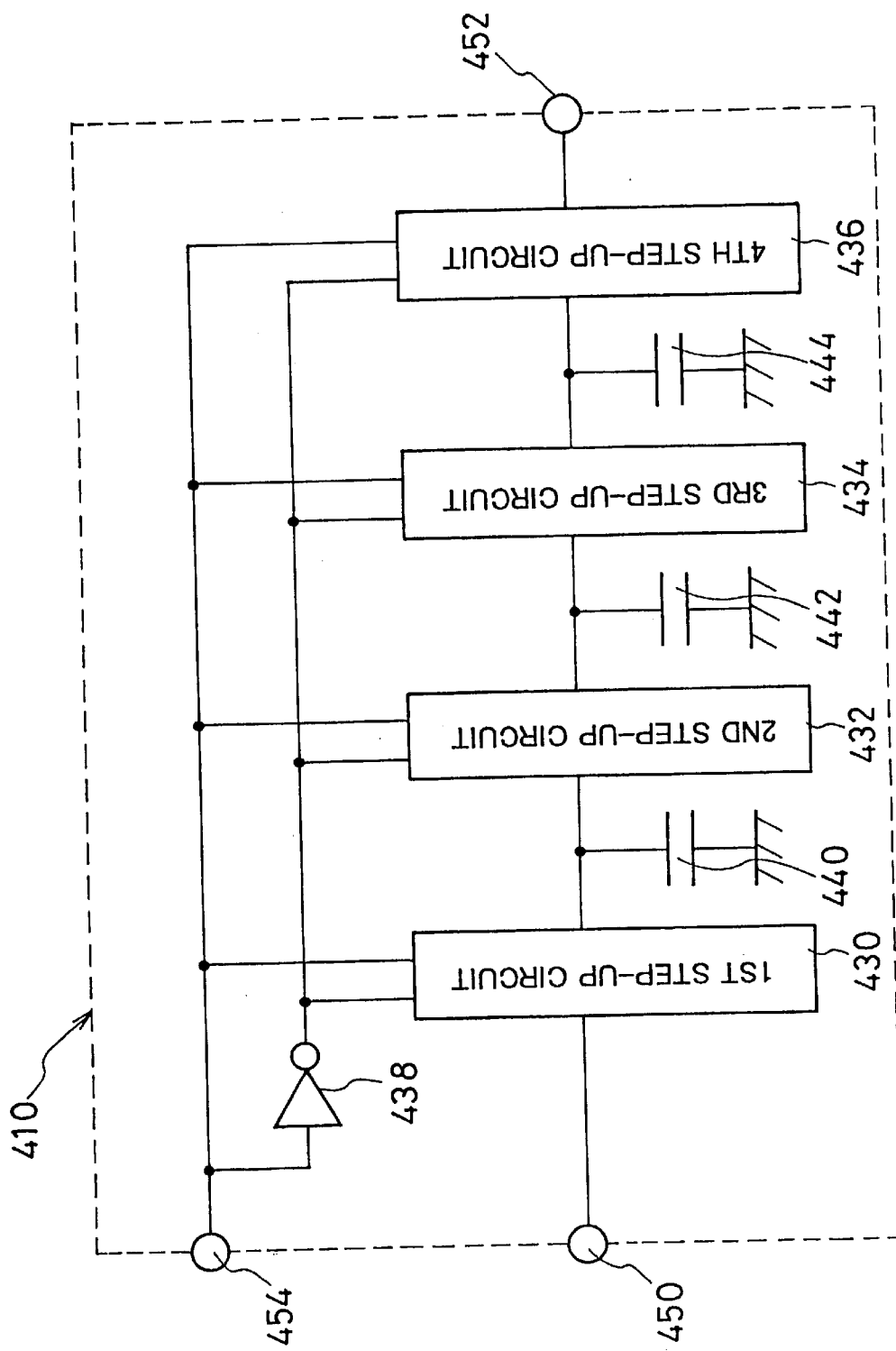
FIG. 44 is an outline block diagram showing a constitution of a step-up circuit according to the embodiment of the timepiece having the thermoelectric generator unit according to the invention.
Figure 46:
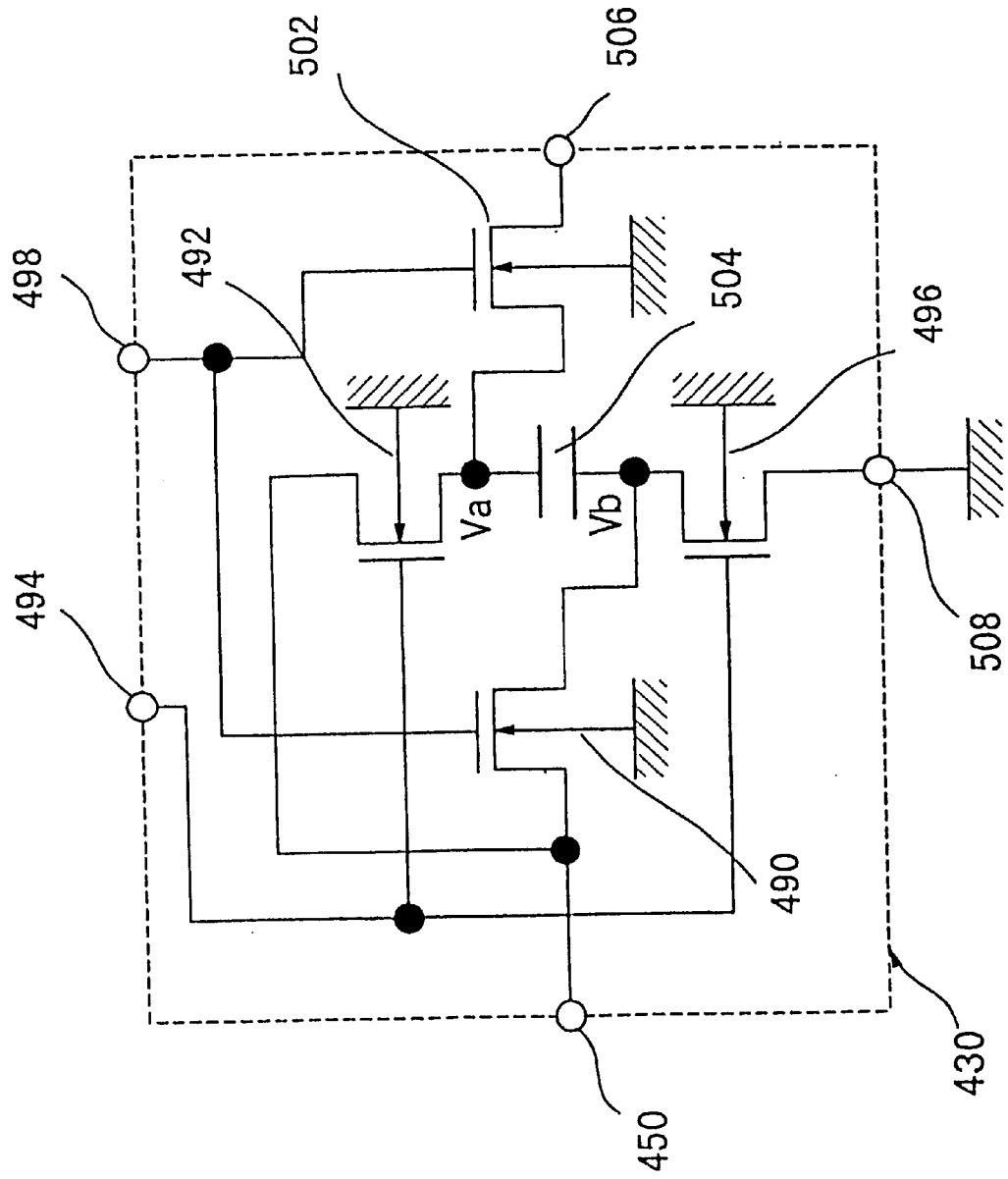
FIG. 46 is a circuit diagram showing a constitution of a 1st step-up circuit according to the embodiment of the timepiece having the thermoelectric generator unit according to the invention.
Figure 47:
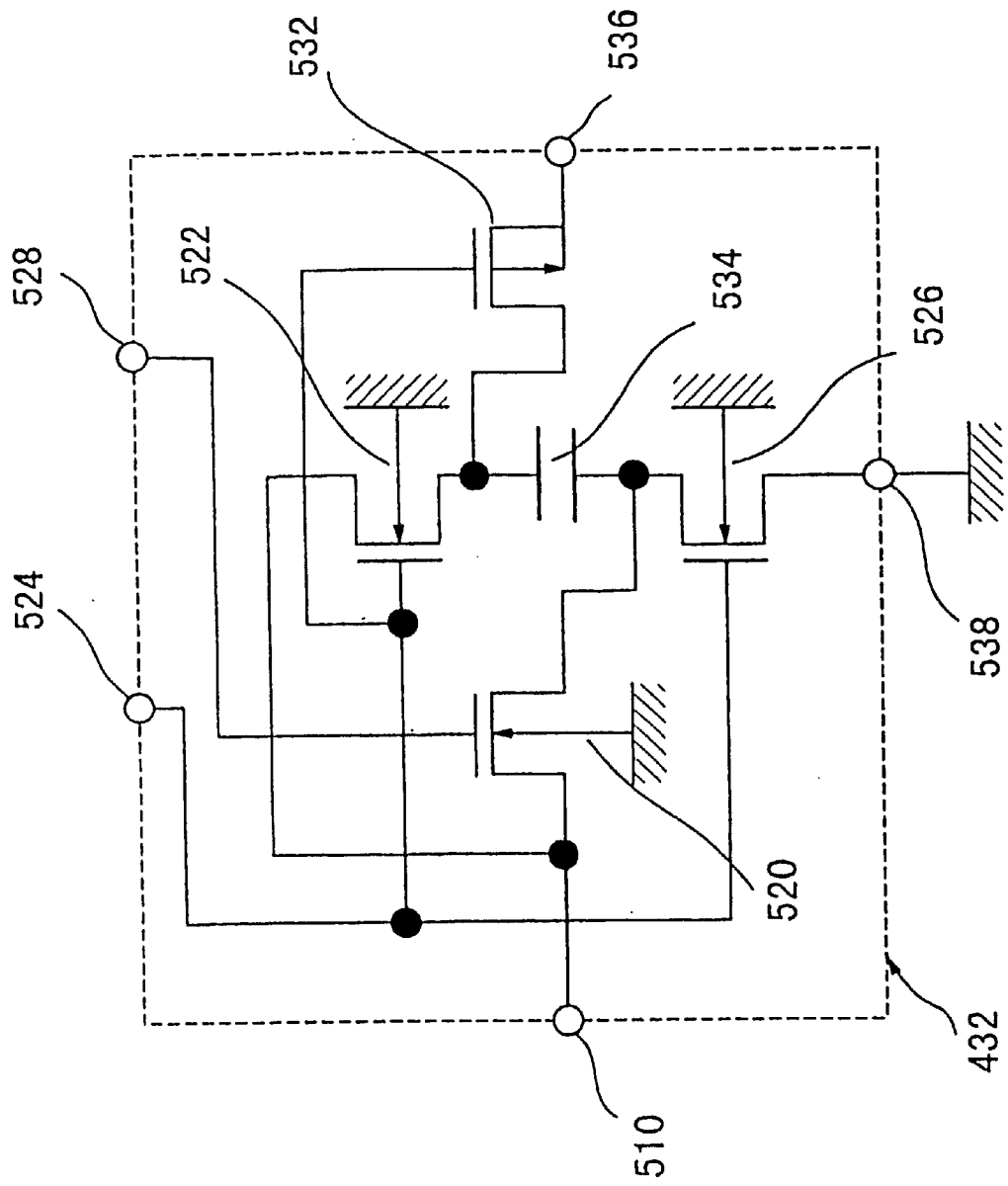
FIG. 47 is a circuit diagram showing a constitution of a 2nd step-up circuit according to the embodiment of the timepiece having the thermoelectric generator unit according to the invention.

In reference to FIG. 44, FIG. 46 and FIG. 47, according to an embodiment of a generating block with the thermoelectric generator unit of the invention, the step-up circuit 410 is constituted by a step-up circuit of "Switched capacitor system". The step-up circuit 410 includes a 1st step-up circuit 430, a 2nd step-up circuit 432, a 3rd step-up circuit 434, a 4th step-up circuit 436, an inverter circuit 438 and smoothing capacitors 440, 442 and 444.

A start voltage input terminal 450 of the step-up circuit 410 is connected to an input terminal of the 1st step-up circuit 430. An output terminal of the 1st step-up circuit 430 is connected to an input terminal of the 2nd step-up circuit 432 and also connected to one electrode of the smoothing capacitor 440. Other electrode of the smoothing capacitor 440 is connected to a GND terminal. An output terminal of the 2nd step-up circuit 432 is connected to an input terminal of the 3rd step-up circuit 434 and also connected to one electrode of the smoothing capacitor 442. Other electrode of the smoothing capacitor 442 is connected to a GND terminal. An output terminal of the 3rd step-up circuit 434 is connected to an input terminal of the 4th step-up circuit 436 and also connected to one electrode of the smoothing capacitor 444. Other electrode of the smoothing capacitor 444 is connected to a GND terminal. An output terminal of the 4th step-up circuit 436 constitutes a step-up voltage output terminal 452 of the step-up circuit 410.

A pulse signal input terminal 454 for inputting a pulse signal from the oscillation circuit 412 is connected to an input terminal of the inverter circuit 438 and also connected to a 1st pulse signal input terminal 494 of the 1st step-up circuit 430, a 1st pulse signal input terminal 524 of the 2nd step-up circuit 432, a 1st pulse signal input terminal 554 of the 3rd step-up circuit 434 and a 1st pulse signal input terminal 554 of the 4th step-up circuit 436. The output terminal of the inverter circuit 438 is connected to a 2nd pulse signal input terminal 498 of the 1st step-up circuit 430, a 2nd pulse signal input terminal 528 of the 2nd step-up circuit 432, a 2nd pulse signal input terminal 558 of the 3rd step-up circuit 434 and a 2nd pulse signal input terminal 558 of the 4th step-up circuit 436.

Next, an explanation will be given of operation of the step-up circuit 410.

The 1st step-up circuit 430, the 2nd step-up circuit 432, the 3rd step-up circuit 434 and the 4th step-up circuit 436 input the pulse signal from the oscillation circuit 412. The 1st step-up circuit 430 steps up to substantially double the voltage input from the start voltage input terminal 450. The 2nd step-up circuit 432 steps up to substantially double further voltage output from the 1st step-up circuit 430. The 3rd step-up circuit 434 steps up to substantially double further voltage output from the 2nd step-up circuit 432. The 4th step-up circuit 436 steps up to substantially double further voltage output from the 3rd step-up circuit 434. Accordingly, a total of substantially 16 times of step up of voltage is carried out by the 1st step-up circuit 430, the 2nd step-up circuit 432, the 3rd step-up circuit 434 and the 4th step-up circuit 436.

Next, an explanation will be given of the oscillation circuit 412.

Figure 45:
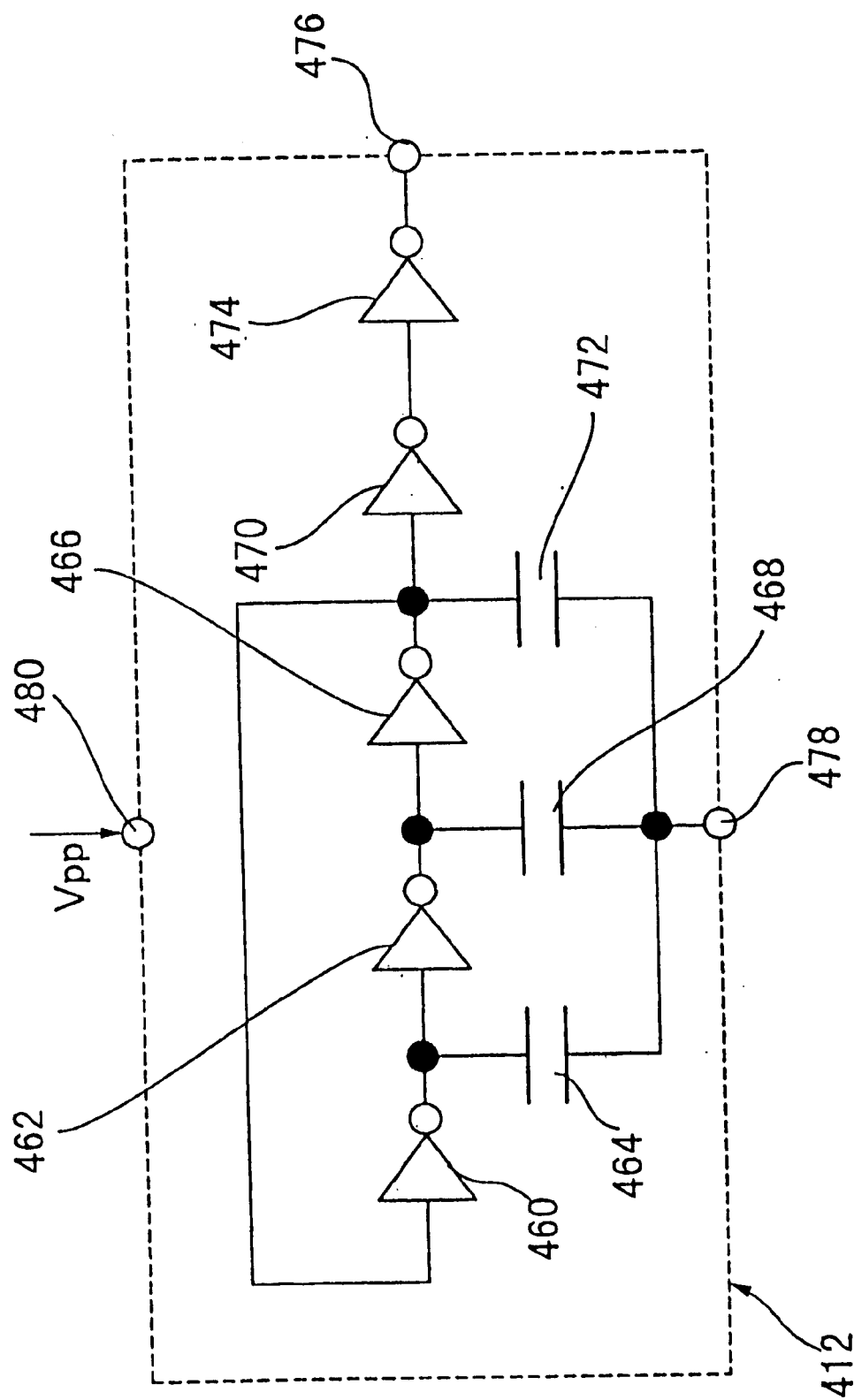
FIG. 45 is a circuit diagram showing a constitution of an oscillation circuit used in the step-up circuit according to the embodiment of the timepiece having the thermoelectric generator unit according to the invention.

In reference to FIG. 45, an output terminal of an inverter circuit 460 is connected to an input terminal of an inverter circuit 462 and connected also to a 1st electrode of a capacitor 464. An output terminal of the inverter circuit 462 is connected-to an input terminal of an inverter circuit 466 and connected to a 1st electrode of a capacitor 468. An output terminal of the inverter circuit 466 is connected to an input terminal of the inverter circuit 460, an input terminal of an inverter circuit 470 and a 1st electrode of a capacitor 472. An output terminal of the inverter circuit 470 is connected to an input terminal of an inverter circuit 474. An output terminal of the inverter circuit 474 is connected to a pulse signal output terminal 476. A pulse signal P1 is constituted to be output from the pulse signal output terminal 476. 2nd electrodes of the capacitors 464, 468 and 472 are connected to a GND terminal 478 constituting a low potential electrode of the storage member 420.

Power supply terminals of the respective inverter circuits are connected to a power supply terminal 480 of the oscillation circuit 412. Ground terminals of the respective inverter circuits are connected to the GND terminal 478. By the constitution of the circuits, a pulse signal having duty of about 50% can be obtained.

In the oscillation circuit 412, when the threshold voltage of an N-channel type transistor and a P-channel type transistor in the inverter circuit is, for example, 0.3 V, a minimum driving voltage of the oscillation circuit 412 is 0.7 V.

Next, an explanation will be given of the constitution of the 1st step-up circuit 430.

In reference to FIG. 46, the start voltage input terminal 450 of the step-up circuit 410 is connected to the drain of an N-channel type MOS transistor 490 and connected to the source of an N-channel type transistor 492. The 1st pulse signal input terminal 494 is connected to the gate of the N-channel type MOS transistor 492 and connected to the gate of an N-channel type MOS transistor 496. The second pulse signal input terminal 498 is connected to the gate of the N-channel type MOS transistor 490 and connected to the gate of an N-channel type MOS transistor 502. The source of the N-channel type MOS transistor 490 is connected to the drain of the N-channel type MOS transistor 496 and connected to a 2nd electrode of a capacitor 504. A 1st electrode of the capacitor 504 is connected to the drain of the N-channel type MOS transistor 492 and connected to the source of the N-channel type MOS transistor 502. An output terminal 506 for outputting the stepped-up voltage is connected to the drain of the N-channel type MOS transistor 502. A GND terminal 508 is connected to the source of the N-channel type MOS transistor 496. Therefore, according to the 1st step-up circuit 430, the stepped-up voltage is constituted to be output from the output terminal 506.

Next, an explanation will be given of the operation of the 1st step-up circuit 430.

First, when the 1st pulse signal input from the 1st pulse signal input terminal 494 is "HIGH", the 2nd pulse signal input from the 2nd pulse signal input terminal 498 becomes "LOW", the N-channel type MOS transistors 492 and 496 are made ON and the N-channel type MOS transistors 490 and 502 are made OFF. Voltage supplied to the start voltage input terminal 450 is supplied to the 1st electrode of the capacitor 504 via the N-channel type MOS transistor 492 and the 1st electrode of the capacitor 504 is stepped up to voltage Va. GND voltage is supplied to the 2nd electrode of the capacitor 504 via the N-channel type MOS transistor 496 and the 2nd electrode of the capacitor 504 becomes "LOW".

Next, when the 1st pulse signal input from the 1st pulse signal input terminal 494 is "LOW", the 2nd pulse signal input from the 2nd pulse signal input terminal 498 becomes "HIGH", the N-channel type MOS transistors 492 and 496 are made OFF and the N-channel type MOS transistors 490 and 502 are made ON. Voltage supplied to the start voltage input terminal 450 is supplied to the 2nd electrode of the capacitor 504 via the N-channel type MOS transistor 490 and the 2nd electrode of the capacitor 504 is stepped up to voltage Vb. The 1st electrode of the capacitor 504 is stepped up to voltage produced by adding the voltages Va and Vb. The stepped-up voltage is supplied to the output terminal 506 via the N-channel type MOS transistor 502 and voltage of the output terminal 506 is stepped up to Vc.

Values of the voltages Va, Vb and Vc have a relationship with a maximum voltage value which can be flowed between the source and the drain when the N-channel type MOS transistor is made ON. According to the N-channel type MOS transistor, when voltage applied between the source and the drain is equal to or lower than the maximum voltage value, any small voltage can be applied. However, according to the N-channel type MOS transistor, in the case in which the voltage applied between the source and the drain is higher than the maximum voltage value, even when large voltage is applied, only voltage having the maximum voltage value can be applied.

That is, when voltage supplied from the start voltage input terminal 450 is equal to or lower than the maximum voltage value of the N-channel type MOS transistor 492, voltage supplied from the start voltage input terminal 450 and Va become the same as each other. When the voltage supplied from the start voltage input terminal 450 is higher than the maximum voltage value of the N-channel type MOS transistor 492, Va becomes the maximum voltage value of the N-channel type MOS transistor 492.

Further, when the voltage supplied from the start voltage input terminal 450 is equal to or lower than the maximum voltage value of the N-channel type MOS transistor 490, the voltage supplied from the start voltage input terminal 450 and Vb become the same as each other. When the voltage supplied from the start voltage input terminal 450 is higher than the maximum voltage value of the N-channel type MOS transistor 490, Vb becomes the maximum voltage value of the N-channel type MOS transistor 490.

Further, when voltage produced by adding Va and Vb generated at the 1st electrode of the capacitor 504 is equal to or lower than the maximum voltage value of the N-channel type MOS transistor 502, Vc becomes voltage produced by adding Va and Vb. When the voltage produced by adding Va and Vb generated at the 1st electrode of the capacitor 504 is higher than the maximum voltage value of the N-channel type MOS transistor 502, Vc becomes the maximum voltage value of the N-channel type MOS transistor 502.

In this case, the "maximum voltage value" of each of the N-channel type MOS transistors mentioned above is voltage produced by subtracting the threshold voltage from voltage of "HIGH" of each pulse signal input to the gate of each of the N-channel type MOS transistors, that is, voltage applied to the N-channel type MOS transistor.

By constituting the 1st step-up circuit 430 in this way, even when input voltage to be stepped up is low, the 1st step-up circuit 430 can step up the voltage efficiently. The constitution is effective particularly when voltage of the start voltage input terminal 450 is lower than the threshold voltage of the N-channel type MOS transistor.

Although the 1st step-up circuit 430 is constituted such that simultaneously with when the MOS transistor which has been made ON is made OFF, the MOS transistor which has been made OFF is made ON, by constituting the 1st step-up circuit 430 such that the MOS transistor which has been made ON is made OFF, thereafter, the MOS transistor which has been made OFF is made ON, feedthrough current can be eliminated and the efficiency of the stepping up voltage can be promoted.

Next, an explanation will be given of the constitution of the 2nd step-up circuit 432.

In reference to FIG. 47, an input terminal 510 of the 2nd step-up circuit 432 connected to the output terminal 506 of the 1st step-up circuit 430 is connected to the drain of an N-channel type MOS transistor 520 and connected to the source of an N-channel type MOS transistor 522. The 1st pulse signal input terminal 524 is connected to the gate of the N-channel type MOS transistor 522, connected to the gate of an N-channel type MOS transistor 526 and connected to the gate of a P-channel type MOS transistor 532. The 2nd pulse signal input terminal 528 is connected to the gate of the N-channel type MOS transistor 520. The source of the N-channel type MOS transistor 520 is connected to the drain of the N-channel type MOS transistor 526 and connected to a 2nd electrode of a capacitor 534. A 1st electrode of the capacitor 534 is connected to the drain of the N-channel type MOS transistor 522 and connected to the drain of the P-channel type MOS transistor 536. An output terminal 536 for outputting stepped-up voltage is connected to the source of the P-channel type MOS transistor 532 grounded to the substrate. A GND terminal 538 is connected to the source of the N-channel type MOS transistor 526. Therefore, the 2nd step-up circuit 432 is constituted such that stepped-up voltage is output from the output terminal 536.

Next, an explanation will be given of the operation of the 2nd step-up circuit 432.

First, when the 1st pulse signal input from the 1st pulse signal input terminal 524 is "HIGH", the 2nd pulse signal input from the 2nd pulse signal input terminal 528 becomes "LOW", the N-channel type MOS transistors 522 and 526 are made ON and the N-channel type MOS transistor 520 and the P-channel type MOS transistor 532 are made OFF. Voltage supplied to the input terminal 510 is supplied to the 1st electrode of the capacitor 534 via the N-channel type MOS transistor 522 and the 1st electrode of the capacitor 534 is stepped up to voltage Va1. GND voltage is supplied to the 2nd electrode of the capacitor 534 via the N-channel type MOS transistor 526 and the 2nd electrode of the capacitor 534 becomes "LOW".

Next, when the 1st pulse signal input from the 1st pulse signal input terminal 524 is "LOW", the 2nd pulse signal input from the 2nd pulse signal input terminal 528 becomes "HIGH", the N-channel type MOS transistors 522 and 526 are made OFF and the N-channel type MOS transistor 520 and the P-channel type MOS transistor 532 are made ON. The voltage supplied to the input terminal 510 is supplied to the 2nd electrode of the capacitor 534 via the N-channel type MOS transistor 520 and the 2nd electrode of the capacitor 534 is stepped up to voltage Vb1. Therefore, the 1st electrode of the capacitor 534 is stepped up to voltage produced by adding the voltages Va1 and Vb1. The stepped-up voltage is supplied to the output terminal 536 via the P-channel type MOS transistor 532 and voltage of the output terminal 536 is stepped up to Vc1.

In this case, there are two operational modes in the P-channel type MOS transistor 532 when the voltage of the 1st electrode of the capacitor 534 is lower than a minimum voltage value capable of flowing current between the source and the drain of the P-channel type MOS transistor 532.

That is, when voltage at the 1st electrode of the capacitor 534 is less than 0.6 V (that is, voltage for flowing current in the forward direction from the drain of the P-channel type MOS transistor 532 toward the substrate), the voltage cannot be supplied to the output terminal 536. When the voltage at the 1st electrode of the capacitor 534 is equal to or higher than 0.6 V and less than the minimum voltage value capable of flowing current between the source and the drain of the P-channel type MOS transistor 532, voltage of "(voltage of 1st electrode of capacitor 534) –(0.6 V)" is supplied to the output terminal 536.

By contrast, in the case in which the voltage at the 1st electrode of the capacitor 534 is equal to or higher than the minimum voltage value capable of flowing current between the source and the drain of the P-channel type MOS transistor 532, whatever the voltage at the 1st electrode of the capacitor 534 is, the voltage can be supplied to the output terminal 536.

In this case, the "minimum voltage value capable of flowing current between the source and the drain of the P-channel type MOS transistor 532" mentioned above is a value of voltage of the gate of the P-channel type MOS transistor 532 subtracted by the threshold voltage of the P-channel type MOS transistor 532. Therefore, the "minimum voltage value" of the P-channel type MOS transistor 532 shown by FIG. 47 is a value produced by subtracting the threshold value from the "LOW" voltage value of the gate of the P-channel type MOS transistor 532, that is, a value produced by subtracting the threshold voltage from GND potential. As a result, the "minimum voltage value" of the P-channel type MOS transistor 532 becomes "an absolute value of the threshold value voltage".

By constituting the 2nd step-up circuit 432 in this way, the 2nd step-up circuit 432 is featured in being capable of stepping up voltage efficiently when the voltage of the input terminal is equal to or higher than the minimum voltage value of the P-channel type MOS transistor 532.

Although the 2nd set-up circuit 432 is constituted such that simultaneously with when the MOS transistor which has been made ON is made OFF, the MOS transistor which has been made OFF is made ON, by constituting the 2nd step-up circuit 432 such that the MOS transistor which has been made ON is made OFF, thereafter, the MOS transistor which has been made OFF is made ON, feedthrough current can be eliminated and the efficiency of the stepping up voltage can be promoted.

Next, an explanation will be given of the constitution of the 3rd step-up circuit 434.

Figure 48:
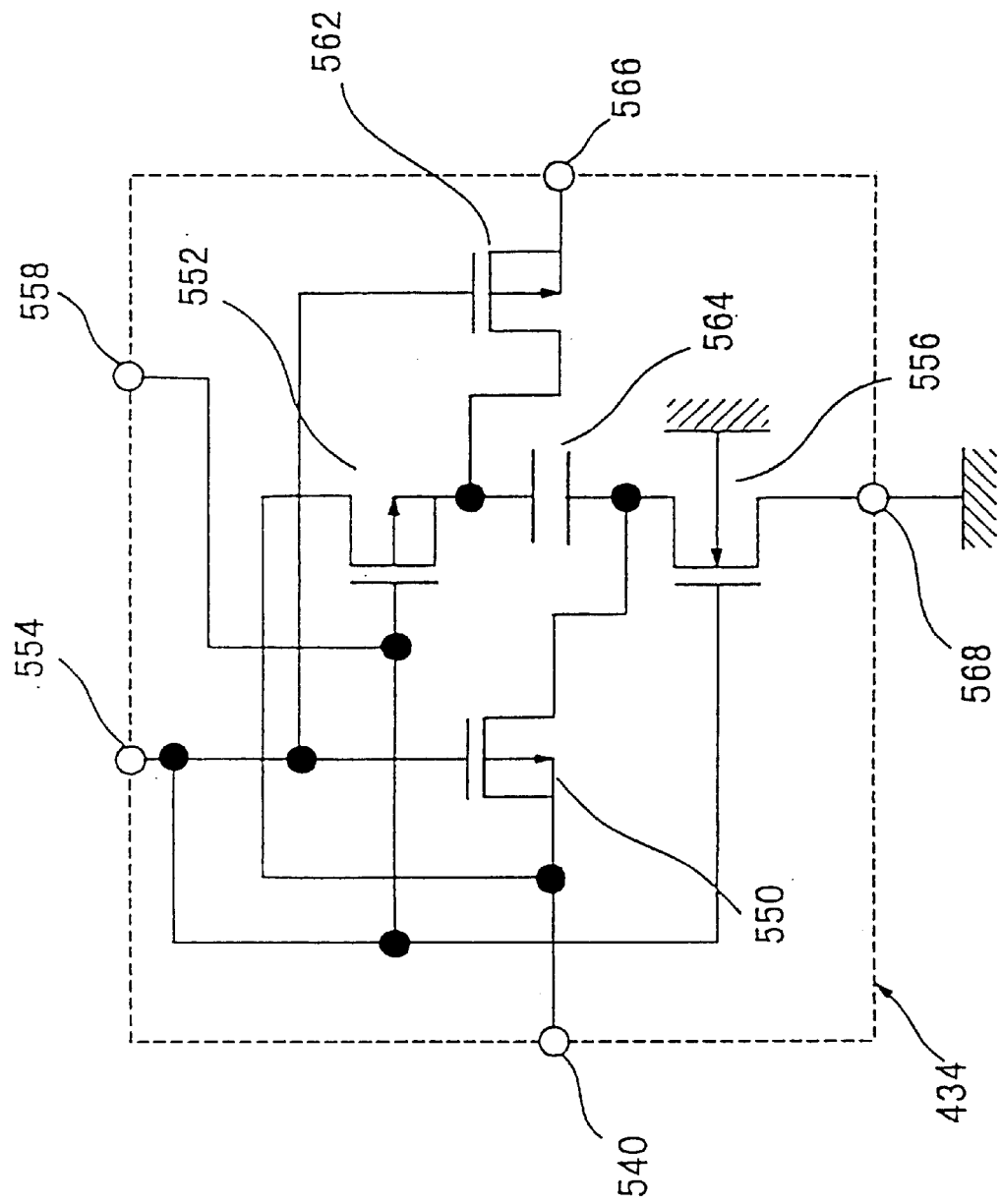
FIG. 48 is a circuit diagram showing a constitution of a 3rd step-up circuit according to the embodiment of the timepiece having the thermoelectric generator unit according to the invention.

In reference to FIG. 48, an input terminal 540 of the 3rd step-up circuit 434 connected to the output terminal 536 of the 2nd step-up circuit 432 is connected to the source of the P-channel type MOS transistor 550 grounded to the substrate and connected to the drain of a P-channel type MOS transistor 552. The 1st pulse signal input terminal 554 is connected to the gate of the P-channel type MOS transistor 550, connected to the gate of the P-channel type MOS transistor 562 and connected to the gate of an N-channel type MOS transistor 556. The 2nd pulse signal input terminal 558 is connected to the gate of the P-channel type MOS transistor 552. The drain of the P-channel type MOS transistor 550 is connected to the drain of the N-channel type MOS transistor 556 and connected to a 2nd electrode of a capacitor 564. A 1st electrode of the capacitor 564 is connected to the source of the P-channel type MOS transistor 552 grounded to the substrate and connected to the drain of the P-channel type MOS transistor 562. An output terminal 566 for outputting stepped-up voltage is connected to the source of the P-channel type MOS transistor 562 grounded to the substrate. A GND terminal 568 is connected to the source of the N-channel type MOS transistor 556. Accordingly, the 3rd step-up circuit 434 is constituted such that stepped-up voltage is output from the output terminal 566.

Next, an explanation will be given of the operation of the 3rd step-up circuit 434.

First, when the 1st pulse signal input from the 1st pulse signal input terminal 554 is "HIGH", the 2nd pulse signal input from the 2nd pulse signal input terminal 558 becomes "LOW", the N-channel type MOS transistor 556 and the P-channel type MOS transistor 552 are made ON and the P-channel type MOS transistors 550 and 562 are made OFF. Voltage supplied to the input terminal 540 is supplied to the 1st electrode of the capacitor 564 via the P-channel type MOS transistor 552 and the 1st electrode of the capacitor 564 is stepped up to voltage Va2. GND voltage is supplied to the 2nd electrode of the capacitor 564 via the N-channel type MOS transistor 556 and the 2nd electrode of the capacitor 564 becomes "LOW".

Next, when the 1st pulse signal input from the 1st pulse signal input terminal 554 is "LOW", the 2nd pulse signal input from the 2nd pulse signal input terminal 558 becomes "HIGH", the N-channel type MOS transistor 556 and the P-channel type MOS transistor 552 are made OFF and the P-channel type MOS transistors 550 and 562 are made ON. The voltage supplied to the input terminal 540 is supplied to the 2nd electrode of the capacitor 564 via the P-channel type MOS transistor 550 and the 2nd electrode of the capacitor 564 is stepped up to the voltage Vb2. Therefore, the 1st electrode of the capacitor 564 is stepped up to voltage produced by adding together the voltages Va2 and Vb2. The stepped-up voltage is supplied to the output terminal 566 via the P-channel type MOS transistor 562 and voltage of the output terminal 566 is stepped up to Vc2.

In this case, when the voltage of the 1st electrode of the capacitor 564 is lower than a minimum voltage capable of flowing current between the source and the drain of the P-channel type MOS transistor, voltage cannot be stepped up efficiently. By contrast, when the voltage at the 1st electrode of the capacitor 564 is higher than the minimum voltage capable of flowing current between the source and the drain of the P-channel type MOS transistor, whatever the voltage at the 1st electrode of the capacitor 564 is, the voltage can be supplied to the output terminal 566.

Although the 3rd step-up circuit 434 is constituted such that simultaneously with when the MOS transistor which has been made ON is made OFF, the MOS transistor which has been made OFF is made ON, by constituting the 3rd step-up circuit 434 such that the MOS transistor which has been made ON is made OFF, thereafter, the MOS transistor which has been made OFF is made ON, feedthrough current can be eliminated and the efficiency of stepping up voltage can be promoted.

Next, an explanation will be given of the constitution of the 4th step-up circuit 436.

Figure 49:
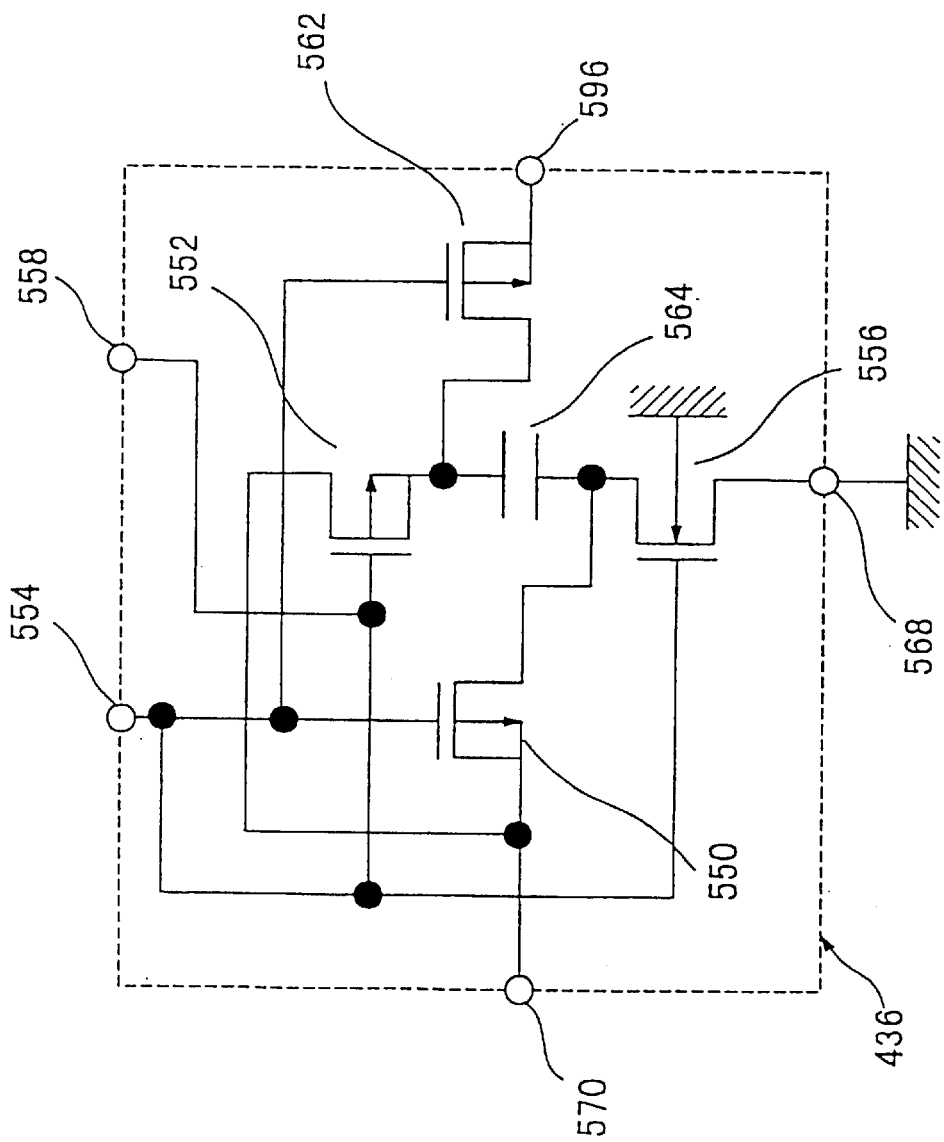
FIG. 49 is a circuit diagram showing a constitution of a 4th step-up circuit according to the embodiment of the timepiece having the thermoelectric generator unit according to the invention.

In reference to FIG. 49, an input terminal 570 of the 4th step-up circuit 436 is connected to the output terminal 566 of the 3rd step-up circuit 434. An output terminal 596 for outputting stepped-up voltage is connected to the source of a P-channel type MOS transistor 562 grounded to the substrate. Therefore, the 4th step-up circuit 436 is constituted such that the stepped-up voltage is output from the output terminal 596. The constitution of other portions of the 4th step-up circuit 436 is the same as the constitution of that of the 3rd step-up circuit 434 mentioned above. Therefore, a detailed explanation of the constitution of other portions of the 4th step-up circuit 436 will be omitted.

Next, an explanation will be given of the operation of the 4th step-up circuit 436. The operation of the 4th step-up circuit 436 is the same as the operation of the 3rd step-up circuit 434 mentioned above.

That is, first, when the 1st pulse signal input from the 1st pulse signal input terminal 554 is "HIGH", the 2nd pulse signal input from the 2nd pulse signal input terminal 558 becomes "LOW", the N-channel type MOS transistor 556 and the P-channel type MOS transistor 552 are made ON and the P-channel type MOS transistors 550 and 562 are made OFF. Voltage supplied to the input terminal 570 is supplied to the 1st electrode of the capacitor 564 via the P-channel type MOS transistor 552 and the 1st electrode of the capacitor 564 is stepped up to voltage Va3. GND voltage is supplied to the 2nd electrode of the capacitor 564 via the N-channel type MOS transistor 556 and the 2nd electrode of the capacitor 564 becomes "LOW".

Next, when the 1st pulse signal input from the 1st pulse signal input terminal 554 is "LOW", the 2nd pulse signal input from the 2nd pulse signal input terminal 558 becomes "HIGH", the N-channel type MOS transistor 556 and the P-channel type MOS transistor 552 are made OFF and the P-channel type MOS transistors 550 and 562 are made ON. The voltage supplied to the input terminal 570 is supplied to the 2nd electrode of the capacitor 564 via the P-channel type MOS transistor 550 and the 2nd electrode of the capacitor 564 is stepped up to voltage Vb3. Therefore, the 1st electrode of the capacitor 564 is stepped up to voltage produced by adding together the voltages Va3 and Vb3. The stepped-up voltage is supplied to the output terminal 596 via the P-channel type MOS transistor 562 and voltage at the output terminal 596 is stepped up to Vc3.

In this case, when the voltage at the 1st electrode of the capacitor 564 is lower than the minimum voltage capable of flowing current between the source and the drain of the P-channel type MOS transistor, voltage cannot be stepped up efficiently. By contrast, when the voltage at the 1st electrode of the capacitor 564 is higher than the minimum voltage capable of flowing current between the source and the drain of the P-channel type MOS transistor, whatever the voltage at the 1st electrode of the capacitor 564 is, the voltage can be supplied to the output terminal 596.

Although the 4th step-up circuit 436 is constituted such that simultaneously with when the MOS transistor which has been made ON is made OFF, the MOS transistor which has been made OFF is made ON, by constituting the 4th step-up circuit 436 such that MOS transistor which has been made ON is made OFF and thereafter, the MOS transistor which has been made OFF is made ON, feedthrough current can be eliminated and the efficiency of stepping up voltage can be promoted.

As has been described, the step-up circuit 410 shown by FIG. 44 is constituted by the 1st step-up circuit 430, the 2nd step-up circuit 432, the 3rd step-up circuit 434 and the 4th step-up circuit 436. According to the step-up circuit 410 constituted in this way, voltage stepped up by the 1st step-up circuit 430 is further stepped up by the 2nd step-up circuit 432. Voltage stepped up by the 2nd step-up circuit 432 is further stepped up by the 3rd step-up circuit 434. Voltage stepped up by the 3rd step-up circuit 434 is further stepped up by the 4th step-up circuit 436.

Further, according to the step-up circuit 410 constituted in this way, the N-channel type MOS transistors and the P-channel type MOS transistors are arranged at pertinent locations in accordance with the features respectively provided to them. As a result, even when the voltage at the start power terminal 450 is equal to or lower than the minimum drive voltage of the oscillation circuit 412, the voltage at the start power terminal 450 can be stepped up by the 1st step-up circuit 430 and the stepped-up voltage can further be stepped up by the 2nd step-up circuit 432, the 3rd step-up circuit 434 and the 4th step-up circuit 436.

In reference to FIG. 43 through FIG. 45 again, when the output voltage Vp from the thermoelectric generator unit 180 is changed over time from a state in which the output voltage Vp is not output (output voltage=0 V) and exceeds the minimum driving voltage of the oscillation circuit 412, the output voltage Vp from the thermoelectric generator unit 180 is input to the oscillation circuit power supply terminal 480 of the oscillation circuit 412 via the Schottky diode 414. Thereby, the oscillation circuit 412 starts operation and oscillation is started.

The oscillation circuit 412 which has started oscillation outputs the pulse signal to the pulse signal output terminal 476 and the output pulse signal is input to the pulse signal input terminal of the step-up circuit 410. The step-up circuit 410 starts stepping up the output voltage from the thermoelectric generator unit 180 by inputting the pulse signal. Under the state, the step-up voltage output terminal 452 of the step-up circuit 410 and the oscillation circuit power supply terminal 480 of the oscillation circuit 412 are connected to each other and accordingly, the stepped-up voltage constitutes power supply of the oscillation circuit 412. The Schottky diode 414 is connected between the output terminal of the thermoelectric generator unit 180 and the oscillation circuit power supply terminal 480 and accordingly, once the oscillation circuit 412 is operated and starts stepping up voltage, the oscillation circuit 412 uses voltage stepped up by the step-up circuit 410 as power supply. Accordingly, once the output voltage Vp of the thermoelectric generator unit 180 exceeds the minimum driving voltage of the oscillation circuit 412, even when the output voltage Vp from the thermoelectric generator unit 180 is changed by elapse of time and becomes lower than the minimum driving voltage of the oscillation circuit 412, the step-up circuit 410 can continue stepping up voltage.

In the constitution, voltage of the storage member 420 can also be used as oscillation start voltage of the oscillation circuit 412. In this case, the voltage of the storage member 420 is supplied to the oscillation circuit power supply terminal 480 via the power supply operation control circuit 416 to thereby start oscillation of the oscillation circuit 412. Once the oscillation circuit 412 is operated to start stepping up voltage, similar to the above-described operation, the oscillation circuit 412 uses the voltage stepped up by the step-up circuit 410 as power supply.

The power supply operation control circuit 416 inputs the stepped-up voltage Vpp and distributes power to the timepiece driving circuit 418 and the storage member 420 in accordance with a value of the stepped-up voltage Vpp.

When the stepped-up voltage Vpp is equal to voltage necessary for driving the timepiece driving circuit 418, the power supply operation control circuit 416 supplies the timepiece driving circuit 418 with the voltage stepped up by the step-up circuit 410.

When the stepped-up voltage Vpp is voltage larger than the voltage necessary for driving the timepiece driving circuit 418, the power supply operation control circuit 416 supplies the voltage stepped up by the step-up circuit 410 to both of the timepiece driving circuit 418 and the storage member 420.

When the stepped-up voltage Vpp is voltage smaller than the voltage necessary for driving the timepiece driving circuit 418, the power supply operation control circuit 416 supplies voltage from the storage member 420 to the timepiece driving circuit 418.

By constituting to operate the power supply operation control circuit 416 in this way, even when the stepped-up voltage Vpp becomes voltage smaller than the voltage capable of driving the timepiece driving circuit 418, the timepiece driving circuit 418 can continue driving by voltage from the storage member 420. Accordingly, by the constitution, the output voltage of the thermoelectric generator unit 180 can be utilized efficiently.

(6) Operation of a timepiece having the generating block with the thermoelectric generator unit according to the invention:

According to an embodiment of a timepiece having the generating block with the thermoelectric generator unit according to the invention, in reference to FIG. 42, the output voltage from the thermoelectric generator unit 180 is input to the step-up circuit 410 or the power supply operation control circuit 416. The voltage stepped up by the step-up circuit 410 is supplied to the timepiece driving circuit 418.

The timepiece driving circuit 418 includes a timepiece driving oscillation circuit, a timepiece driving dividing circuit and a motor driving circuit. The crystal oscillator 602 constitutes the oscillation source, is oscillated at, for example, 32,768 Herz and outputs a reference signal to the timepiece driving oscillation circuit. The timepiece driving dividing circuit inputs the output signal from the oscillation circuit, carries out predetermined dividing operation and outputs a signal of, for example, 1 Herz. The motor driving circuit inputs the output signal from the timepiece driving dividing circuit and outputs a drive signal for driving the step motor.

The timepiece driving circuit 418 is operated by voltage stepped up by the step-up circuit 410 or voltage of the secondary battery 600. The power supply operation control circuit 416 controls to supply voltage stepped up by the step-up circuit 410 to the timepiece driving circuit 418 and supply voltage of the secondary battery 600 to the timepiece driving circuit 418.

The coil block 610 inputs a drive signal output from the motor driving circuit for driving the step motor and magnetizes a plurality of poles of the stator 612. The rotor 614 is rotated by magnetic force of the stator 612. The rotor 614 is rotated by 180 degree per second based on a 1 Herz signal mentioned above.

The fifth wheel & pinion is rotated by rotation of the rotor 614. The fourth wheel & pinion 618 is rotated by 6 degree per second by rotation of the fifth wheel & pinion 616. The third wheel & pinion 620 is rotated by rotation of the fourth wheel & pinion 618. The center wheel & pinion 622 is rotated by rotation of the third wheel & pinion 620. The minute wheel 624 is rotated by rotation of the center wheel & pinion 622. The hour wheel 622 is rotated by rotation of the minute wheel 624.

"Second" is displayed by the second hand 640 attached to the fourth wheel & pinion 618. "Minute" is displayed by the minute hand 642 attached to the center wheel & pinion 622. "Hour" is displayed by the hour hand 646 attached to the hour wheel 626.

Figure 50:
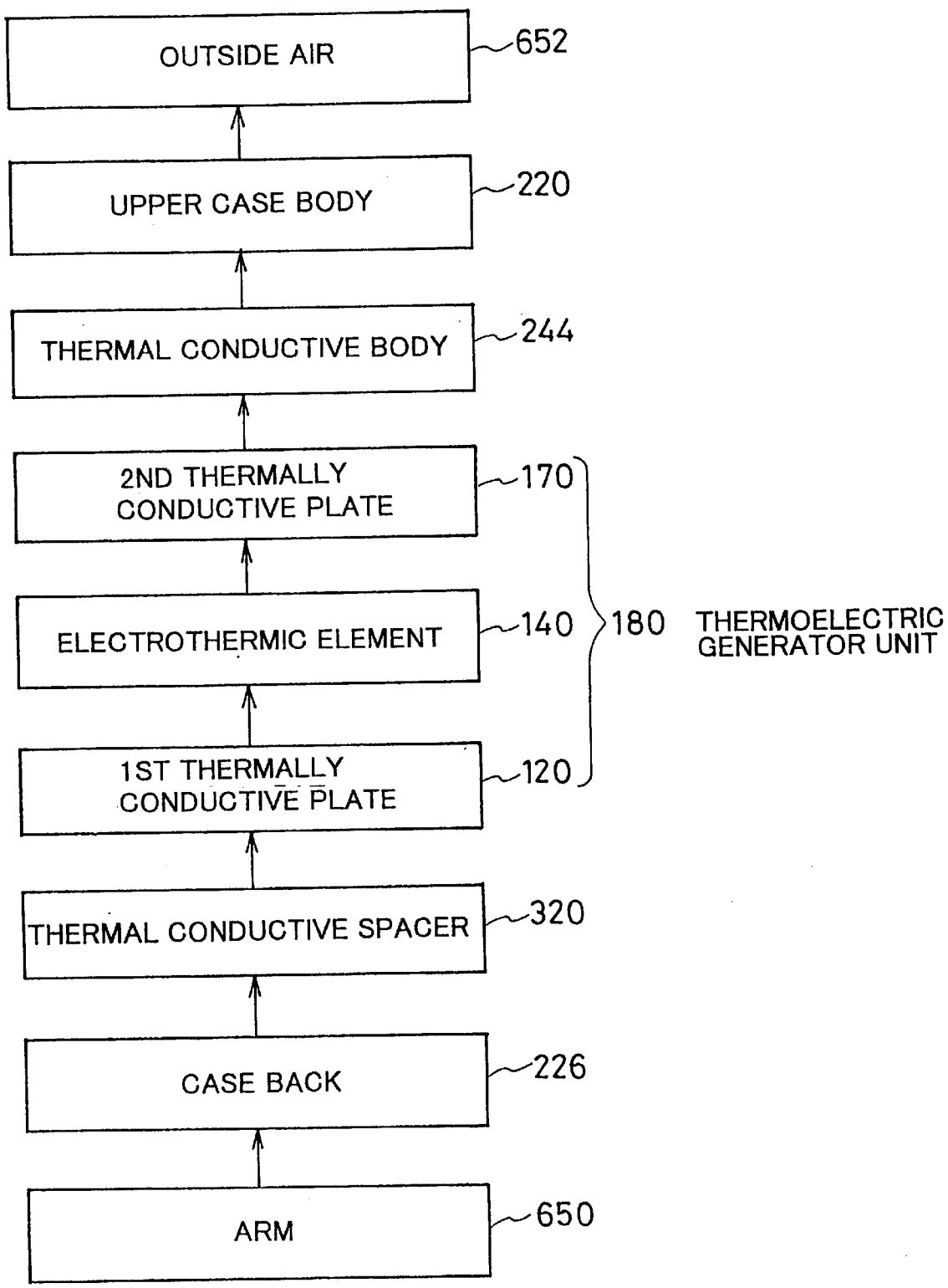
FIG. 50 is an outline block diagram showing the principle of thermoelectric generation according to the embodiment of the timepiece having the thermoelectric generator unit according to the invention.

In reference to FIG. 20 and FIG. 50, when a timepiece having the generating block with the thermoelectric generator unit according to the invention is worn by the arm, heat of the arm 650 is transferred to the case back 226. Heat of the case back 226 is transferred to the 1st thermally conductive plate 120 of the thermoelectric generator unit 180 via the thermal conductive spacer 320. That is, the 1st thermally conductive plate 120 constitutes a heat absorbing plate. The electrothermic elements 140 of the thermoelectric generator unit 180 generates electromotive force by the Seebeck effect. Therefore, the 2nd thermally conductive plate 170 of the thermoelectric generator unit 180 constitutes a heat radiating plate. Heat radiated from the 2nd thermally conductive plate 170 is transferred to the upper case body 220 via the thermal conductive body 244 and is discharged to outside air 652.

In reference to FIG. 20, the thermal conductive body 244 is brought into contact with the projected portions 220a of the upper case body 220. According to the constitution, as mentioned above, by using the flat thermal conductive body 244, heat can be transferred extremely efficiently from the 2nd thermally conductive plate 170 to the projected portions 220a of the upper case body 220. That is, by the constitution in which the flat thermal conductive body 244 is brought into contact with the projected portions 220a of the upper case body 220, thermal resistance in a heat radiating path can be reduced. Accordingly, the power generating efficiency of the thermoelectric generator unit can be promoted by the constitution.

According to an embodiment of a timepiece having the generating block with the thermoelectric generator unit of the invention, the electrothermic element 140 is constituted to connect in series, for example, 10 pairs of modules including 50 pairs of PN junctions and the threshold voltage of the transistors included in the oscillation circuit 412 and the step-up circuit 410 is constituted to be 0.3.

According to an embodiment of a timepiece having the generating unit with the thermoelectric generator unit for the invention, a power generation amount of one piece of an electrothermic material element constituting the thermoelectric generator unit 140 is, for example, about 200 $\mu V/^\circ$ C. Accordingly, when the operation voltage of the timepiece is set to 1.5 V, in order to drive the timepiece directly by the thermoelectric generator unit, when a difference between temperatures of the 1st thermally conductive plate 120 and the 2nd thermally conductive plate 170 is 2° C., there is needed the electrothermic element 140 having 18125 pairs of PN junctions.

However, the embodiment of the timepiece having the generating unit with the thermoelectric generator unit of the invention is constituted to include the step-up circuit 410, the oscillation circuit 412 and the power supply operation control circuit 416 described above and accordingly, in the case in which power generating voltage immediately after the timepiece is worn by the arm exceeds the minimum drive voltage of the oscillation circuit 412, even when power generating voltage in a later steady state becomes voltage lower than the minimum drive voltage of the oscillation circuit 412, voltage can be stepped up by the step-up circuit 410.

For example, according to an experiment in respect of an embodiment of a timepiece having the generating unit with the thermoelectric generator unit of the invention, the power generating voltage immediately after the timepiece was worn by the arm was 2 V and the power generating voltage in a later steady state was 0.5 V. According to the embodiment of the timepiece having the thermoelectric generator unit of the invention, when the threshold voltage of the transistors included in the oscillation circuit 412 was about 0.3 V, the minimum drive voltage of the oscillation circuit 412 was about 0.7 V.

For example, according to the timepiece having the generating unit with the thermoelectric generator unit of the invention, as mentioned above, the power supply operation control circuit 416 inputs the stepped-up voltage Vpp and distributes power to the timepiece driving circuit 418 and the storage member 420 in accordance with a value of the stepped-up voltage Vpp.

When the stepped-up voltage Vpp falls in a range of voltage of 1.2 V through 1.5 V necessary for driving the timepiece driving circuit 418, the power supply operation control circuit 416 supplies the timepiece driving circuit 418 with voltage stepped up by the step-up circuit 410.

When the stepped-up voltage Vpp is voltage larger than voltage 1.5 V necessary for driving the timepiece driving circuit 418, the power supply operation control circuit 416 supplies voltage stepped-up by the step-up circuit 410 to both of the timepiece driving circuit 418 and the storage member 420.

When the stepped-up voltage Vpp is voltage smaller than voltage 1.2 V necessary for driving the timepiece driving circuit 418, the power supply operation control circuit 416 supplies voltage from the secondary battery 600 to the timepiece driving circuit 418.

By constituting the power supply operation control circuit 416 in this way, even when the stepped-up voltage Vpp becomes voltage smaller than voltage capable of driving the timepiece driving circuit 418, the timepiece driving circuit 418 can be continued to be driven by voltage from the secondary battery 600. Accordingly, by the constitution, even when the stepped-up voltage becomes smaller than voltage 1.2 V necessary for driving the timepiece driving circuit 418, the timepiece can be continued to be driven.

Figure 51:
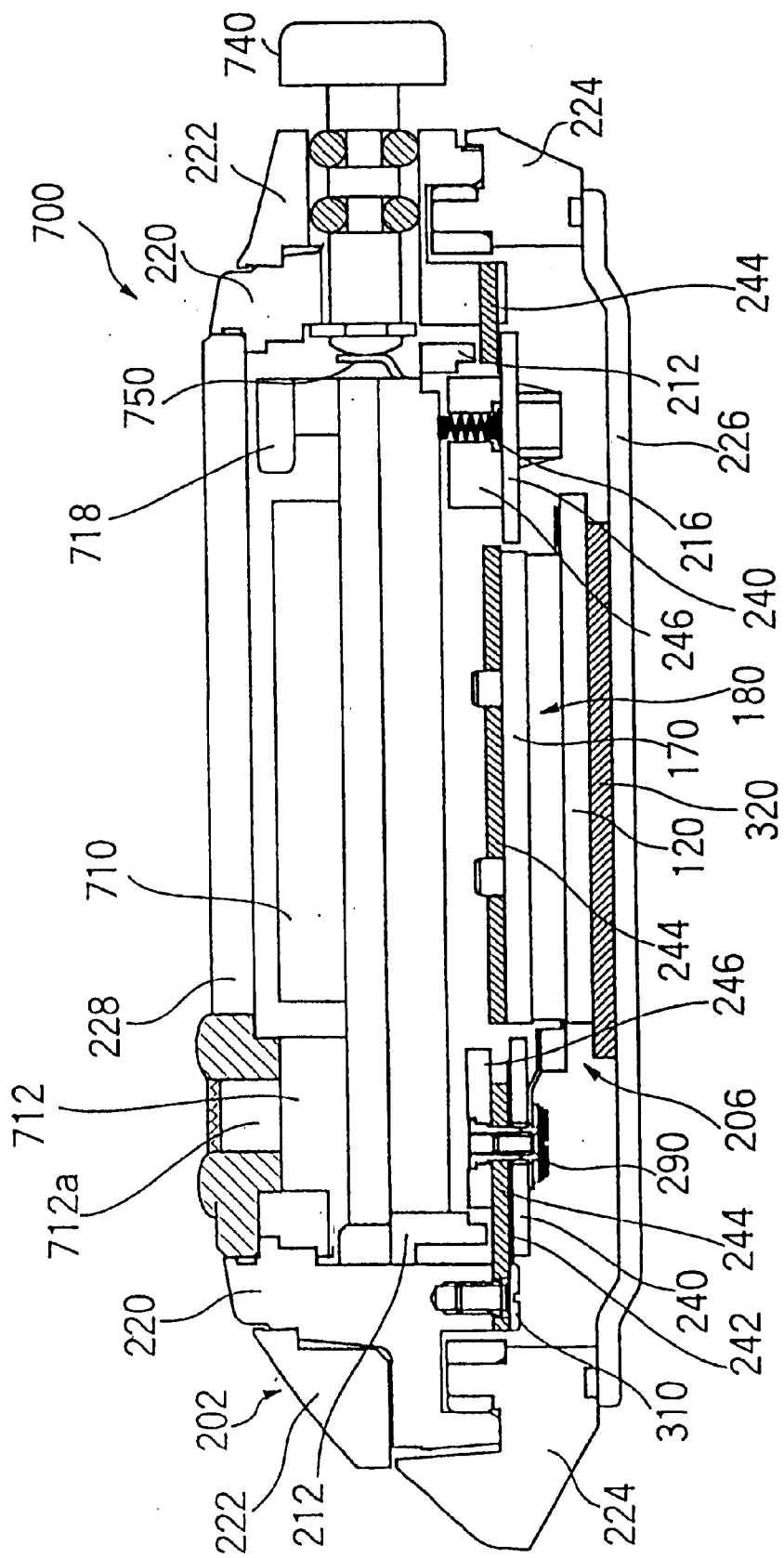
FIG. 51 is a sectional view showing an embodiment of a portable electronic device having the thermoelectric generator unit according to the invention.
Figure 52:
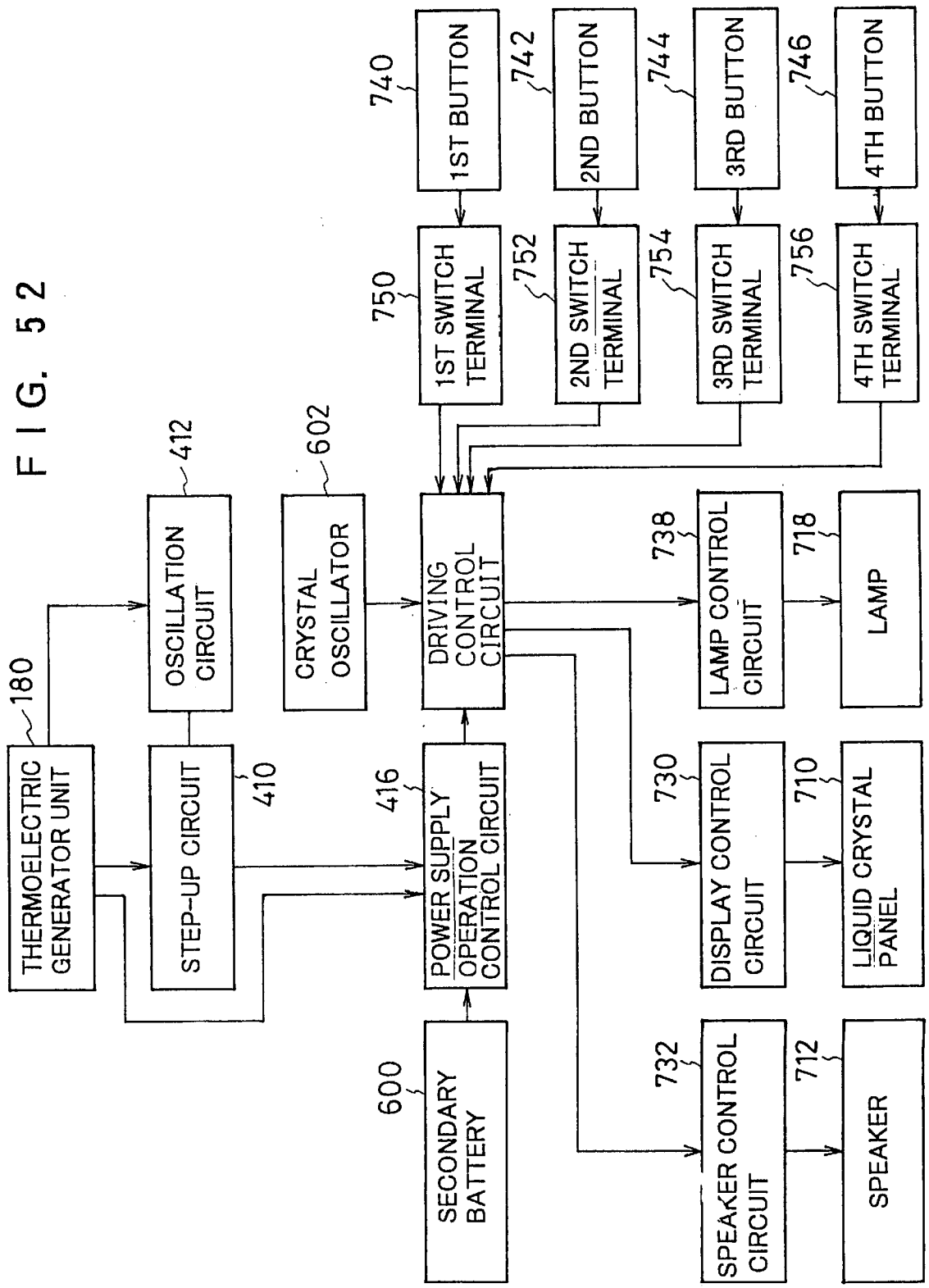
FIG. 52 is an outline block diagram of the embodiment of the portable electronic device having the thermoelectric generator unit according to the invention.

(7) A structure of an electronic device having the the generating unit with the thermoelectric generator unit according to the invention:

In reference to FIG. 51 and FIG. 52, according to a portable electronic device having the generating unit with the thermoelectric generator unit of the invention, a portable electronic device 700 is installed with a liquid crystal panel 710, a speaker 712 and a lamp 718.

A drive control circuit 720 is operated by voltage supplied from the power supply operation circuit 416. According to the embodiment, the constitutions and operations of the thermoelectric generator unit 180, the step-up circuit 410, the oscillation circuit 412, the power supply operation circuit 416, the secondary battery 600 and the crystal oscillator, are the same as those of the embodiment of the timepiece having the generating unit with the thermoelectric generator unit of the invention mentioned above. Accordingly, a detailed explanation thereof will be omitted.

The drive control circuit 720 is constituted to count information in respect of time, information in respect of alarm time and information in respect of elapsed time based on oscillation of the crystal oscillator 602. A display control circuit 730 outputs a signal for operating the liquid crystal panel 710 to the liquid crystal panel 710 based on a signal output from the drive control circuit 720. Accordingly, the liquid crystal panel 710 displays information in respect of time or time period based on a signal output from the display control circuit 730.

A speaker control circuit 732 outputs a signal for operating the speaker 712 to the speaker 712 based on a signal output from the drive control circuit 720. The speaker 712 emits alarm sound at time to emit the alarm sound based on a signal output from the speaker control circuit 732. Sound emitted by the speaker 712 is emitted from a sound emitting hole 712a to outside of the portable electronic device 700.

There are provided 4 buttons, that is, a 1st button 740, a 2nd button 742, a 3rd button 744 and a 4th button 746 for operating the portable electronic device 700. In FIG. 51, only the 1st button is shown. A 1st switch terminal 750 is installed to carry out operation of a switch by pushing to operate the 1st button 740. A 2nd switch terminal 752 is installed to carry out operation of a switch by pushing to operate the 2nd button 742. A 3rd switch terminal 754 is installed to carry out operation of a switch by pushing to operate the 3rd button 744. A 4th switch terminal 756 is installed to carry out operation of a switch by pushing to operate the 4th button 746. The operation of the switch is carried out when the respective switch terminal provides an input signal to the corresponding switch input terminal of the drive control circuit 720.

A lamp control circuit 738 outputs a signal for turning on the lamp 718 to the lamp 718 based on a signal output from the drive control circuit 720. For example, the lamp control circuit 738 is constituted to operate by pushing the 4th button 746 for turning on the lamp 718.

According to the electronic device having the generating unit with the thermoelectric generator unit of the invention, the portable electronic device 700 may be provided with only the liquid crystal panel 710, may be provided with the liquid crystal panel 710 and the speaker 712, may be provided with the liquid crystal panel 710 and the lamp 718 and may be provided with the liquid crystal panel 710, the speaker 712 and the lamp 718.

Further, the portable electronic device 700 may further be provided with the timepiece driving circuit shown by FIG. 42 and the hands operated by the timepiece driving circuit. By constituting the portable electronic device 700 in this way, there can be realized a composite display type portable electronic device having both of analog type display and digital type display.

There can be realized a digital wrist watch by constituting the portable electronic device 700 such that time information is displayed on the liquid crystal panel 710.

Further, there can be realized an alarm or a timepiece having alarm by constituting the portable electronic device 700 such that the speaker 712 emits alarm sound at previously set time.

Further, there can be realized a timer or a timepiece having timer by constituting the portable electronic device 700 such that the speaker 712 emits alarm sound when a previously set period of time has elapsed.

Industrial Applicability

As has been explained, in the power generating block provided with a thermoelectric generator unit, the invention is constituted as described above and accordingly, there can be realized the small-sized thin type power generating block provided with a thermoelectric generator unit having excellent power generation efficiency.

Further, the power generating block provided with a thermoelectric generator unit according to the invention is fabricated simply.

What is claimed is:

1. A power generating block with a thermoelectric generator unit comprising:

a thermoelectric generator unit (180) containing one or more of electrothermic elements (140) for generating an electromotive force based on the Seebeck effect, including a 1st thermally conductive plate (120) constituting a heat absorbing plate and including a 2nd thermally conductive plate (170) constituting a heat radiating plate;

a thermal conductive body (244) made of a thermally conductive material and arranged to be brought into contact with the 2nd thermally conductive plate (170);

a step-up circuit block (240) including a step-up circuit (410) for boosting the electromotive force generated by the thermoelectric generator unit (180); and a power supply operation control circuit (416) for controlling operation of storing the electromotive force generated by the thermoelectric generator unit (180) and controlling operation of the step-up circuit (410).

2. The power generating block provided with a thermoelectric generator unit according to claim 1, wherein the thermoelectric generator unit (180) is attached to the thermal conductive body (244) in a state in which an outer side face of the 2nd thermally conductive plate (170) is brought into contact with the thermal conductive body (244).

3. The power generating block provided with a thermoelectric generator unit according to claim 1 or claim 2, further comprising a generating block frame (246) made of an electrically insulating material, wherein the step-up circuit block (240) includes a step-up circuit substrate (250), the thermoelectric generator unit (180) includes a lead substrate (130) for transmitting the generated electromotive force and the lead substrate (130) is fixed to the generating block frame (246) in a state in which a pattern of the lead substrate (130) is brought into contact with a pattern of the step-up circuit substrate (250).

4. The power generating block provided with a thermoelectric generator unit according to any one of claim 1 through claim 3, wherein electric elements of the step-up circuit block (240) are arranged at a surrounding of the thermoelectric generator unit (180).

* * * * *